United States Patent
Hasegawa

(10) Patent No.: US 6,913,836 B1
(45) Date of Patent: Jul. 5, 2005

(54) SPIN-VALVE TYPE MAGNETORESISTIVE SENSOR AND METHOD OF MANUFACTURING THE SAME

(75) Inventor: Naoya Hasegawa, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 0 days.

(21) Appl. No.: 09/586,624

(22) Filed: Jun. 2, 2000

(30) Foreign Application Priority Data

| Jun. 3, 1999 | (JP) | ............................................ | 11-157131 |
| Jun. 3, 1999 | (JP) | ............................................ | 11-157132 |
| Jan. 25, 2000 | (JP) | ...................................... | 2000-016333 |

(51) Int. Cl.[7] ............................................... G11B 5/39
(52) U.S. Cl. ........................ 428/600; 428/611; 428/668; 428/681; 428/156; 428/213; 428/692; 360/324.12
(58) Field of Search .................................. 428/692, 900, 428/611, 655, 213, 600, 668, 681, 156; 360/113, 324.12; 324/207.21; 338/32 R

(56) References Cited

U.S. PATENT DOCUMENTS

| 5,159,513 | A | | 10/1992 | Dieny et al. | |
| 5,206,590 | A | | 4/1993 | Dieny et al. | |
| 5,373,238 | A | | 12/1994 | McGuire et al. | |
| 5,420,833 | A | * | 5/1995 | Tanaka et al. | ............ 369/13.49 |
| 5,492,720 | A | | 2/1996 | Gill et al. | |
| 5,508,866 | A | | 4/1996 | Gill et al. | |
| 5,699,213 | A | * | 12/1997 | Ohyama et al. | ........ 360/327.32 |
| 5,768,067 | A | | 6/1998 | Saito et al. | |
| 5,784,225 | A | | 7/1998 | Saito et al. | |
| 6,007,643 | A | * | 12/1999 | Kishi et al. | .................. 148/121 |
| 6,074,767 | A | * | 6/2000 | Lin | ......................... 324/207.21 |
| 6,201,673 | B1 | * | 3/2001 | Rottmayer et al. | ..... 360/324.12 |
| 6,282,069 | B1 | | 8/2001 | Nakazawa et al. | |
| 2001/0043448 | A1 | | 11/2001 | Iwasaki et al. | |

FOREIGN PATENT DOCUMENTS

| JP | 05-135331 | * | 6/1993 |
| JP | 10-124823 | | 5/1998 |

OTHER PUBLICATIONS

JPO Abstract Translation of JP 05–135331–A (JPO Doc. ID: JP 05135331 A).*
Machine Translation of JP 05–135331–A.*

* cited by examiner

Primary Examiner—Kevin M. Bernatz
(74) Attorney, Agent, or Firm—Brinks Hofer Gilson & Lione

(57) ABSTRACT

A spin-valve type magnetoresistive sensor with a bias structure enabling a magnetization direction of a free magnetic layer to be uniformly arranged with certainty. The spin-valve type magnetoresistive sensor comprises an antiferromagnetic layer; a pinned magnetic layer having a magnetization direction made stationary; a nonmagnetic electrically conductive layer formed between the pinned magnetic layer and a free magnetic layer; soft magnetic layers that are arranged on the free magnetic layer while a spacing corresponding to a track width is left between the soft magnetic layers and that fill recesses in the free magnetic layer on both sides of an area corresponding to the track width; bias layers formed on the soft magnetic layers; and electrically conductive layers. The antiferromagnetic layer and the bias layers are each made of an alloy containing at least one or more elements selected from among Pt, Pd, Rh, Ru, Ir, Os, Au, Ag, Cr, Ni, Ne, Ar, Xe and Kr, as well as Mn.

11 Claims, 22 Drawing Sheets

FIG. 1
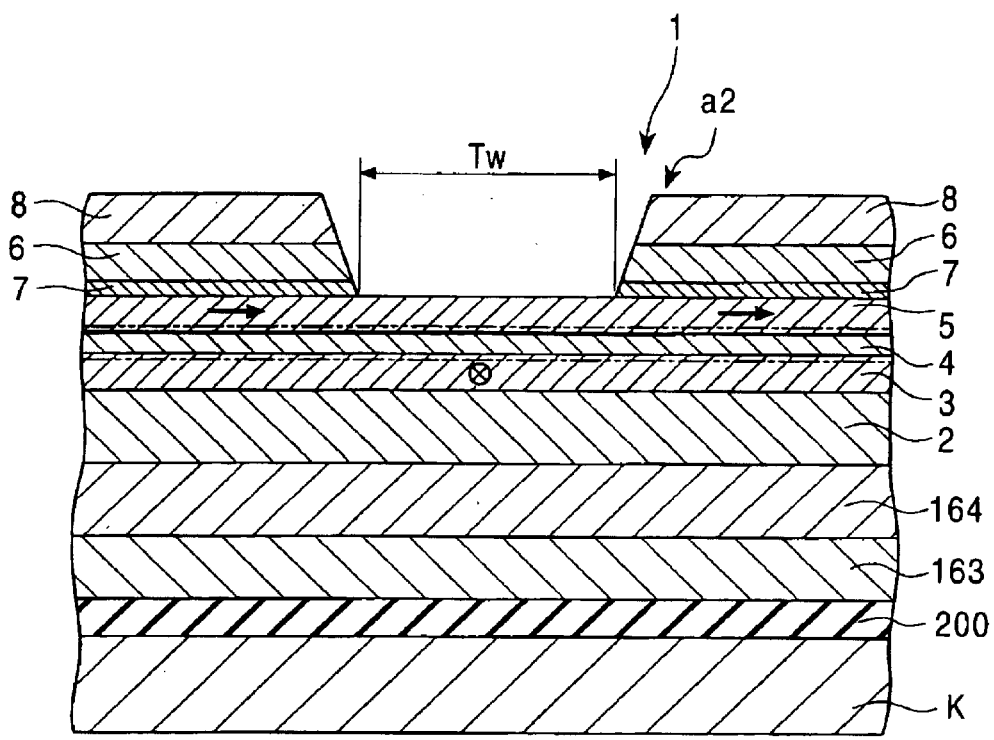
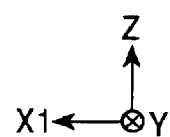

FIG. 2
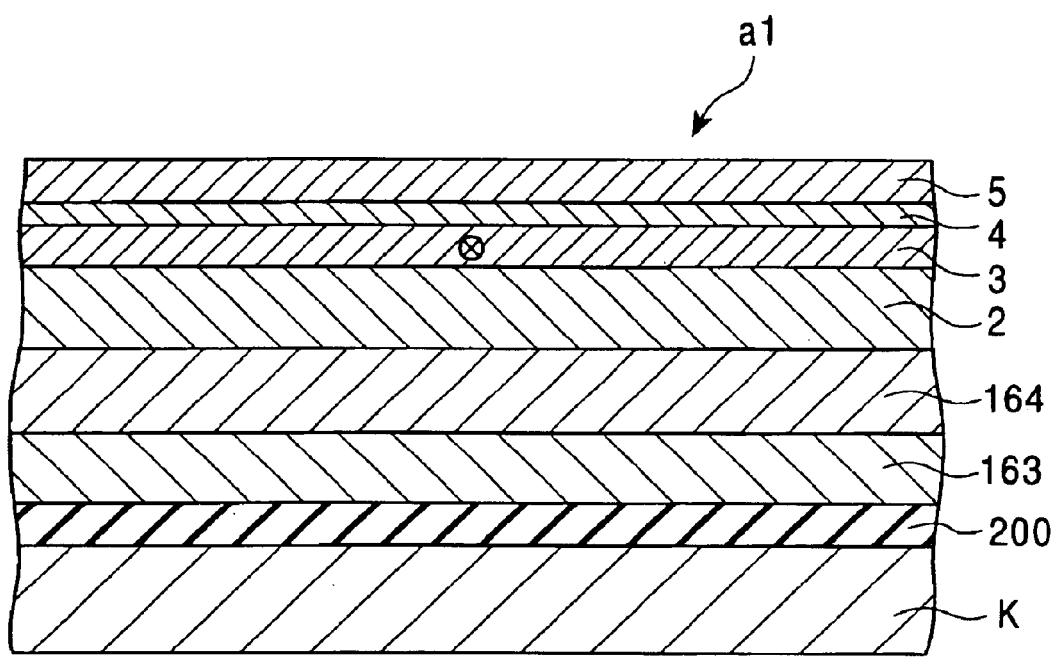
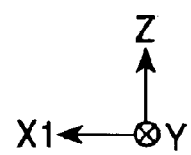

US 6,913,836 B1

SPIN-VALVE TYPE MAGNETORESISTIVE SENSOR AND METHOD OF MANUFACTURING THE SAME

BACKGROUND OF THE INVENTION

1. Field of the Invention

The present invention relates to a spin-valve type magnetoresistive sensor wherein electrical resistance is changed depending on the relationship between a stationary magnetization direction of a pinned magnetic layer and a magnetization direction of a free magnetic layer which is affected by an external magnetic field. More particularly, the present invention relates to a spin-valve type magnetoresistive sensor having superior heat resistance, a magnetoresistive head incorporating the spin-valve type magnetoresistive sensor, and to a method of manufacturing the spin-valve type magnetoresistive sensor, by which the magnetization direction of the free magnetic layer and the magnetization direction of the pinned magnetic layer can be easily set in orthogonal relation.

2. Description of the Related Art

There are known two types of magnetic heads utilizing a magnetoresistive effect; i.e., an AMR (Anisotropic Magnetoresistive) head incorporating a sensor which exhibits a magnetoresistive effect and a GMR (Giant Magnetoresistive) head incorporating a sensor which exhibits a giant magnetoresistive effect. In the AMR head, the sensor exhibiting a magnetoresistive effect has a single-layer structure formed of a magnetic substance. On the other hand, the GMR head comprises a multilayer structure sensor made of a plurality of materials formed as a laminate of layers. There are several types of structures capable of developing a giant magnetoresistive effect. A spin-valve type magnetoresistive sensor is known as having a relatively simple structure and providing a high rate of resistance change with respect to a weak external magnetic field.

FIGS. 13 and 14 are sectional views each showing the structure of an example of conventional spin-valve type magnetoresistive sensors, as viewed from the side facing a recording medium.

Above and below the spin-valve type magnetoresistive sensor of each example, shielding layers are formed with gap layers interposed therebetween. The spin-valve type magnetoresistive sensor, the gap layers, and the shielding layers cooperatively construct a GMR head for reproduction. An inductive head for magnetic recording may be layered on the GMR head for reproduction. The GMR head for reproduction is provided, for example, on a trailing end face of a floating slider along with the inductive head for magnetic recording, whereby a magnetoresistive head is constructed. The magnetoresistive head is used to detect a magnetic field recorded on a magnetic recording medium such as a hard disk.

In FIGS. 13 and 14, a Z-direction represents the moving direction of a magnetic recording medium, and a Y-direction represents the direction of a leakage magnetic field from the magnetic recording medium.

The spin-valve type magnetoresistive sensor shown in FIG. 13 is one example of the so-called bottom type single-spin-valve magnetoresistive sensors wherein an antiferromagnetic layer, a pinned magnetic layer, a non-magnetic electrically conductive layer, and a free magnetic layer are formed on a substrate one by one in this order from the substrate side.

The spin-valve type magnetoresistive sensor shown in FIG. 13 comprises a multilayer film 33 made up of an underlying layer 31, an antiferromagnetic layer 22, a pinned magnetic layer 23, a non-magnetic electrically conductive layer 24, a free magnetic layer 25 and a protective layer 32, which are formed in this order from the lower side in FIG. 13; a pair of hard bias layers (permanent magnetic layers) 29, 29 formed on both sides of the multilayer film 33; and a pair of electrode layers 28, 28 formed respectively on the hard bias layers 29, 29.

The underlying layer 31 and the protective layer 32 are each formed of a Ta film or the like. Also, a track width Tw is determined by the width of an upper surface of the multilayer film 33.

In general, the antiferromagnetic layer 22 is formed of a Fe—Mn alloy film or a Ni—Mn alloy film, and the pinned magnetic layer 23 and the free magnetic layer 25 are each formed of a Ni—Fe alloy film. The non-magnetic electrically conductive layer 24 is formed of a Cu film, the hard bias layers 29, 29 are each formed of a Co—Pt alloy film, and the electrode layers 28, 28 are each formed of a Cr or W film.

As shown in FIG. 13, magnetization of the pinned magnetic layer 23 is brought into a single domain state in the Y-direction (the direction of a leakage magnetic field from the magnetic recording medium; the direction of height) under an exchange anisotropic magnetic field cooperatively generated in the antiferromagnetic layer 22. Magnetization of the free magnetic layer 25 is uniformly arranged in a direction opposing to the X1-direction under the effect of a bias magnetic field from the hard bias layers 29, 29.

In other words, the magnetization of the pinned magnetic layer 23 and the magnetization of the free magnetic layer 25 are set to cross in orthogonal relation.

In the spin-valve type magnetoresistive sensor shown in FIG. 13, a detection electric current (sensing electric current) is applied from the electrode layers 28, 28 formed on the hard bias layers 29, 29 to the pinned magnetic layer 23, the nonmagnetic electrically conductive layer 24 and the free magnetic layer 25. The magnetic recording medium such as a hard disk travels in the Z-direction. When a leakage magnetic field from the magnetic recording medium is applied in the Y-direction, the magnetization of the free magnetic layer 25 is varied from the direction opposing to the X1-direction toward the Y-direction. Electrical resistance is changed (called a magnetoresistance change) depending on the relationship between a variation of the magnetization direction in the free magnetic layer 25 and the stationary magnetization direction of the pinned magnetic layer 23. The leakage magnetic field from the magnetic recording medium can be detected in accordance with a voltage change caused by such a change in electrical resistance value.

The spin-valve type magnetoresistive sensor shown in FIG. 14 is another example of the so-called bottom type single-spin-valve magnetoresistive sensors wherein an antiferromagnetic layer, a pinned magnetic layer, a non-magnetic electrically conductive layer, and a free magnetic layer are formed on a substrate one by one in this order from the substrate side (the lower side in FIG. 14).

In FIG. 14, character K denotes a substrate. An antiferromagnetic layer 22 is formed on the substrate K. Further, a pinned magnetic layer 23 is formed on the antiferromagnetic layer 22, and a non-magnetic electrically conductive layer 24 is formed on the pinned magnetic layer 23. Moreover, a free magnetic layer 25 is formed on the non-magnetic electrically conductive layer 24.

On the free magnetic layer 25, a pair of bias layers 26, 26 are formed while a spacing corresponding to a track width Tw is left between the bias layers 26, 26. A pair of electrically conductive layers 28, 28 are formed respectively on the bias layers 26, 26.

The pinned magnetic layer 23 is formed of, for example, a Co film, a NiFe alloy, a CoNiFe alloy, or a CoFe alloy. The antiferromagnetic layer 22 is formed of a NiMn alloy.

The bias layer 26 is formed of an antiferromagnetic material, such as a FeMn alloy, which belongs to the face-centered cubic system, has an irregular crystal structure, and does not require heat treatment for generating an exchange anisotropic magnetic field.

The pinned magnetic layer 23 shown in FIG. 14 is magnetized in one direction under an exchange anisotropic magnetic field based on exchange coupling produced at the interface between the pinned magnetic layer 23 and the antiferromagnetic layer 22. The magnetization direction of the pinned magnetic layer 23 is made stationary in the Y-direction shown in FIG. 14, i.e., the direction away from the magnetic recording medium (direction of height).

Also, the free magnetic layer 25 is magnetized into a single domain state under an exchange anisotropic magnetic field cooperatively generated in the bias layers 26. Then, the magnetization direction of the free magnetic layer 25 is uniformly arranged in a direction opposing to the X1-direction shown in FIG. 14, i.e., a direction perpendicularly crossing the magnetization direction of the pinned magnetic layer 23.

Because the free magnetic layer 25 is magnetized into a single domain state under the exchange anisotropic magnetic field cooperatively generated in the bias layers 26, the occurrence of Barkhausen noise is prevented.

In the conventional spin-valve type magnetoresistive sensor shown in FIG. 14, a steady electric current is applied from the electrically conductive layer 28 to the free magnetic layer 25, the non-magnetic electrically conductive layer 24 and the pinned magnetic layer 23. When a leakage magnetic field from the magnetic recording medium traveling in the Z-direction is applied in the Y-direction in the above condition, the magnetization of the free magnetic layer 25 is varied from the direction opposing to the X1-direction toward the Y-direction. Electrical resistance is changed depending on the relationship between a variation of the magnetization direction in the free magnetic layer 25 and the stationary magnetization direction of the pinned magnetic layer 23. The leakage magnetic field from the magnetic recording medium can be detected in accordance with a voltage change caused by such a change in electrical resistance.

The spin-valve type magnetoresistive sensor shown in FIG. 14 is manufactured as follows. As shown in FIG. 15, all the component layers from the antiferromagnetic layer 22 to the free magnetic layer 25 are successively formed on the substrate K one above another, and are then subjected to heat treatment (annealing) under a magnetic field. An exchange anisotropic magnetic field is thereby generated at the interface between the pinned magnetic layer 23 and the antiferromagnetic layer 22 to make the magnetization direction of the pinned magnetic layer 23 stationary in the Y-direction shown in FIG. 14. Further, as shown in FIG. 16, a lift-off resist 351 having a width substantially corresponding to the track width is formed. Then, as shown in FIG. 17, the bias layer 26 and the electrically conductive layer 28 are successively formed on a surface area of the free magnetic layer 25 which is not covered by the lift-off resist 351. After removing the lift-off resist 351, the magnetization direction of the free magnetic layer 25 is uniformly arranged in the direction of the track width. As a result, the spin-valve type magnetoresistive sensor having the magnetization direction shown in FIG. 14 is manufactured.

Next, FIG. 18 is a sectional view showing the structure of a principal part of a magnetoresistive head including still another example of conventional spin-valve type magnetoresistive sensors, as viewed from the side facing a recording medium.

In FIG. 18, symbol MR3 denotes a spin-valve type magnetoresistive sensor, and symbol al2 denotes a laminate. The laminate a12 is formed such that an antiferromagnetic layer 122 is formed on an underlying layer 121; a pinned magnetic layer is formed on the antiferromagnetic layer 122; a non-magnetic electrically conductive layer 124 is formed on the pinned magnetic layer 153; a free magnetic layer 175 is formed on the non-magnetic electrically conductive layer 124; and a protective layer 127 is formed on the free magnetic layer 175.

The free magnetic layer 175 in the spin-valve type magnetoresistive sensor MR3 of this example is made of a non-magnetic intermediate layer 176, a first free magnetic layer 177, and a second free magnetic layer 178, the first and second layers 177, 178 sandwiching the non-magnetic intermediate layer 176 therebetween.

The first free magnetic layer 177 is positioned closer to the protective layer 127 than the non-magnetic intermediate layer 176, and the second free magnetic layer 178 is positioned closer to the non-magnetic electrically conductive layer 124 than the non-magnetic intermediate layer 176. Further, the second free magnetic layer 178 is made up of a diffusion preventing layer 179 and a ferromagnetic layer 180.

The second free magnetic layer 178 has a thickness $t_2$ greater than a thickness $t_1$ of the first free magnetic layer 177. Also, assuming that saturation magnetization of the first free magnetic layer 177 and the second free magnetic layer 178 is respectively $M_1$, $M_2$, a magnetic film thickness of the first free magnetic layer 177 and the second free magnetic layer 178 is respectively $M_1 \cdot t_1$, $M_2 \cdot t_2$. Since the second free magnetic layer 178 is made up of the diffusion preventing layer 179 and the ferromagnetic layer 180, the magnetic film thickness $M_2 \cdot t_2$ of the second free magnetic layer 178 is given as the sum of a magnetic film thickness of the diffusion preventing layer 179 and a magnetic film thickness of the ferromagnetic layer 180.

Further, the free magnetic layer 175 is formed such that the magnetic film thicknesses of the first free magnetic layer 177 and the second free magnetic layer 178 satisfy a relationship of $M_2 \cdot t_2 > M_1 \cdot t_1$, Moreover, the first free magnetic layer 177 and the second free magnetic layer 178 are coupled to each other in antiferromagnetic relation. In other words, when the magnetization direction of the second free magnetic layer 178 is uniformly arranged in the X1-direction shown in FIG. 18, the magnetization direction of the first free magnetic layer 177 is uniformly arranged in a direction opposing to the X1-direction.

In addition, since the magnetic film thicknesses of the first and second free magnetic layers 177, 178 satisfy the relationship of $M_2 \cdot t_2 > M_1 \cdot t_1$, the magnetization of the second free magnetic layer 178 remains eventually and the magnetization direction of the free magnetic layer 175 is uniformly arranged as a whole in the X1-direction. At this time, an effective film thickness of the free magnetic layer 175 is given by $(M_2 \cdot t_2 - M_1 - M_1 \cdot t_1)$.

Thus, the first free magnetic layer 177 and the second free magnetic layer 178 are coupled to each other in antiferromagnetic relation so as to have antiparallel magnetization directions, and their magnetic film thicknesses satisfy the relationship of $M_2 \cdot t_2 > M_1 > M_1 \cdot t_1$, whereby the free magnetic layer 175 is brought into an artificial ferrimagnetic state. Also, the magnetization direction of the free magnetic layer 175 and the magnetization direction of the pinned magnetic layer 153 cross each other.

The conventional spin-valve type magnetoresistive sensor shown in FIG. 13 however has a risk of causing the problem described below.

As mentioned above, the magnetization of the pinned magnetic layer 23 shown in FIG. 13 is brought into a single domain state in the Y-direction and held stationary, but the hard bias layers 29, 29 magnetized in the direction opposing to the X1-direction are provided on both sides of the pinned magnetic layer 23. Therefore, opposite ends of the pinned magnetic layer 23 are so affected by the bias magnetic field from the hard bias layers 29, 29 that it is difficult to hold the magnetization direction of the pinned magnetic layer 23 stationary in the Y-direction shown in FIG. 13.

More specifically, under the effect of magnetization of the hard bias layers 29, 29 in the direction opposing to the X1-direction, the magnetization of the free magnetic layer 25, which is brought into a single domain state in the direction opposing to the X1-direction, and the magnetization of the pinned magnetic layer 23 are hard to cross in orthogonal relation, especially, in the vicinity of the lateral ends of the multilayer film 33. The reason why the magnetization of the free magnetic layer 25 and the magnetization of the pinned magnetic layer 23 are held in orthogonal relation, resides in that the magnetization of the free magnetic layer 25 can be easily varied even with a small external magnetic field and electrical resistance can be greatly changed in such a condition, thus resulting in an improvement of reproduction sensitivity. Further, with the orthogonal relation between both the magnetization directions, an output signal waveform having better symmetry can be obtained.

Additionally, the magnetization of the free magnetic layer 25 in the vicinity of lateral ends thereof tends to be undesirably held stationary because of a strong effect of the magnetization of the hard bias layers 29, 29, and hence tends to vary less sensitively upon application of an external magnetic field. As shown in FIG. 13, therefore, dead areas in which reproduction sensitivity is poor are formed in the vicinity of the lateral ends of the multilayer film 33.

Of the multilayer film 33, a central portion except for the opposite dead areas serves as a sensitive area that actually contributes to reproduction of a recorded magnetic field and develops a magnetoresistance effect. A width of the sensitive area is shorter than the track width Tw set in formation of the multilayer film 33 by widths of the opposite dead areas. Also, due to variations in widths of the opposite dead areas, it is difficult to precisely define the track width. This results in a problem of difficulty in narrowing the track width to be adapted for a higher recording density.

In the spin-valve type magnetoresistive sensor shown in FIG. 14, the magnetization direction of the free magnetic layer is uniformly arranged so as to cross the magnetization direction of the pinned magnetic layer at 90° based on exchange biasing by using the bias layers made of an antiferromagnetic material.

The exchange biasing is more suitable for a spin-valve type magnetoresistive sensor having a narrower track width to be adapted for a higher recording density in comparison with hard biasing wherein it is difficult to precisely control an effective track width due to the presence of the dead areas.

However, the spin-valve type magnetoresistive sensor shown in FIG. 14 has a problem of corrosion because the antiferromagnetic layer 22 is formed of a Ni—Mn alloy. Also, in the spin-valve type magnetoresistive sensor including the antiferromagnetic layer 22 formed of a Ni—Mn alloy or a Fe—Mn alloy, another problem is encountered in that the antiferromagnetic layer 22 is corroded by, e.g., a weak alkaline solution, containing natrium tripolyphosphate or the like, and an emulsifier which are used in manufacturing steps of the magnetoresistive head, and hence the exchange anisotropic magnetic field is reduced.

Further, since the antiferromagnetic layer 22 is formed of a Ni—Mn alloy, antiferromagnetic materials usable as the bias layers 26, 26 are restricted. This has necessarily raised such a drawback that the bias layers 26, 26 are poor in heat resistance and corrosion resistance. More specifically, to form the bias layers 26, 26 having high heat resistance, an antiferromagnetic material such as a Ni—Mn alloy must be selected which can develop an exchange anisotropic magnetic field in the direction opposing to the X1-direction at the interface between the bias layers 26, 26 and the free magnetic layer 25 when heat treatment is carried out under a magnetic field crossing the exchange anisotropic magnetic field that acts in the Y-direction in FIG. 14 at the interface between the antiferromagnetic layer 22 formed of an Ni—Mn alloy and the pinned magnetic layer 23.

During the heat treatment under the above-mentioned magnetic field, however, the exchange anisotropic magnetic field acting at the interface between the antiferromagnetic layer 22 and the pinned magnetic layer 23 is inclined from the Y-direction toward the direction opposing to the X1-direction. Accordingly, the magnetization direction of the pinned magnetic layer 23 and the magnetization direction of the free magnetic layer 25 are out of the orthogonal relation, thus resulting in a problem that an output signal waveform has poor symmetry.

For the bias layers 26, 26, it has been therefore required to select an antiferromagnetic material that does not require heat treatment under a magnetic field and can generate an exchange anisotropic magnetic field immediately after the formation under a magnetic field.

For the above reason, the bias layers 26, 26 are generally formed of a FeMn alloy which belongs to the face-centered cubic system and has an irregular crystal structure.

However, when the spin-valve type magnetoresistive sensor shown in FIG. 14 is provided in a magnetic recording device or the like, the sensor is subjected to a high temperature over 100° C. due to a temperature rise in the device and Joule heat produced by a detection electric current. This reduces the exchange anisotropic magnetic field to such an extent that it is difficult to hold the free magnetic layer 25 in a single domain state. As a result, a problem of causing the Barkhausen noise has occurred.

Another problem is that, because the Fe—Mn alloy is poorer in corrosion resistance than the Ni—Mn alloy, the bias layers are corroded by, e.g., a weak alkaline solution, containing sodium tripolyphosphate or the like, and an emulsifier which are used in manufacturing steps of the magnetoresistive head, and hence the exchange anisotropic magnetic field is reduced. In addition, corrosion of the bias layers further proceeds in the magnetic recording device, whereby durability of the device deteriorates.

In the manufacturing method of the conventional spin-valve type magnetoresistive sensor shown in FIGS. 15–17, the surface of the uppermost one of the layers formed between the substrate and the bias layers is exposed to the atmosphere in the step of forming the lift-off resist 351 shown in FIG. 16. The surface having been exposed to the atmosphere must be cleaned by ion milling or reverse sputtering with rare gas, such as Ar, before forming another layer on the exposed surface. This results in a problem of increasing the number of manufacturing steps. Further, the necessity of cleaning the surface of the uppermost layer by ion milling or reverse sputtering raises another problem attributable to the cleaning, such as an adverse effect upon generation of the exchange anisotropic magnetic field caused by contamination with foreign matters deposited again on the surface or disorder of the crystal state at the surface.

In the spin-valve type magnetoresistive sensor MR3 shown in FIG. 18, a strong magnetic field is applied to the first free magnetic layer 177 from tip portions 126a, 126a of the hard bias layers 126, 126 in the vicinity of upper lateral ends of the laminate a12, and this magnetic field is opposed to the direction of a magnetic field to be applied to the first free magnetic layer 177. Therefore, when the magnetic field generated by the hard bias layers 126, 126 becomes greater than a later-described spin flop magnetic field ($H_{sf}$), a magnetic field opposing to the direction of the magnetic field, which is intended to be applied to the first free magnetic layer 177, acts upon opposite end portions of the first free magnetic layer 177 (i.e., portions thereof adjacent to the corresponding hard bias layers 126). As a result, the magnetization direction of the first free magnetic layer 177 in its central portion is uniformly arranged in a direction opposing to the magnetization direction of the second free magnetic layer 178 (i.e., in the direction opposing to the X1-direction), whereas the magnetization direction of the first free magnetic layer 177 in its opposite end portions is disordered.

With the magnetization direction disordered in the opposite end portions of the first free magnetic layer 177, the second free magnetic layer 178, of which magnetization direction is to be uniformly arranged (in the X1-direction) in antiparallel relation to the magnetization direction of the first free magnetic layer 177, is brought into such a state that the magnetization direction of the second free magnetic layer 178 in its central portion is uniformly arranged in a direction opposing to the magnetization direction of the first free magnetic layer 177 (i.e., in the X1-direction), whereas the magnetization direction of the second free magnetic layer 178 in its opposite end portions is disordered. Accordingly, the magnetization directions of the first and second free magnetic layers 177, 178 in their opposite end portions are no longer arranged in antiparallel relation. This may accompany a risk of lowering stability of a reproduced waveform at both ends of the track width Tw and hence causing a problem such as a servo error.

A description is now made of the spin flop magnetic field with reference to FIG. 19. FIG. 19 is a graph showing an M-H curve of the free magnetic layer.

The M-H curve represents changes in magnetization M of the free magnetic layer 175 resulted when an external magnetic field H is applied in the direction of the track width to the free magnetic layer 175 of the spin-valve type magnetoresistive sensor MR3 constructed as shown in FIG. 18. Note that, in FIG. 19, the external magnetic field H corresponds to the bias magnetic field from the hard bias layers 126, 126.

Also, in FIG. 19, arrow FL represents the magnetization direction of the first free magnetic layer 177, and arrow $F_2$ represents the magnetization direction of the second free magnetic layer 178.

As shown in FIG. 19, when the external magnetic field H is small, the first free magnetic layer 177 and the second free magnetic layer 178 are in the antiferromagnetically coupled state; namely, the directions of arrows $F_1$ and $F_2$ are antiparallel. When the magnitude of the external magnetic field H exceeds a certain value, the directions of arrows $F_1$ and $F_2$ are not antiparallel and the antiferromagnetic coupling between the first free magnetic layer 177 and the second free magnetic layer 178 is broken, whereby the free magnetic layer 175 can no longer maintain a ferrimagnetic state. This phenomenon is called spin flop transition. Also, the magnitude of the external magnetic field at the time of occurrence of the spin flop transition is called a spin flop magnetic field that is shown by $H_{sf}$ in FIG. 19. When the external magnetic field H continues to be increased beyond the spin flop magnetic field $H_{sf}$, the direction of arrow $F_1$ is further rotated and then becomes parallel to the direction of arrow $F_2$; namely, arrow $F_1$ is pointed in a direction 180° different from the original direction. Thus, the ferrimagnetic state is completely broken. The magnitude of the external magnetic field corresponding to that condition is called a saturation magnetic field that is shown by $H_s$ in FIG. 19.

Accordingly, the magnetization directions of the first and second free magnetic layers 177, 178 in their opposite end portions, shown in FIG. 19, are disordered to a larger extent in the opposite end portions of the first free magnetic layer 177 as indicated, by way of example, by arrows $F_1$ depicted in an area of the first free magnetic layer 177 in FIG. 20. Because of tendency to hold the antiparallel relation in the ferrimagnetic state corresponding to the magnetization direction of the first free magnetic layer 177, the magnetization direction of the second free magnetic layer 178 is also disordered as indicated, by way of example, by arrows $F_2$ depicted in an area of the second free magnetic layer 178 in FIG. 20. In the spin-valve type magnetoresistive sensor MR3 constructed as shown in FIG. 18, therefore, there has been a risk of lowering stability of a reproduced waveform at both ends of the track width Tw and hence causing a problem such as a servo error. To describe in more detail the magnetization state shown in FIG. 20, a strong magnetic field is applied in an opposing direction to the left and right opposite ends of the first free magnetic layer 177 from the hard bias layers 126, 126, whereby magnetization distribution in the second free magnetic layer 178 is also disordered. This invites the occurrence of Barkhausen noise or the like and deteriorates magnetic stability.

SUMMARY OF THE INVENTION

With the view of solving the problems set forth above, an object of the present invention is to provide a spin-valve type magnetoresistive sensor which is superior in heat resistance and corrosion resistance by improvement in a material of a bias layer. Another object of the present invention is to provide a spin-valve type magnetoresistive sensor having a bias structure that enables magnetization direction of a free magnetic layer to be uniformly arranged with certainty.

Still another object of the present invention is to provide a spin-valve type magnetoresistive sensor which is structured such that a free magnetic layer is separated into two layers and magnetization is less susceptible to less disorder in opposite end portions of each free magnetic layer even with employment of a structure of applying a bias to the free magnetic layer, and which can render the bias to act in a satisfactory manner, suppress the occurrence of Barkhausen noise, and improve magnetic stability.

Still another object of the present invention is to provide a method of manufacturing the spin-valve type magnetoresistive sensor, which enables magnetization direction of the free magnetic layer and magnetization direction of a pinned magnetic layer to be easily set in orthogonal relation.

Still another object of the present invention is to provide a highly reliable magnetoresistive head including the spin-valve type magnetoresistive sensor, which is superior in heat resistance and corrosion resistance, and which can develop a satisfactory exchange anisotropic magnetic field.

To achieve the above objects, the present invention has the following features.

A spin-valve type magnetoresistive sensor according to the present invention comprises, on a substrate, an antiferromagnetic layer; a pinned magnetic layer formed on the antiferromagnetic layer and having a magnetization direction made stationary under an exchange anisotropic magnetic field generated by interaction with the antiferromagnetic layer; a non-magnetic electrically conductive layer formed between a free magnetic layer and the pinned magnetic layer; soft magnetic layers arranged in contact with the free magnetic layer while a spacing corresponding to a track width is left between the soft magnetic layers; bias layers formed in contact with the soft magnetic layers and acting to uniformly arrange a magnetization direction of the free magnetic layer in a direction crossing the magnetization direction of the pinned magnetic layer; and electrically conductive layers for applying a detection electric current to the free magnetic layer, the antiferromagnetic layer and the bias layer being each made of an alloy containing at least one or more elements selected from among Pt, Pd, Rh, Ru, Ir, Os, Au, Ag, Cr, Ni, Ne, Ar, Xe and Kr, as well as Mn.

With the spin-valve type magnetoresistive sensor of the present invention, since the antiferromagnetic layer and the bias layer are each made of the above-mentioned alloy, the exchange anisotropic magnetic field has a good temperature characteristic, and a spin-valve type magnetoresistive sensor being superior in heat resistance and corrosion resistance is provided.

Also, the spin-valve type magnetoresistive sensor has good durability even when it is provided in a device such as a magnetoresistive head in which the temperature reaches a high level, and exhibits a less variation in the exchange anisotropic magnetic field (exchange-coupled magnetic field) with a temperature change.

Further, by forming the antiferromagnetic layer of the above-mentioned alloy, the blocking temperature can be raised and a greater exchange anisotropic magnetic field can be generated in the antiferromagnetic layer. As a result, the magnetization direction of the pinned magnetic layer can be firmly held stationary.

Additionally, because of the soft magnetic layer formed between the free magnetic layer and the bias layer, the magnetization direction of the free magnetic layer can be uniformly arranged with certainty.

In the above spin-valve type magnetoresistive sensor, at least one of the pinned magnetic layer and the free magnetic layer is divided into two layers with a non-magnetic intermediate layer interposed between the two layers, and the divided two layers are held in a ferrimagnetic state where these layers are magnetized in directions 180° different from each other.

In the spin-valve type magnetoresistive sensor wherein at least the pinned magnetic layer is divided into two layers with a non-magnetic intermediate layer interposed between the two layers, one of the divided two pinned magnetic layers serves to make the magnetization of the other layer stationary in a proper direction, and therefore the magnetized state of the pinned magnetic layer can be held in a very stable condition.

On the other hand, in the spin-valve type magnetoresistive sensor wherein at least the free magnetic layer is divided into two layers with a non-magnetic intermediate layer interposed between the two layers, an exchange-coupled magnetic field is generated between the divided two free magnetic layers so that these layers are brought into the ferrimagnetic state and magnetization of each layer can rotate with good sensitivity in response to an external magnetic field.

In the above spin-valve type magnetoresistive sensor, preferably, the antiferromagnetic layer is made of an alloy having the following composition formula;

$$X_m Mn_{100-m}$$

where X is at least one or more elements selected from among Pt, Pd, Rh, Ru, Ir and Os, and a composition ratio m satisfies 48 atom % ≦ m ≦ 60 atom %. More preferably, the composition ratio m satisfies 48 atom % ≦ m ≦ 58 atom %.

In the above spin-valve type magnetoresistive, preferably, the bias layer is made of an alloy having the following composition formula;

$$X_m Mn_{100-m}$$

where X is at least one or more elements selected from among Pt, Pd, Rh, Ru, Ir and Os, and a composition ratio m satisfies 52 atom % ≦ m ≦ 60 atom %.

Also, in the above spin-valve type magnetoresistive sensor, preferably, the antiferromagnetic layer is made of an alloy having the following composition formula;

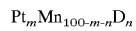
$$Pt_m Mn_{100-m-n} D_n$$

where D is at least one or more elements selected from among Pd, Rh, Ru, Ir and Os, and composition ratios m, n satisfy 48 atom t ≦ m+n ≦ 60 atom % and 0.2 atom % ≦ n ≦ 40 atom %. More preferably, the composition ratios m, n satisfy 48 atom % ≦ m n ≦ 58 atom % and 0.2 atom % ≦ n ≦ 40 atom %.

In the above spin-valve type magnetoresistive sensor, preferably, the bias layer is made of an alloy having the following composition formula;

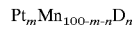
$$Pt_m Mn_{100-m-n} D_n$$

where D is at least one or more elements selected from among Pd, Rh, Ru, Ir and Os, and composition ratios m, n satisfy 52 atom % ≦ m+n ≦ 60 atom % and 0.2 atom % ≦ n ≦ 40 atom %.

Furthermore, in the above spin-valve type magnetoresistive sensor, the antiferromagnetic layer may be made of an alloy having the following composition formula;

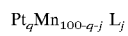
$$Pt_q Mn_{100-q-j} L_j$$

where L is at least one or more elements selected from among Au, Ag, Cr, Ni, Ne, Ar, Xe and Kr, and composition ratios q, j satisfy 48 atom % ≦ q+j ≦ 60 atom % and 0.2 atom % ≦ j ≦ 10 atom %.

More preferably, the composition ratios q, j satisfy 48 atom % ≦ q+j ≦ 58 atom % and 0.2 atom % ≦ j ≦ 10 atom %.

In the above spin-valve type magnetoresistive sensor, the bias layer may be made of an alloy having the following composition formula;

$$Pt_qMn_{100-q-j}L_j$$

where L is at least one or more elements selected from among Au, Ag, Cr, Ni, Ne, Ar, Xe and Kr, and composition ratios q, j satisfy 52 atom % $\leq$ q+j $\leq$ 60 atom % and 0.2 atom % $\leq$ j $\leq$ 10 atom %.

In particular, when the antiferromagnetic layer and the bias layer are made of an alloy having the same composition, the following combinations (1) to (3) are suitably employed in the spin-valve type magnetoresistive sensor of the present invention.

(1) Preferably, the alloy making up the antiferromagnetic layer and the bias layer has the following composition and composition ratio;

$$X_mMn_{100-m}$$

where X is at least one or more elements selected from among Pt, Pd, Rh, Ru, Ir and Os, and the composition ratio m satisfies 52 atom % $\leq$ m $\leq$ 60 atom %.

More preferably, the composition ratio m of the antiferromagnetic layer and the bias layer satisfies 52 atom % $\leq\leq$ m $\leq$ 56.3 atom %.

(2) Preferably, the alloy making up the antiferromagnetic layer and the bias layer has the following composition and composition ratio;

$$Pt_qMn_{100-q-j}L_j$$

where L is at least one or more elements selected from among Au, Ag, Cr, Ni, Ne, Ar, Xe and Kr, and the composition ratios q, j satisfy 52 atom % $\leq$ q+j $\leq$ 60 atom % and 0.2 atom % $\leq$ j $\leq$ 10 atom %.

More preferably, the composition ratios q, j of the antiferromagnetic layer and the bias layer satisfy 52 atom % $\leq$ q+j $\leq$ 56.3 atom % and 0.2 atom % $\leq$ j $\leq$ 10 atom %.

(3) Preferably, the alloy making up the antiferromagnetic layer and the bias layer has the following composition and composition ratio;

$$Pt_mMn_{100-m-n}D_n$$

where D is at least one or more elements selected from among Pd, Rh, Ru, Ir and Os, and the composition ratios m, n satisfy 52 atom % $\leq$ m+n $\leq$ 60 atom % and 0.2 atom % $\leq$ n $\leq$ 40 atom %.

More preferably, the composition ratios m, n of the antiferromagnetic layer and the bias layer satisfy 52 atom % $\leq$ m+n $\leq$ 56.3 atom % and 0.2 atom % $\leq$ n $\leq$ 40 atom %.

When the antiferromagnetic layer and the bias layer are made of alloys having different compositions, the following combinations (4) to (6) are suitably employed.

(4) Preferably, the bias layer is made of an alloy expressed by a composition formula $X_mMn_{100-m}$ (where X is at least one or more elements selected from among Pt, Pd, Rh, Ru, Ir and Os, and the composition ratio m satisfies 52 atom % $\leq$ m $\leq$ 60 atom %), whereas the antiferromagnetic layer is made of an alloy expressed by a composition formula $X_mMn_{100-m}$ (where X is at least one or more elements selected from among Pt, Pd, Rh, Ru, Ir and Os, and the composition ratio m satisfies 48 atom % $\leq$ m $\leq$ 58 atom %).

More preferably, the composition ratio m of the bias layer satisfies 52 atom % $\leq$ m $\leq$ 54 atom % or 56.8 atom % $\leq$ m $\leq$ 60 atom %.

(5) Preferably, the bias layer is made of an alloy expressed by a composition formula $Pt_qMn_{100-q-j}L_j$ (where L is at least one or more elements selected from among Au, Ag, Cr, Ni, Ne, Ar, Xe and Kr, and the composition ratios q, j satisfy 52 atom % $\leq$ q+j $\leq$ 60 atom % and 0.2 atom % $\leq$ j $\leq$ 10 atom %, whereas the antiferromagnetic layer is made of an alloy expressed by a composition formula $Pt_qMn_{100-q-j}L_j$ (where L is at least one or more elements selected from among Au, Ag, Cr, Ni, Ne, Ar, Xe and Kr, and the composition ratios q, j satisfy 48 atom % $\leq$ q+j $\leq$ 58 atom % and 0.2 atom % $\leq$ j $\leq$ 10 atom %.

More preferably, the composition ratios q, j of the bias layer satisfy 52 atom % $\leq$ q+j $\leq$ 54 atom % and 0.2 atom % $\leq$ j $\leq$ 10 atom %, or 56.8 atom % $\leq$ q+j $\leq$ 60 atom % and 0.2 atom % $\leq$ j $\leq$ 10 atom %.

(6) Preferably, the bias layer is made of an alloy expressed by a composition formula $Pt_mMn_{100-m-n}D_n$ (where D is at least one or more elements selected from among Pd, Rh, Ru, Ir and Os, and the composition ratios m, n satisfy 52 atom % $\leq$ m+n $\leq$ 60 atom % and 0.2 atom % $\leq$ n $\leq$ 40 atom %, whereas the antiferromagnetic layer is made of an alloy expressed by a composition formula $Pt_mMn_{100-m-n}D_n$ (where D is at least one or more elements selected from among Pd, Rh, Ru, Ir and Os, and the composition ratios m, n satisfy 48 atom % $\leq$ m+n $\leq$ 58 atom % and 0.2 atom % $\leq$ n $\leq$ 40 atom %.

More preferably, the composition ratios m, n of the bias layer satisfy 52 atom % $\leq$ m+n $\leq$ 54 atom % and 0.2 atom % $\leq$ n $\leq$ 40 atom %, or 56.8 atom % $\leq$ m+n $\leq$ 60 atom % and 0.2 atom % $\leq$ n $\leq$ 40 atom %.

In the above spin-valve type magnetoresistive sensor, preferably, the soft magnetic layer is made of a NiFe alloy.

In the present invention, the spin-valve type magnetoresistive sensor may have such a structure that recesses are formed in the free magnetic layer on both sides of an area corresponding to a track width, the soft magnetic layers are formed to fill the recesses and are directly joined to the free magnetic layer through bottom surfaces of the recesses, and the bias layers and the electrically conductive layers are successively formed on the soft magnetic layers.

Generally, exchange coupling at the interface between a ferromagnetic substance and an antiferromagnetic substance tends to be more easily affected by contamination or disorder of crystallinity at the interface than exchange coupling at the interface between a ferromagnetic substance and a ferromagnetic substance. Therefore, the soft magnetic layer and the bias layer require to be successively formed in the same film forming apparatus. If the soft magnetic layers are formed without providing the recesses in the free magnetic layer, a total value of (thickness of ferromagnetic film×saturation magnetization) in areas on both sides of the track width is much greater than a value of (thickness of ferromagnetic film×saturation magnetization) of the free magnetic layer. The intensity of a longitudinal bias applied to the free magnetic layer is proportional to a value obtained by dividing the total value of (thickness of ferromagnetic film×saturation magnetization) by the value of (thickness of ferromagnetic film×saturation magnetization) of the free magnetic layer. In the case of not providing the recesses, therefore, the longitudinal bias becomes stronger than necessary, which may invite a problem of causing dead areas at both ends of a track or deteriorating sensitivity of the sensor as a whole. Also, if the soft magnetic layer is too thick, there may occur such a drawback that a state of the longitudinal bias is changed even with a slight external magnetic field and a reproduced waveform becomes unstable, because an exchange-coupled magnetic field between the bias layer and the soft magnetic layer is reduced in reverse proportion to a film thickness. The above drawback can be remedied by setting the thickness of the soft magnetic layer as thin as possible. However, if the soft magnetic layer is too thin, there conversely arises such a problem that the exchange-coupled magnetic field between the bias layer and the soft magnetic layer is deteriorated for the reason, for example, that the soft magnetic layer cannot maintain satisfactory integrity of crystallinity. In the case of providing the recesses, an increased film thickness of the soft magnetic layer is partly canceled corresponding to a depth of the recesses in terms of total thickness. As a result, the longitudinal bias is surely avoided from becoming stronger than necessary, and the exchange-coupled magnetic field between the bias layer and the soft magnetic layer is surely avoided from deteriorating, thus resulting in a first advantage that reproduction sensitivity, controllability of the track width, and stability of the reproduced waveform can be improved.

A second advantage is as follows. By cutting the free magnetic layer to form the recesses by ion milling, etc., contaminants on the surface of the free magnetic layer can be effectively removed, and ferromagnetic exchange coupling between the soft magnetic layer and the free magnetic layer can be further enhanced to more effectively transmit the longitudinal bias to the free magnetic layer. Also, even in the case where a backed layer made of Cu, for example, or an oxidation preventive layer made of Ta, for example, is formed on the free magnetic layer, the surface of a ferromagnetic substance making up the free magnetic layer can be surely exposed by forming the recesses.

In the present invention, the spin-valve type magnetoresistive sensor may have such a structure that the free magnetic layer is divided into two layers with a non-magnetic intermediate layer interposed between the two layers, and assuming that one free magnetic layer farther away from the pinned magnetic layer is a first free magnetic layer and the other free magnetic layer closer to the pinned magnetic layer is a second free magnetic layer, a magnetic film thickness of the first free magnetic layer is smaller than a magnetic film thickness of the second free magnetic layer.

Moreover, the above-mentioned objects of the present invention can be achieved with a method of manufacturing a spin-valve type magnetoresistive sensor comprising the steps of forming an antiferromagnetic layer, a pinned magnetic layer, a non-magnetic electrically conductive layer, and a free magnetic layer successively on a substrate, thereby forming a first laminate; heat-treating the first laminate at a first heat treatment temperature while applying a first magnetic field in a direction perpendicular to a direction of a track width, thereby generating an exchange anisotropic magnetic field in the antiferromagnetic layer to make magnetization of the pinned magnetic layer stationary; forming soft magnetic layers on the first laminate while a spacing corresponding to the track width is left between the soft magnetic layers, forming bias layers on the soft magnetic layers, and forming electrically conductive layers on the bias layers for applying a detection electric current to the free magnetic layer, thereby forming a second laminate; and heat-treating the second laminate at a second heat treatment temperature while applying a second magnetic field smaller than the exchange anisotropic magnetic field of the antiferromagnetic layer in a direction of the track width, thereby imparting a bias magnetic field to the free magnetic layer in a direction crossing a magnetization direction of the pinned magnetic layer.

In the above method of manufacturing a spin-valve type magnetoresistive sensor, preferably, the antiferromagnetic layer and the bias layers are each made of an alloy containing at least one or more elements selected from among Pt, Pd, Rh, Ru, Ir, Os, Au, Ag, Cr, Ni, Ne, Ar, Xe and Kr, as well as Mn.

Also, in the above method of manufacturing a spin-valve type magnetoresistive sensor, preferably, the first heat treatment temperature is in a range of 220° C.–270° C.

Further, in the above method of manufacturing a spin-valve type magnetoresistive sensor, preferably, the second heat treatment temperature is in a range of 250° C.–270° C.

In the above method of manufacturing a spin-valve type magnetoresistive sensor, preferably, the second magnetic field is in a range of 10–600 Oe (800–48000 A/m).

FIG. 21 is a graph showing the relationship between a heat treatment temperature and an exchange anisotropic magnetic field of an antiferromagnetic layer in each of a bottom type spin-valve magnetoresistive sensor and a top type spin-valve magnetoresistive sensor.

As seen from FIG. 21, in the bottom type spin-valve magnetoresistive sensor wherein the distance between the antiferromagnetic layer and a substrate is shorter (namely, the antiferromagnetic layer is disposed under a pinned magnetic layer), the exchange anisotropic magnetic field of the antiferromagnetic layer (indicated by marks ■) is generated already at 200° C. and exceeds 600 (Oe) near 240° C. On the other hand, in the top type spin-valve magnetoresistive sensor wherein the distance between the antiferromagnetic layer and the substrate is longer than that in the bottom type spin-valve magnetoresistive sensor (namely, the antiferromagnetic layer is disposed on the pinned magnetic layer), the exchange anisotropic magnetic field of the antiferromagnetic layer (indicated by marks ♦) is generated nearly at 240° C. and exceeds 600 (Oe) (48000 A/m) near 260° C.

It is therefore understood that the antiferromagnetic layer of the bottom type spin-valve magnetoresistive sensor, in which the distance between the antiferromagnetic layer and the substrate is shorter (namely, the antiferromagnetic layer is disposed under the pinned magnetic layer), exhibits a greater exchange anisotropic magnetic field at a relatively low heat treatment temperature than the top type spin-valve magnetoresistive sensor wherein the distance between the antiferromagnetic layer and the substrate is longer than that in the bottom type spin-valve magnetoresistive sensor (namely, the antiferromagnetic layer is disposed on the pinned magnetic layer).

Thus, the spin-valve type magnetoresistive sensor of the present invention is constructed as a bottom type spin-valve magnetoresistive sensor wherein the distance between the antiferromagnetic layer and the substrate is shorter, and the bias layer formed of the same material as the alloy used for the antiferromagnetic layer is disposed in a position farther from the substrate than the antiferromagnetic layer. Additionally, in the bottom type spin-valve magnetoresistive sensor wherein the distance between the antiferromagnetic layer and the substrate is shorter, the antiferromagnetic layer is disposed under the pinned magnetic layer, while in the top type spin-valve magnetoresistive sensor wherein the distance between the antiferromagnetic layer and the substrate is longer than that in the bottom type spin-valve magnetoresistive sensor, the antiferromagnetic layer is disposed on the pinned magnetic layer.

Accordingly, in the method of manufacturing the spin-valve type magnetoresistive sensor of the present invention, by carrying out heat treatment on the first laminate at the first heat treatment temperature (220–270° C.) while applying the first magnetic field, an exchange anisotropic magnetic field is generated in the antiferromagnetic layer and the magnetization direction of the pinned magnetic layer is made stationary uniformly. Also, the exchange anisotropic magnetic field of the antiferromagnetic layer exceeds 600 Oe.

Then, by carrying out heat treatment on the second laminate at the second heat treatment temperature (250–270° C.) while applying the second magnetic field 10–600 Oe (800–48000 Oe) in a direction perpendicular to the first magnetic field, an exchange anisotropic magnetic field is generated in the bias layer and the magnetization direction of the free magnetic layer is uniformly arranged in a direction crossing the first magnetic field. Also, the exchange anisotropic magnetic field of the bias layer exceeds 600 Oe (48000 A/m). In the above process, by setting the second magnetic field to be smaller than the exchange anisotropic magnetic field of the antiferromagnetic layer that has been generated by the preceding first heat treatment, the exchange anisotropic magnetic field of the antiferromagnetic layer is not deteriorated even with application of the second magnetic field to the antiferromagnetic layer. The magnetization direction of the pinned magnetic layer can be thereby maintained stationary.

As a result, the magnetization direction of the pinned magnetic layer and the magnetization direction of the free magnetic layer can be held in crossing relation.

Thus, with the method of manufacturing the spin-valve type magnetoresistive sensor according to the present invention, since an alloy having superior heat resistance, such as a PtMn alloy, is used for not only the antiferromagnetic layer but also the bias layer, an exchange anisotropic magnetic field can be generated in the bias layer to make the magnetization direction of the free magnetic layer uniformly arranged in a direction crossing the magnetization direction of the pinned magnetic layer without adversely affecting the magnetization direction of the pinned magnetic layer. It is therefore possible to uniformly arrange the magnetization direction of the free magnetic layer in the direction crossing the magnetization direction of the pinned magnetic layer, and hence to provide a spin-valve type magnetoresistive sensor having superior heat resistance.

Also, with the method of manufacturing the spin-valve type magnetoresistive sensor, the soft magnetic layers are formed on the first laminate, and the bias layers are formed on the soft magnetic layers. After forming the soft magnetic layers, therefore, the bias layers can be formed without breaking a vacuum. This means no necessity of cleaning a surface, on which the bias layers are to be formed, by ion milling or reverse sputtering. As a result, the manufacturing method is superior in being free from a drawback attributable to the cleaning, such as an adverse effect upon generation of the exchange anisotropic magnetic field caused by contamination with foreign matters deposited again on the surface or disorder of the crystal state at the surface.

Additionally, in a magnetoresistive head of the present invention, the spin-valve type magnetoresistive sensor described above is provided on a slider.

With the above feature, a highly reliable magnetoresistive head can be obtained which is superior in durability, heat resistance and corrosion resistance, and which can generate an exchange anisotropic magnetic field at a sufficient level.

BRIEF DESCRIPTION OF THE DRAWINGS

FIG. 1 is a sectional view showing the structure of a spin-valve type magnetoresistive sensor according to a first embodiment of the present invention, as viewed from the side facing a recording medium;

FIG. 2 is a sectional view for explaining a method of manufacturing the spin-valve type magnetoresistive sensor shown in FIG. 1, showing a state where a first laminate is formed on a substrate;

DESCRIPTION OF THE PREFERRED EMBODIMENTS

Preferred embodiments of a spin-valve type magnetoresistive sensor of the present invention will be described below in detail with reference to the drawings.

First Embodiment

Figure 5:
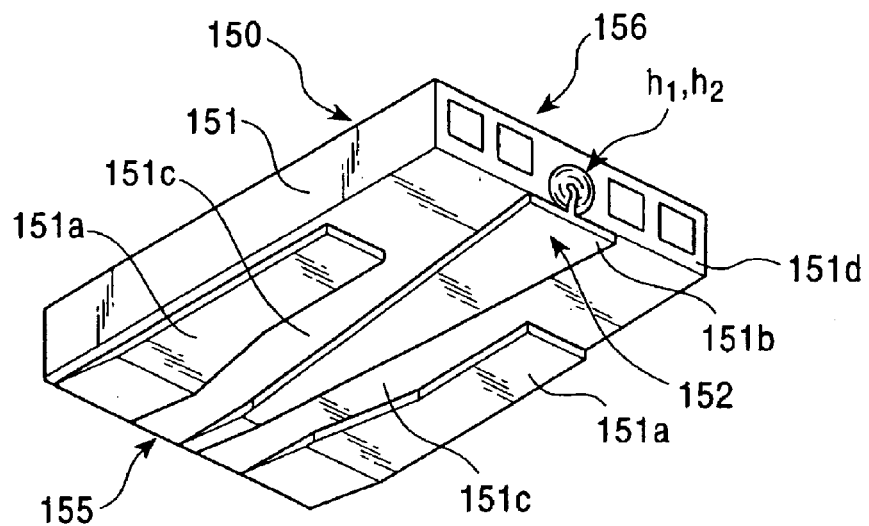
FIG. 5 is a perspective view showing a magnetoresistive head including the spin-valve type magnetoresistive sensor according to the first embodiment of the present invention.
Figure 6:
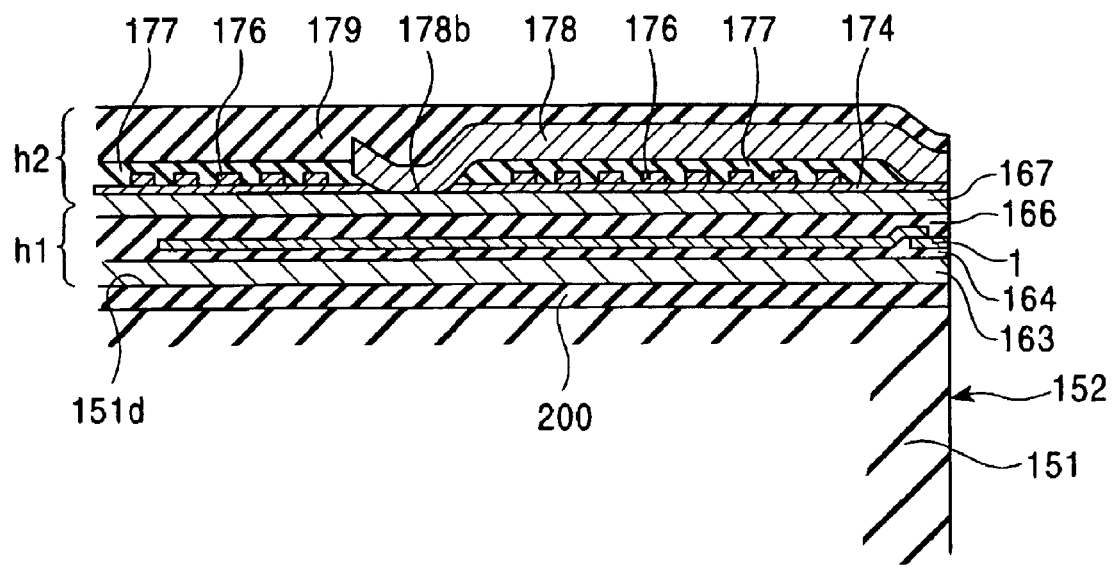
FIG. 6 is a sectional view showing a principal part of the magnetoresistive head including the spin-valve type magnetoresistive sensor according to the first embodiment of the present invention.

FIG. 1 is a sectional view showing the structure of a spin-valve type magnetoresistive sensor according to a first embodiment of the present invention, as viewed from the side facing a recording medium. FIGS. 5 and 6 are each a perspective view showing a magnetoresistive head including the spin-valve type magnetoresistive sensor according to the first embodiment.

Above and below the spin-valve type magnetoresistive sensor of the present invention, shielding layers are formed with gap layers interposed therebetween. The spin-valve type magnetoresistive sensor, the gap layers, and the shielding layers cooperatively construct a GMR head h1 for reproduction.

An inductive head h2 for recording may be layered on the GMR head h1 for reproduction.

As shown in FIG. 5, the GMR head h1 including the spin-valve type magnetoresistive sensor is provided on a trailing end face 151d of a slider 151 along with the inductive head h2, whereby a magnetoresistive head 150 is constructed. The magnetoresistive head is able to detect a magnetic field recorded on a magnetic recording medium such as a hard disk.

In FIG. 1, a Z-direction represents the moving direction of a magnetic recording medium, and a Y-direction represents the direction of a leakage magnetic field from the magnetic recording medium.

The magnetoresistive head 150 shown in FIG. 5 mainly comprises the slider 151, and the GMR head h1 and the inductive head h2 which are provided on the trailing end face 151d of a slider 151. Numeral 155 denotes the leading side of the slider 151, i.e., the upstream side in the moving direction of the magnetic recording medium, and numeral 156 denotes the trailing side of the slider 151. Rails 151a, and 151b are formed on a surface 152 of the slider 151 facing the magnetic recording medium, and air grooves 151c, 151c are formed between the rails.

As shown in FIG. 6, the GMR head h1 comprises an underlying layer 200 made of a non-magnetic insulator, such as $Al_2O_3$, and formed on the trailing end face 151d of a slider 151; a lower shielding layer 163 made of a magnetic alloy and formed on the underlying layer 200; a lower gap layer 164 formed on the lower shielding layer 163; the spin-valve type magnetoresistive sensor 1 exposed to the outside from the medium facing surface 152; an upper gap layer 166 covering both the spin-valve type magnetoresistive sensor 1 and the lower gap layer 164; and an upper shielding layer 167 covering the upper gap layer 166.

The upper shielding layer 167 serves also as a lower core layer of the inductive head h2.

The inductive head h2 comprises the lower core layer (upper shielding layer) 167; a gap layer 174 formed on the lower core layer 167; a coil 176; an upper insulating layer 177 covering the coil 176; and an upper core layer 178 joined to the gap layer 174 at one side and to the lower core layer 167 at the other side in a central portion of the coil 176.

The coil 176 is formed in a spiral pattern as viewed from above. Also, a base end portion 178b of the upper core layer 178 is magnetically connected to the lower core layer 167 substantially in the central portion of the coil 176.

Further, a protective layer 179 made of alumina or the like is formed on the upper core layer 178.

The spin-valve type magnetoresistive sensor shown in FIG. 1 is one of the so-called bottom type single-spin-valve magnetoresistive sensors wherein an antiferromagnetic layer, a pinned magnetic layer, a non-magnetic electrically conductive layer, and a free magnetic layer are formed on a substrate one by one in this order.

In the spin-valve type magnetoresistive sensor 1 of this embodiment, a magnetization direction of the free magnetic layer is uniformly arranged so as to cross a magnetization direction of the pinned magnetic layer based on exchange biasing by using an antiferromagnetic material as a bias layer.

The exchange biasing is more suitable for a spin-valve type magnetoresistive sensor having a narrower track width to be adapted for a higher recording density in comparison with hard biasing wherein it is difficult to precisely control an effective track width due to the presence of dead areas.

In FIG. 1, character K denotes a substrate. An antiferromagnetic layer 2 is formed on the substrate K. Further, a pinned magnetic layer 3 is formed on the antiferromagnetic layer 2, and a non-magnetic electrically conductive layer 4 is formed on the pinned magnetic layer 3. Moreover, a free magnetic layer 5 is formed on the non-magnetic electrically conductive layer 4.

On the free magnetic layer 5, a pair of soft magnetic layers 7, 7 are formed while a spacing corresponding to a track width Tw is left between the soft magnetic layers 7, 7. A pair of bias layers 6, 6 are formed respectively on the soft magnetic layers 7, 7, and a pair of electrically conductive layers 8, 8 are formed respectively on the bias layers 6, 6.

The substrate K is made by successively forming the underlying layer 200 made of a non-magnetic insulator, such as $Al_2O_3$ (alumina), on a surface of an $Al_2O_3$—TiC based ceramic 151 or the like, and then the lower shielding layer 163 and the lower gap layer 164 on the underlying layer 200 in succession.

The antiferromagnetic layer 2 is made of an alloy containing at least one or more elements selected from among Pt, Pd, Ir, Rh, Ru, Os, Au, Ag, Cr, Ni, Ne, Ar, Xe and Kr, as well as Mn. The antiferromagnetic layer 2 made of such an alloy has a feature of being superior in heat resistance and corrosion resistance.

In particular, the antiferromagnetic layer 2 is preferably made of an alloy having the following composition formula;

$$X_m Mn_{100-m}$$

where X is at least one or more elements selected from among Pt, Pd, Ir, Rh, Ru and Os, and a composition ratio m satisfies 48 atom $\% \leq m \leq 60$ atom %.

Further, the antiferromagnetic layer 2 may be made of an alloy having the following composition formula;

$$Pt_m Mn_{100-m-n} D_n$$

where D is at least one or more elements selected from among Pd, Ir, Rh, Ru and Os, and composition ratios m, n satisfy 48 atom $\% \leq m+n \leq 60$ atom % and 0.2 atom $\% \leq n \leq 40$ atom %.

Moreover, in the spin-valve type magnetoresistive sensor of this embodiment, it is desired that the antiferromagnetic layer be made of an alloy having the following composition formula;

$$Pt_q Mn_{100-q-j} L_j$$

where L is at least one or more elements selected from among Au, Ag, Cr, Ni, Ne, Ar, Xe and Kr, and composition ratios q, j satisfy 48 atom $\% \leq q+j \leq 60$ atom % and 0.2 atom $\% \leq j \leq 10$ atom %.

More preferably, the composition ratios g, j satisfy 48 atom $\% \leq q+j \leq 58$ atom % and 0.2 atom $\% \leq j \leq 10$ atom %.

The pinned magnetic layer 3 is formed of, for example, a Co film, a NiFe alloy, a CoNiFe alloy, a CoFe alloy, or a CoNi alloy.

The pinned magnetic layer 3 shown in FIG. 1 is formed in contact with the antiferromagnetic layer 2, and is magnetized under an exchange anisotropic magnetic field due to exchange coupling that is produced at the interface between the pinned magnetic layer 3 and the antiferromagnetic layer 2 when subjected to heat treatment under a magnetic field.

The magnetization direction of the pinned magnetic layer 3 is made stationary in the Y-direction shown in FIG. 1, i.e., the direction away from the magnetic recording medium (direction of height).

The non-magnetic electrically conductive layer 4 is preferably formed of a non-magnetic electrically conductive film of, e.g., Cu, Au or Ag.

Also, the free magnetic layer 5 is preferably made of a similar material to that of the pinned magnetic layer 3.

The free magnetic layer 5 is magnetized under a magnetic field from the bias layers 6, and the magnetization direction of the free magnetic layer 5 is uniformly arranged in a direction opposing to the X1-direction shown in FIG. 1, i.e., a direction perpendicularly crossing the magnetization direction of the pinned magnetic layer 3.

Because the free magnetic layer 5 is magnetized into a single domain state under the effect of the bias layers 6, the occurrence of Barkhausen noise is prevented.

The soft magnetic layer 7 is made of, for example, Co, Ni, Fe, a CoFe alloy, a CoNiFe alloy, a CoNi alloy, or a NiFe alloy. Above all, the soft magnetic layer 7 is preferably formed of the same alloy as the material of the free magnetic layer 5. In the case where a surface of the free magnetic layer 5 is formed of a NiFe alloy, the soft magnetic layer 7 is preferably formed of the NiFe alloy. The reason is that, by forming the soft magnetic layer 7 of the same material as that of the free magnetic layer 5, ferromagnetic coupling can be more surely developed at the interface between the soft magnetic layer 7 and the free magnetic layer 5, whereby a unidirectional and anisotropic exchange-coupled magnetic field produced at the interface between the bias layer 6 and the soft magnetic layer 7 can be transmitted to the free magnetic layer 5 through the soft magnetic layer 7.

The bias layer 6 is made of, similarly to the antiferromagnetic layer 2, an alloy containing at least one or more elements selected from among Pt, Pd, Ir, Rh, Ru, Os, Au, Ag, Cr, Ni, Ne, Ar, Xe and Kr, as well as Mn. With heat treatment under a magnetic field, an exchange anisotropic magnetic field is developed at the interface between the bias layer 6 and the soft magnetic layer 7, the developed exchange anisotropic magnetic field being transmitted to the soft magnetic layer 7. The free magnetic layer 5 is then magnetized in a certain direction due to ferromagnetic coupling produced at the interface between the soft magnetic layer 7 and the free magnetic layer 5.

The bias layer 6 made of such an alloy has a feature of being superior in heat resistance and corrosion resistance.

In particular, the bias layer 6 is preferably made of an alloy having the following composition formula;

$$Pt_m Mn_{100-m-n} D_n$$

where X is at least one or more elements selected from among Pt, Pd, Ir, Rh, Ru and Os, and a composition ratio m satisfies 52 atom $\% \leq m \leq 60$ atom %.

Further, the bias layer 6 may be made of an alloy having the following composition formula;

$$Pt_m Mn_{100-m-n} D_n$$

where D is at least one or more elements selected from among Pd, Ir, Rh, Ru and Os, and composition ratios m, n satisfy 52 atom $\% \leq m+n \leq 60$ atom % and 0.2 atom $\% \leq n \leq 40$ atom %.

Moreover, in the spin-valve type magnetoresistive sensor of this embodiment, the bias layer may be made of an alloy having the following composition formula;

$$Pt_q Mn_{100-q-j} L_j$$

where L is at least one or more elements selected from among Au, Ag, Cr, Ni, Ne, Ar, Xe and Kr, and composition ratios q, j satisfy 52 atom $\% \leq q+j \leq 60$ atom % and 0.2 atom $\% \leq j \leq 10$ atom %.

The electrically conductive layers 8, 8 are preferably made of, for example, Au, W, Cr or Ta.

In the spin-valve type magnetoresistive sensor 1 shown in FIG. 1, a steady electric current is applied from the electrically conductive layers 8, 8 to the free magnetic layer 5, the non-magnetic electrically conductive layer 4 and the pinned magnetic layer 3. When a leakage magnetic field from the magnetic recording medium traveling in the Z-direction is applied in the Y-direction in the above condition, the magnetization direction of the free magnetic layer 5 is varied from the direction opposing to the X1-direction toward the Y-direction. Electrical resistance is changed depending on the relationship between a variation of the magnetization direction in the free magnetic layer 5 and the stationary magnetization direction of the pinned magnetic layer 3. The leakage magnetic field from the magnetic recording medium can be detected in accordance with a voltage change caused by such a change in electrical resistance.

A method of manufacturing the spin-valve type magnetoresistive sensor 1 of this embodiment according to the present invention will be described below.

The manufacturing method is carried out by utilizing such a property that the magnitude of an exchange anisotropic magnetic field developed upon heat treatment between the antiferromagnetic layer 2 and the bias layers 6, 6 depends on positions of the antiferromagnetic layer 2 and the bias layers 6, 6 in the spin-valve type magnetoresistive sensor 1. The magnetization direction of the pinned magnetic layer 3 is made stationary by first heat treatment, and the magnetization direction of the free magnetic layer 5 is uniformly arranged in a direction crossing the magnetization direction of the pinned magnetic layer 3 by second heat treatment.

More specifically, according to the method of manufacturing the spin-valve type magnetoresistive sensor 1 of this embodiment, the antiferromagnetic layer 2, the pinned magnetic layer 3, the non-magnetic electrically conductive layer 4 and the free magnetic layer 5 are successively formed on the substrate K one above another, thereby forming a first laminate a1 shown in FIG. 2. Then, the first laminate a1 is subjected to heat treatment at a first heat treatment temperature while applying a first magnetic field in a direction perpendicular to the direction of the track width Tw (i.e., in a direction vertical to the drawing sheet of FIG. 2). An exchange anisotropic magnetic field is thereby generated in the antiferromagnetic layer 2 to make the magnetization direction of the pinned magnetic layer 3 stationary.

Figure 3:
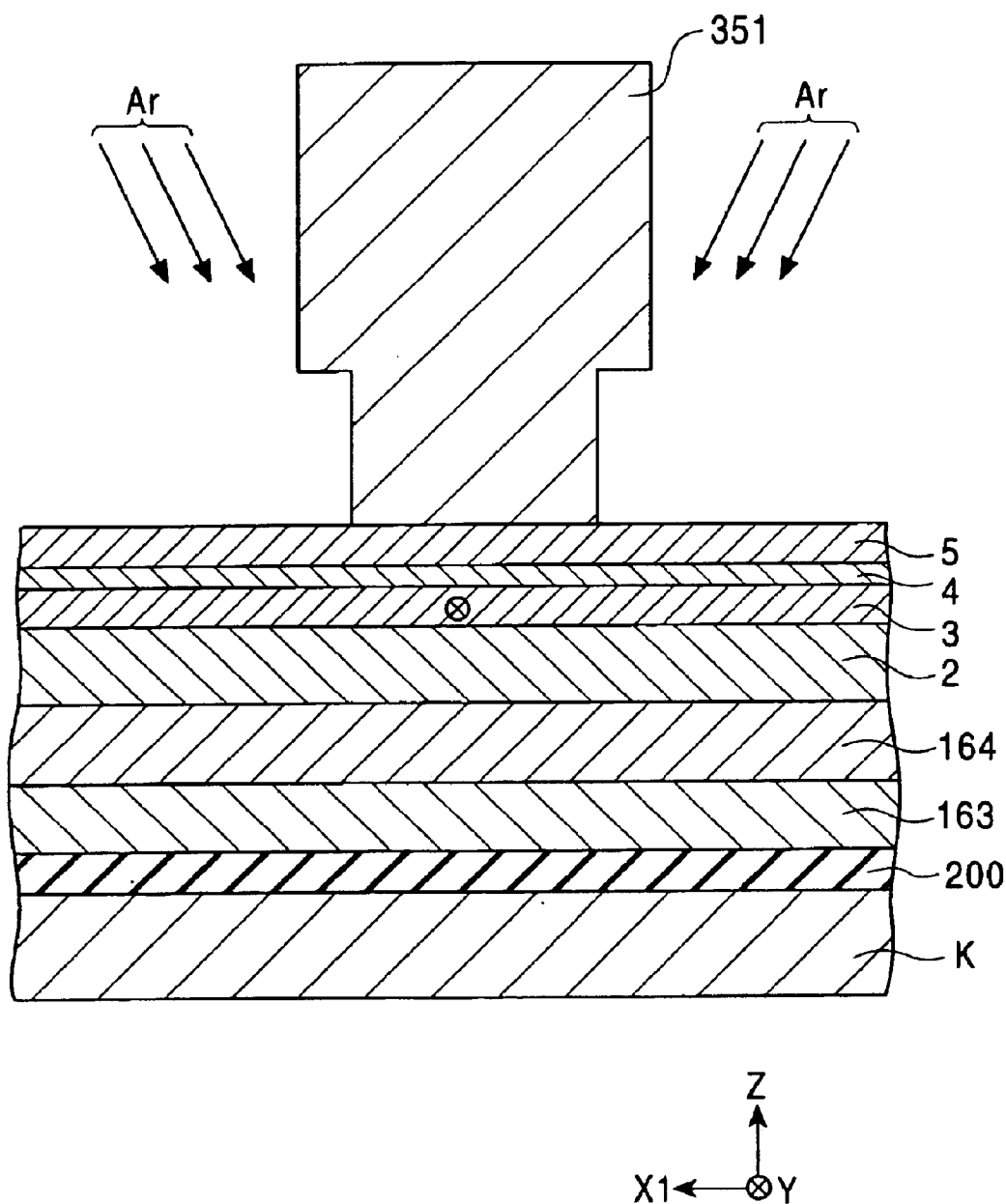
FIG. 3 is a sectional view for explaining the method of manufacturing the spin-valve type magnetoresistive sensor shown in FIG. 1, showing a state where a lift-off resist is formed.

Next, as shown in FIG. 3, a lift-off resist 351 having a base end portion with a width corresponding to the track width Tw is formed. A surface area of the free magnetic layer 5, which is not covered by the lift-off resist 351 serving as a mask, is cleaned by ion milling or reverse sputtering with rare gas, such as Ar.

Figure 4:
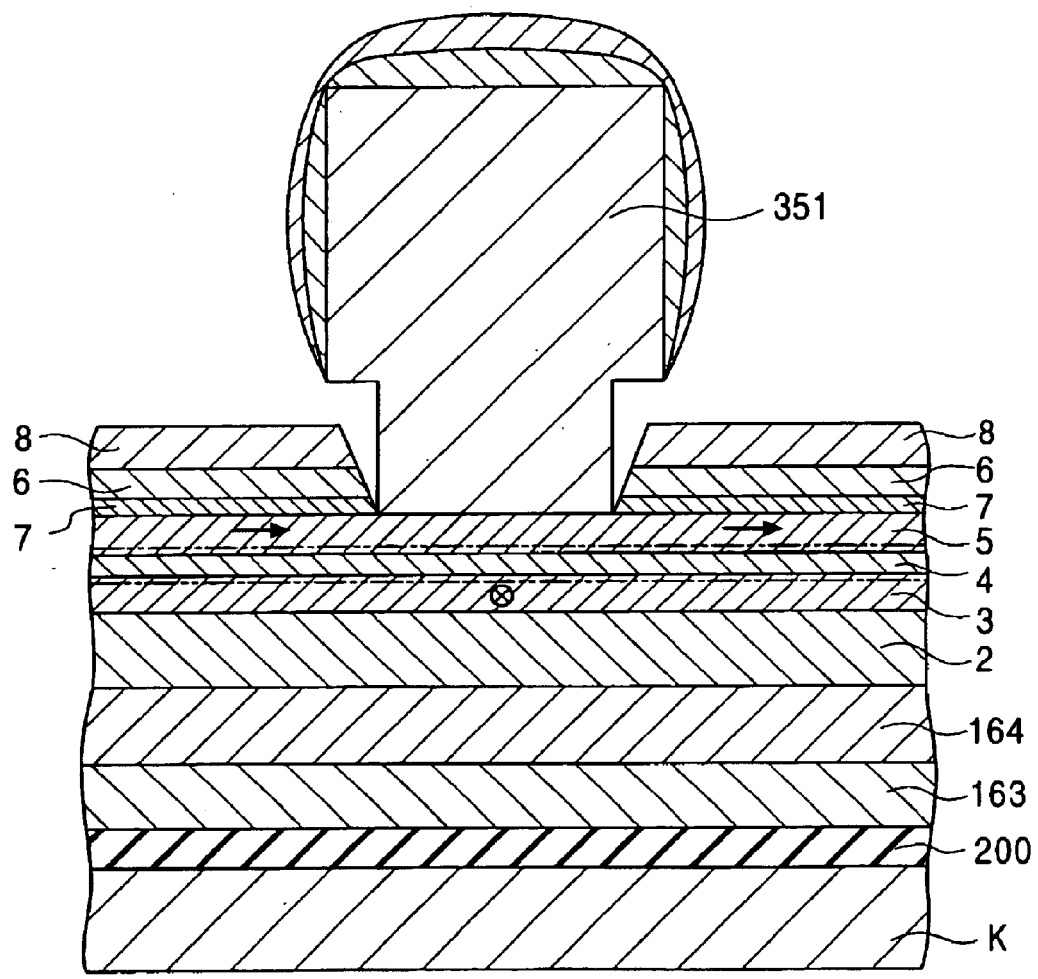
FIG. 4 is a sectional view for explaining the method of manufacturing the spin-valve type magnetoresistive sensor shown in FIG. 1, showing a state where a bias layer and an electrically conductive layer are formed.

Then, as shown in FIG. 4, the soft magnetic layers 7, 7 are formed on the exposed surface of the free magnetic layer 5 and the lift-off resist 351 while a spacing corresponding to the track width Tw is left between the soft magnetic layers 7, 7. Subsequently, the bias layers 6, 6 are formed respectively on the soft magnetic layers 7, 7, and the electrically conductive layers 8, 8 are formed respectively on the bias layers 6, 6. Thereafter, by removing the lift-off resist 351 by etching, a second laminate a2 having the same configuration as the spin-valve type magnetoresistive sensor 1 shown in FIG. 1 is obtained.

The second laminate a2 thus obtained is subjected to heat treatment at a second heat treatment temperature while a second magnetic field smaller than the exchange anisotropic magnetic field in the antiferromagnetic layer 2 is applied in the direction of the track width Tw. This heat treatment imparts, to the free magnetic layer 5, a bias magnetic field in a direction crossing the magnetization direction of the pinned magnetic layer 3, whereby the spin-valve type magnetoresistive sensor 1 is obtained.

Next, the relationship between a heat treatment temperature and an exchange anisotropic magnetic field of an antiferromagnetic layer will be described in detail with reference to FIGS. 21, 22 and 23.

Figure 21:
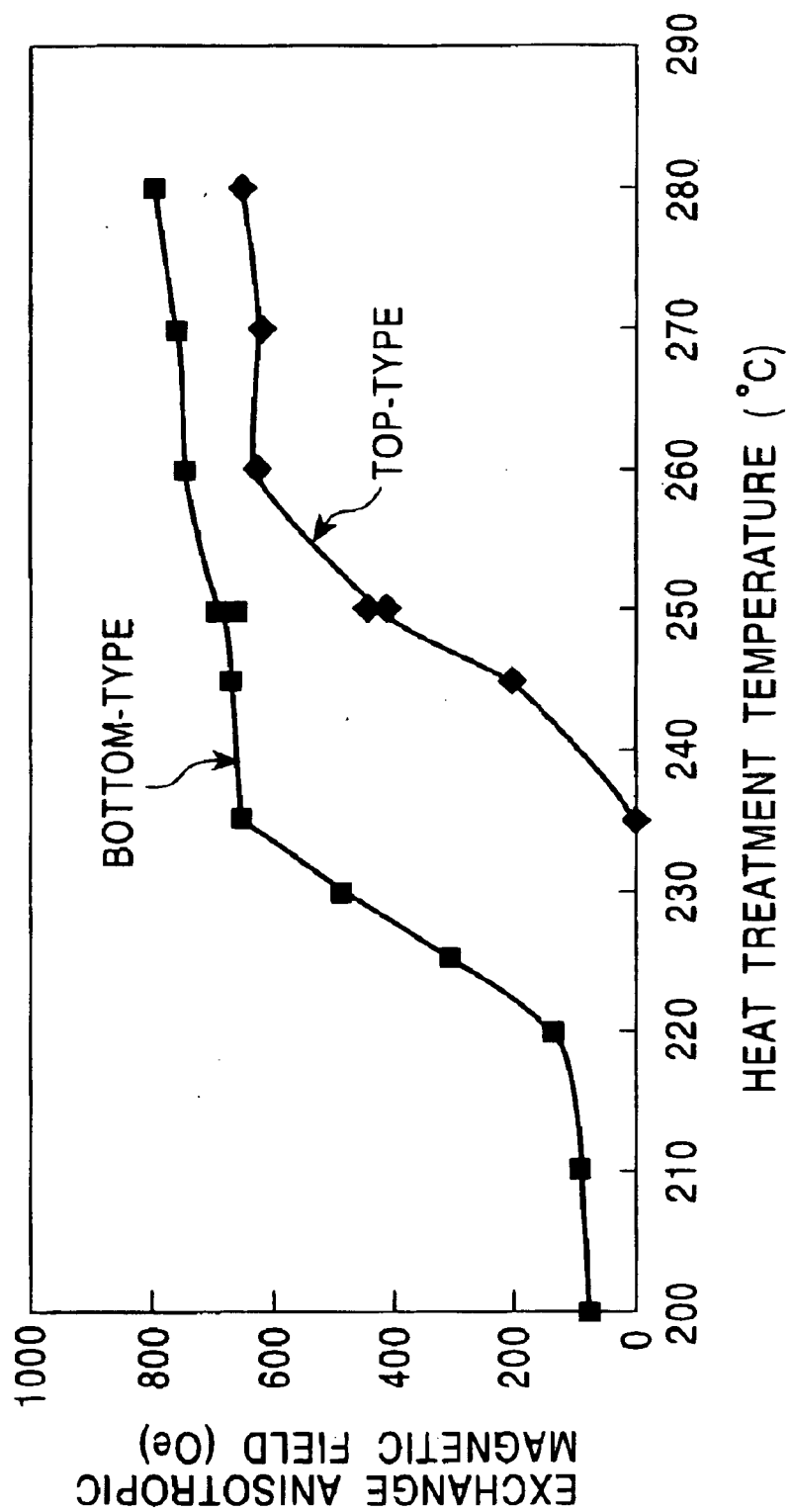
FIG. 21 is a graph showing dependency, upon a heat treatment temperature, of an exchange anisotropic magnetic field of an alloy having a composition of $Pt_{55.4}Mn_{44.6}$ and an alloy having a composition of $Pt_{54.4}Mn_{45.6}$.

Marks ■ shown in FIG. 21 represents dependency, on the heat treatment temperature, of the exchange anisotropic magnetic field in a bottom type single-spin-valve magnetoresistive sensor wherein an antiferromagnetic layer is disposed between a substrate and a free magnetic layer. Marks ◆ shown in FIG. 21 represents dependency, on the heat treatment temperature, of the exchange anisotropic magnetic field in a top type single-spin-valve magnetoresistive sensor wherein an antiferromagnetic layer is disposed in a position farther away from a substrate than a free magnetic layer.

In other words, the antiferromagnetic layer of the top type single-spin-valve magnetoresistive sensor represented by marks ◆ is disposed in a position farther away from the substrate than the antiferromagnetic layer of the bottom type single-spin-valve magnetoresistive sensor represented by marks ■.

Figure 24:
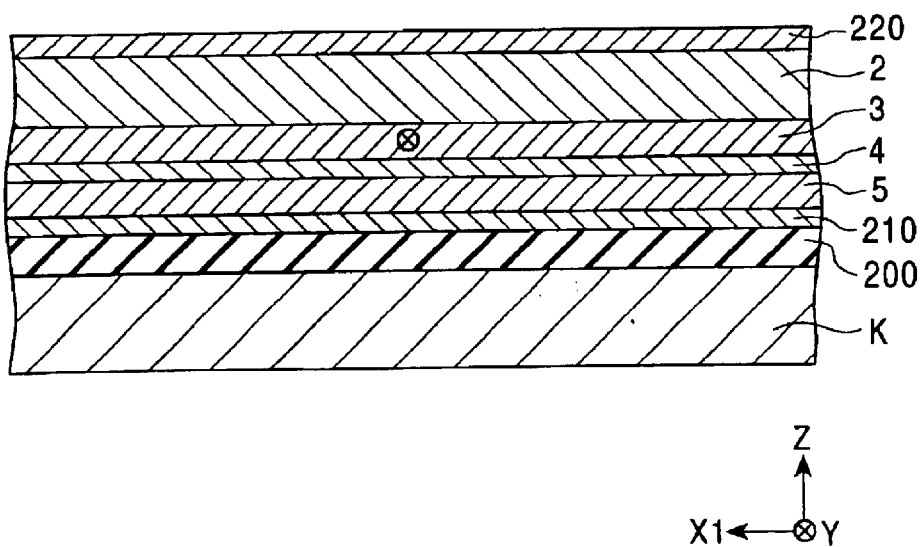
FIG. 24 is a sectional view showing the structure of another exemplary spin-valve type magnetoresistive sensor used in measurement of data shown in the graphs of FIGS. 21 and 22, as viewed from the side facing a recording medium.

Concretely, in the top type single-spin-valve magnetoresistive sensor represented by marks ◆ shown in FIG. 21, an underlying insulating layer 200 made of $Al_2O_3$ (thickness 1000 Å), an underlying layer 210 made of Ta (thickness 50 Å) a two-layered free magnetic layer 5 comprising a NiFe alloy (thickness 70 Å) and a Co layer (thickness 10 Å), a non-magnetic electrically conductive layer 4 made of Cu (thickness 30 Å), a pinned magnetic layer 3 made of Co (thickness 25 Å), an antiferromagnetic layer 2 made of $Pt_{55.4}Mn_{44.6}$ (thickness 300 Å), and a protective layer 220 made of Ta (thickness 50 Å) are successively formed on a substrate K made of Si in the order named, as shown in FIG. 24.

Figure 23:
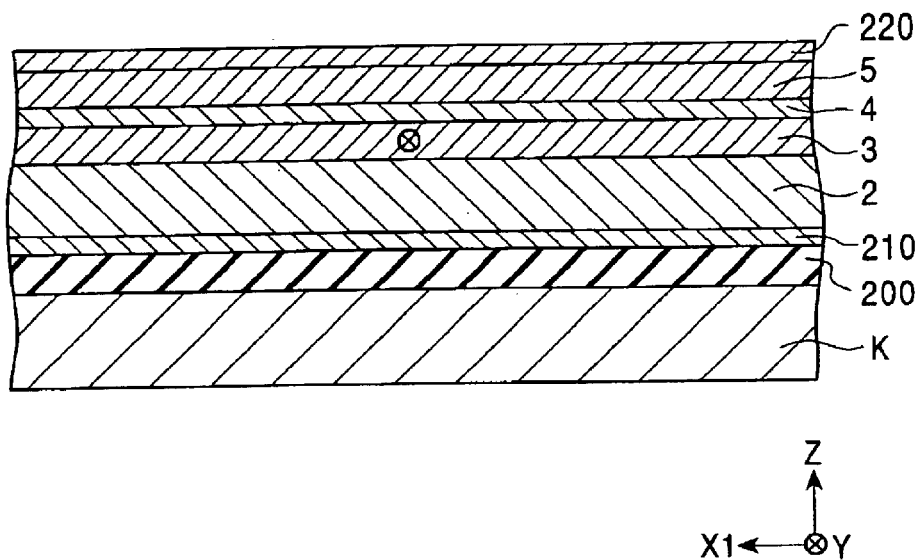
FIG. 23 is a sectional view showing the structure of one exemplary spin-valve type magnetoresistive sensor used in measurement of data shown in the graphs of FIGS. 21 and 22, as viewed from the side facing a recording medium.

Also, in the bottom type single-spin-valve magnetoresistive sensor represented by marks ■ shown in FIG. 21, an underlying insulating layer 200 made of $Al_2O_3$ (thickness 1000 Å), an underlying layer 210 made of Ta (thickness 30 Å), an antiferromagnetic layer 2 made of $Pt_{54.4}Mn_{45.6}$ (thickness 300 Å), a pinned magnetic layer 3 made of Co (thickness 25 Å), a non-magnetic electrically conductive layer 4 made of Cu (thickness 26 Å), a two-layered free magnetic layer 5 comprising a Co layer (thickness 10 Å) and a NiFe alloy (thickness 70 Å), and a protective layer 220 made of Ta (thickness 50 Å) are successively formed on a substrate K made of Si in the order named, as shown in FIG. 23.

Thus, in the top type spin-valve magnetoresistive sensor represented by marks ◆, the antiferromagnetic layer 2 is disposed on the pinned magnetic layer 3, and the free magnetic layer 5, the non-magnetic electrically conductive layer 4 and the pinned magnetic layer 3 are formed between the Si substrate K and the antiferromagnetic layer 2 in sandwiched fashion.

In the bottom type spin-valve magnetoresistive sensor represented by marks ■, the antiferromagnetic layer 2 is disposed under the pinned magnetic layer 3, and the pinned magnetic layer 3, the non-magnetic electrically conductive layer 4 and the free magnetic layer 5 are not formed between the Si substrate K and the antiferromagnetic layer 2 in this structure.

As shown in FIG. 21, the exchange anisotropic magnetic field of the antiferromagnetic layer ($Pt_{55.4}Mn_{44.6}$) represented by marks ■ starts to rise when the heat treatment temperature exceeds 220° C., reaches about 700 (Oe) beyond 240° C., and then becomes almost constant thereafter. Also, the exchange anisotropic magnetic field of the antiferromagnetic layer ($Pt_{54.4}Mn_{45.6}$) represented by marks ◆ starts to rise when the heat treatment temperature exceeds 240° C., reaches over 600 (Oe) beyond 260° C., and then becomes constant thereafter.

It is hence understood that the antiferromagnetic layer (marks ■) disposed in a position closer to the substrate exhibits a greater exchange anisotropic magnetic field at a relatively low heat treatment temperature than the antiferromagnetic layer (marks ♦) disposed in a position farther away from the substrate.

The method of manufacturing the spin-valve type magnetoresistive sensor 1 of this embodiment utilizes the above-described property of an antiferromagnetic layer.

Thus, the spin-valve type magnetoresistive sensor 1 of this embodiment is constructed as a bottom type spin-valve magnetoresistive sensor wherein the distance between the antiferromagnetic layer 2 and the substrate K is shorter (namely, the antiferromagnetic layer 2 is disposed under the pinned magnetic layer 3), and the bias layer 6 formed of the same material as the alloy used for the antiferromagnetic layer 2 is disposed in a position farther from the substrate K than the antiferromagnetic layer 2.

Accordingly, by carrying out heat treatment on the first laminate a1 at the first heat treatment temperature (220–270° C.) while applying the first magnetic field, an exchange anisotropic magnetic field is generated in the antiferromagnetic layer 2 and the magnetization direction of the pinned magnetic layer 3 is made stationary. Also, the exchange anisotropic magnetic field of the antiferromagnetic layer 2 exceeds 600 Oe (48000 A/m).

Then, by carrying out heat treatment on the second laminate a2 at the second heat treatment temperature (250–270° C.) while applying the second magnetic field in a direction crossing the first magnetic field, the magnetization direction of the free magnetic layer 5 is uniformly arranged in the direction crossing the first magnetic field. Also, the exchange anisotropic magnetic field of the bias layer 6 exceeds 600 Oe (48000 A/m).

In the above process, by setting the second magnetic field to be smaller than the exchange anisotropic magnetic field of the antiferromagnetic layer 2 that has been generated by the preceding first heat treatment, the exchange anisotropic magnetic field of the antiferromagnetic layer 2 is not deteriorated even with application of the second magnetic field to the antiferromagnetic layer 2. The magnetization direction of the pinned magnetic layer 3 can be thereby maintained stationary.

As a result, the magnetization direction of the pinned magnetic layer 3 and the magnetization direction of the free magnetic layer 5 can be held in crossing relation.

The first heat treatment temperature is preferably set to fall in the range of 220° C.–270° C. If the first heat treatment temperature is lower than 220° C., such an undesired result would occur that the exchange anisotropic magnetic field of the antiferromagnetic layer 2 is not higher than 200 (Oe), the magnetization of the pinned magnetic layer 3 cannot be increased up to a high level and the magnetization direction of the pinned magnetic layer 3 is changed to the same as that of the free magnetic layer 5 by the second heat treatment. On the other hand, if the first heat treatment temperature is higher than 270° C., such an undesired result would occur that the magnetoresistive effect is deteriorated due to, for example, thermal diffusion of atoms at the layer interfaces, especially, at the interface between the Cu layer of the non-magnetic electrically conductive layer 4 and the free magnetic layer 5 or the interface between the Cu layer and the pinned magnetic layer 3.

Further, the first heat treatment temperature is more preferably set to fall in the range of 230° C.–270° C. because the exchange anisotropic magnetic field of the antiferromagnetic layer 2 can reach over 400 Oe (32000 A/m) and the magnetization of the pinned magnetic layer 3 can be increased up to a high level.

The second heat treatment temperature is preferably set to fall in the range of 250° C.–270° C. If the second heat treatment temperature is lower than 250° C., such an undesired result would occur that the exchange anisotropic magnetic field of the bias layer 6 cannot be increased up over 400 Oe (32000 A/m) and a longitudinal magnetic field imparted to the free magnetic layer 5 cannot be increased up to a high level. On the other hand, if the second heat treatment temperature is higher than 270° C., such an undesired result would occur that the exchange anisotropic magnetic field of the bias layer 6 is no more increased and held almost constant, and the magnetoresistive effect is deteriorated due to, for example, thermal diffusion of atoms at the layer interfaces.

The first magnetic field is preferably set to be not lower than 10 Oe (800 A/m). If the first magnetic field is lower than about 10 Oe (800 A/m), such an undesired result would occur that the exchange anisotropic magnetic field of the antiferromagnetic layer 2 cannot be developed at a satisfactory level.

Further, the second magnetic field is set to be lower than the exchange-coupled magnetic field of the antiferromagnetic layer 2 that has been generated by the first heat treatment, and is preferably set to fall in the range of about 10–600 Oe (800–48000 A/m) more preferably set to about 200 Oe (1600 A/m). If the second magnetic field is smaller than 10 Oe (800 A/m), such an undesired result would occur that the exchange anisotropic magnetic field of the bias layer 6 cannot be developed at a satisfactory level. On the other hand, if the second magnetic field is higher than 600 Oe (4800 A/m), such an undesired result would occur that the exchange-coupled magnetic field of the antiferromagnetic layer 2 that has been generated by the first heat treatment may be deteriorated.

Relationships between a composition and an exchange anisotropic magnetic field of an antiferromagnetic layer, resulting when the heat treatment temperature is 245° C. or 270° C., will now be described in detail with reference to FIG. 22.

Figure 22:
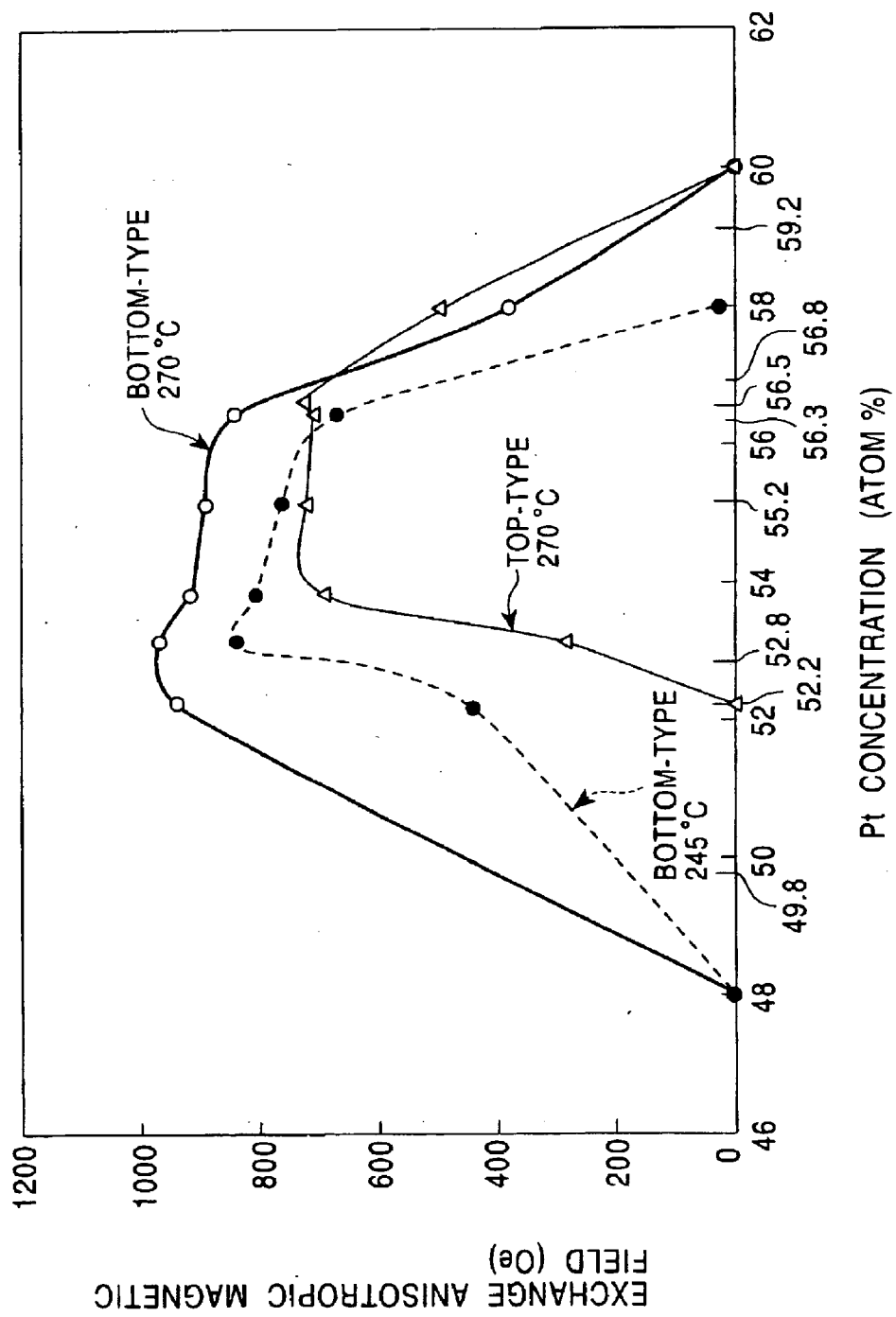
FIG. 22 is a graph showing dependency, upon a Pt concentration (composition ratio m), of an exchange anisotropic magnetic field of an alloy having a composition of $Pt_mMn_{100-m}$.

Marks Δ in FIG. 22 represent the relationship between a composition and an exchange anisotropic magnetic field of an antiferromagnetic layer in a top type single-spin-valve magnetoresistive sensor wherein the antiferromagnetic layer is disposed in a position farther from a substrate than a free magnetic layer (namely, the antiferromagnetic layer is disposed on a pinned magnetic layer). A curve indicated by marks Δ corresponds to the case of carrying out heat treatment at 270° C.

Marks ○ and marks ● in FIG. 22 each represent the relationships between a composition and an exchange anisotropic magnetic field of an antiferromagnetic layer in a bottom type single-spin-valve magnetoresistive sensor wherein the antiferromagnetic layer is disposed between a substrate and a free magnetic layer (namely, the antiferromagnetic layer is disposed under a pinned magnetic layer). Curves indicated by marks ○ and ● correspond to the cases of carrying out heat treatment at 270° C. and 245° C., respectively.

Concretely, in the top type single-spin-valve magnetoresistive sensor represented by marks Δ, an underlying insulating layer 200 made of $Al_2O_3$ (thickness 1000 Å), an underlying layer 210 made of Ta (thickness 50 Å), a two-layered free magnetic layer 5 comprising a NiFe alloy (thickness 70 Å) and a Co layer (thickness 10 Å), a non-magnetic electrically conductive layer 4 made of Cu (thickness 30 Å), a pinned magnetic layer 3 made of Co (thickness 25 Å), an antiferromagnetic layer 2 made of $Pt_mMn_r$ (thickness 300 Å), and a protective layer 220 made of Ta (thickness 50 Å) are successively formed on a Si substrate K in the order named, as shown in FIG. 24.

On the other hand, in the bottom type single-spin-valve magnetoresistive sensor represented by marks ○ and ●, an underlying insulating layer 200 made of $Al_2O_3$ (thickness 1000 Å), an underlying layer 210 made of Ta (thickness 30 Å), an antiferromagnetic layer 2 made of $Pt_mMn_{100-m}$ (thickness 300 Å), a pinned magnetic layer 3 made of Co (thickness 25 Å), a non-magnetic electrically conductive layer 4 made of Cu (thickness 26 Å), a two-layered free magnetic layer 5 comprising a Co layer (thickness 10 Å) and a NiFe alloy (thickness 70 Å), and a protective layer 220 made of Ta (thickness 50 Å) are successively formed on a Si substrate K in the order named, as shown in FIG. 23.

The method of manufacturing the spin-valve type magnetoresistive sensor 1 of this embodiment utilizes the properties of both the bottom type spin-valve magnetoresistive sensor and the top type spin-valve magnetoresistive sensor shown in FIG. 22.

More specifically, in the spin-valve type magnetoresistive sensor 1 of this embodiment constructed as a bottom type spin-valve magnetoresistive sensor, the composition range of an alloy used in the antiferromagnetic layer 2 is preferably set similarly to that in the antiferromagnetic layer of the bottom type spin-valve magnetoresistive sensor shown in FIG. 23, and the composition range of an alloy used in the bias layer 6 is preferably set similarly to that in the antiferromagnetic layer of the top type spin-valve magnetoresistive sensor shown in FIG. 24.

Also, as is apparent from FIG. 22, when the antiferromagnetic layer of the bottom type spin-valve magnetoresistive sensor, i.e., the antiferromagnetic layer 2 in this embodiment, is made of an alloy $X_mMn_{100-m}$ (where X is at least one or more elements selected from among Pt, Pd, Ir, Rh, Ru and Os), a composition ratio m preferably satisfies 48 atom %≦m≦60 atom %.

If m is less than 48 atom % or more than 60 atom %, such an undesired result would occur that crystal lattices of $X_mMn_{100-m}$ become hard to regularly align into L10 type superlattices and do not exhibit antiferromagnetic characteristics, i.e., a unidirectional exchange-coupled magnetic field (exchange anisotropic magnetic field), even with the second heat treatment carried out at the heat treatment temperature of 270° C.

A more preferable range of the composition ratio m is 48 atom %≦m≦58 atom %.

If m is less than 48 atom % or more than 60 atom %, such an undesired result would occur that crystal lattices of $X_mMn_{100-m}$ become hard to regularly align into L10 type superlattices and do not exhibit antiferromagnetic characteristics, i.e., a unidirectional exchange-coupled magnetic field, even with the first heat treatment carried out at the heat treatment temperature of 245° C.

A still more preferable range of the composition ratio m is 49.8 atom %≦m≦58 atom %. In this range, an exchange anisotropic magnetic field not lower than 400 Oe (32000 A/m) is obtained after the second heat treatment has been carried out at the heat treatment temperature of 270° C.

When the antiferromagnetic layer of the bottom type spin-valve magnetoresistive sensor, i.e., the antiferromagnetic layer 2 in this embodiment, is made of an alloy $Pt_mMn_{100-m-n}D_n$ (where D is at least one or more elements selected from among Pd, Ir, Rh, Ru and Os), composition ratios m, n preferably satisfy 48 atom %≦m+n≦60 atom % and 0.2 atom %≦n≦40 atom %.

If the sum of the composition ratios m+n is less than 48 atom % or more than 60 atom %, such an undesired result would occur that crystal lattices of $Pt_mMn_{100-m-n}D_n$ become hard to regularly align into L10 type superlattices and do not exhibit antiferromagnetic characteristics, i.e., a unidirectional exchange-coupled magnetic field, even with the second heat treatment carried out at the heat treatment temperature of 270° C.

Also, if the composition ratio n is less than 0.2 atom %, such an undesired result would occur that the effect of promoting regular array of crystal lattices of the antiferromagnetic layer 2, i.e., the effect of increasing the exchange anisotropic magnetic field, is suppressed. Conversely, if the composition ratio n is more than 40 atom %, such an undesired result would occur that the exchange anisotropic magnetic field is reduced.

A more preferable range of the sum of the composition ratios m+n is 48 atom %≦m+n≦58 atom %.

If the sum of the composition ratios m+n is less than 48 atom % or more than 58 atom %, such an undesired result would occur that crystal lattices of $Pt_mMn_{100-m-n}D_n$ become hard to regularly align into L10 type superlattices and do not exhibit antiferromagnetic characteristics, i.e., a unidirectional exchange-coupled magnetic field, even with the first heat treatment carried out at the heat treatment temperature of 245° C.

Still more preferably, the composition ratios m, n satisfy 49.8 atom %≦m+n≦58 atom % and 0.2 atom %≦n≦40 atom %. In these ranges, an exchange anisotropic magnetic field not lower than 400 Oe (32000 A/m) is obtained.

When the antiferromagnetic layer of the bottom type spin-valve magnetoresistive sensor, i.e., the antiferromagnetic layer 2 in this embodiment, is made of an alloy $Pt_qMn_{100-q-j}L_j$ (where L is at least one or more elements selected from among Au, Ag, Cr, Ni, Ne, Ar, Xe and Kr), composition ratios q, j preferably satisfy 48 atom %≦q+j≦60 atom % and 0.2 atom %≦j≦10 atom %.

If the sum of the composition ratios q+j is less than 48 atom % or more than 60 atom %, such an undesired result would occur that crystal lattices of $Pt_qMn_{100-q-j}L_j$ become hard to regularly align into L10 type superlattices and do not exhibit antiferromagnetic characteristics, i.e., a unidirectional exchange-coupled magnetic field, even with the second heat treatment carried out at the heat treatment temperature of 270° C.

Also, if the composition ratio j is less than 0.2 atom % such an undesired result would occur that the effect of improving the unidirectional exchange-coupled magnetic field with addition of the element L is not sufficiently developed. If j is more than 10 atom %, such an undesired result would occur that the unidirectional exchange-coupled magnetic field is reduced.

A more preferable range of the sum of the composition ratios q+j is 48 atom %≦q+j≦58 atom %.

If the sum of the composition ratios q+j is less than 48 atom % or more than 58 atom %, such an undesired result would occur that crystal lattices of $Pt_qMn_{100-q-j}L_j$ become hard to regularly align into L10 type superlattices and do not exhibit antiferromagnetic characteristics, i.e., a unidirectional exchange-coupled magnetic field, even with the first heat treatment carried out at the heat treatment temperature of 245° C.

Still more preferably, the composition ratios q, j satisfy 49.8 atom %≦q+j≦58 atom % and 0.2 atom %≦j≦10 atom %. In these ranges, an exchange anisotropic magnetic field not lower than 400 Oe (32000 A/m) is obtained.

Further, as is apparent from FIG. 22, when the antiferromagnetic layer of the top type spin-valve magnetoresistive sensor, i.e., the bias layer 6 in this embodiment, is made of an alloy $X_m Mn_{100-m}$ (where X is at least one or more elements selected from among Pt, Pd, Ir, Rh, Ru and Os) a composition ratio m preferably satisfies 52 atom %≦m≦60 atom %.

If the composition ratio m is less than 52 atom % or more than 60 atom %, such an undesired result would occur that crystal lattices of $X_m Mn_{100-m}$ become hard to regularly align into L10 type superlattices and do not exhibit antiferromagnetic characteristics, i.e., a unidirectional exchange-coupled magnetic field, even with the second heat treatment carried out at the heat treatment temperature of 270° C.

A more preferable range of the composition ratio m is 52.8 atom %≦m≦59.2 atom %. In this range, an exchange anisotropic magnetic field, i.e., a bias magnetic field, not lower than 200 Oe (16000 A/m) is obtained.

When the antiferromagnetic layer of the top type spin-valve magnetoresistive sensor, i.e., the bias layer 6 in this embodiment, is made of an alloy $Pt_m Mn_{100-m-n} D_n$ (where D is at least one or more elements selected from among Pd, Rh, Ru, Ir and Os) composition ratios m, n preferably satisfy 52 atom %≦m+n≦60 atom % and 0.2 atom %≦n≦40 atom %.

If the sum of the composition ratios m+n is less than 52 atom % or more than 60 atom %, such an undesired result would occur that crystal lattices of $Pt_m Mn_{100-m-n} D_n$ become hard to regularly align into L10 type superlattices and do not exhibit antiferromagnetic characteristics, i.e., a unidirectional exchange-coupled magnetic field, even with the second heat treatment carried out at the heat treatment temperature of 270° C.

Also, if the composition ratio n is less than 0.2 atom %, such an undesired result would occur that the effect of promoting regular array of crystal lattices of the antiferromagnetic layer, i.e., the effect of increasing the exchange anisotropic magnetic field, is suppressed. Conversely, if the composition ratio n is more than 40 atom %, such an undesired result would occur that the exchange anisotropic magnetic field is reduced.

More preferably, the composition ratios m, n satisfy 52.8 atom %≦m+n≦59.2 atom % and 0.2 atom %≦n≦40 atom %. In these ranges, an exchange anisotropic magnetic field not lower than 200 Oe (16000 A/m) is obtained.

When the antiferromagnetic layer of the top type spin-valve magnetoresistive sensor, i.e., the bias layer 6 in this embodiment, is made of an alloy $Pt_q Mn_{100-q-j} L_j$ (where L is at least one or more elements selected from among Au, Ag, Cr, Ni, Ne, Ar, Xe and Kr), composition ratios q, j preferably satisfy 52 atom %≦q+j≦60 atom % and 0.2 atom %≦j≦10 atom %. If the sum of the composition ratios q+j is less than 52 atom % or more than 60 atom %, such an undesired result would occur that crystal lattices of $Pt_q Mn_{100-q-j} L_j$ become hard to regularly align into L10 type superlattices and do not exhibit antiferromagnetic characteristics, i.e., a unidirectional exchange-coupled magnetic field, even with the second heat treatment carried out at the heat treatment temperature of 270° C.

Also, if the composition ratio j is less than 0.2 atom %, such an undesired result would occur that the effect of improving the unidirectional exchange-coupled magnetic field with addition of the element L is not sufficiently developed. If j is more than 10 atom %, such an undesired result would occur that the unidirectional exchange-coupled magnetic field is reduced.

More preferably, the composition ratios q, j satisfy 52.8 atom %≦q+j≦59.2 atom % and 0.2 atom %≦j≦10 atom %. In these ranges, an exchange anisotropic magnetic field not lower than 200 Oe (32000 A/m) is obtained.

Moreover, as is apparent from FIG. 22, when the antiferromagnetic layer of the bottom type spin-valve magnetoresistive sensor, i.e., the antiferromagnetic layer 2 in this embodiment, and the antiferromagnetic layer of the top type spin-valve magnetoresistive sensor, i.e., the bias layer 6 in this embodiment, are each made of an alloy $X_m Mn_{100-m}$ (where X is at least one or more elements selected from among Pt, Pd, Ir, Rh, Ru and Os), a composition ratio m preferably satisfies 52 atom %≦m≦58 atom % for each of the antiferromagnetic layer 2 and the bias layer 6.

If the composition ratio m is less than 52 atom %, such an undesired result would occur that crystal lattices of $X_m Mn_{100-m}$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio m is more than 58 atom %, such an undesired result would occur that crystal lattices of $X_m Mn_{100-m}$ making up the antiferromagnetic layer 2 become hard to regularly align into L10 type superlattices and do not exhibit antiferromagnetic characteristics, i.e., a unidirectional exchange-coupled magnetic field, even with the first heat treatment carried out at the heat treatment temperature of 245° C. In other words, when subjected to the second heat treatment at the heat treatment temperature of 270° C., the pinned magnetic layer 3 would be magnetized in the same magnetization direction as the bias layer 6, or the magnetization direction of the pinned magnetic layer 3 would not cross the magnetization direction of the bias layer 6 in orthogonal relation, whereby symmetry of a reproduced output waveform is lost.

When the antiferromagnetic layer 2 and the bias layer 6 are each made of an alloy $X_m Mn_{100-m}$, the composition ratio m more preferably satisfies 52 atom %≦m≦56.3 atom % for each of the antiferromagnetic layer 2 and the bias layer 6.

If the composition ratio m is less than 52 atom %, such an undesired result would occur that crystal lattices of $X_m Mn_{100-m}$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio m is more than 56.3 atom %, such an undesired result would occur that the exchange anisotropic magnetic field generated by the bias layer 6 is greater than the exchange anisotropic magnetic field generated by the antiferromagnetic layer 2, and an external magnetic field greater than the exchange anisotropic magnetic field generated by the antiferromagnetic layer 2 is applied to the bias layer 6 during the second heat treatment carried out at the heat treatment temperature of 270° C. In other words, when subjected to the second heat treatment at the heat treatment temperature of 270° C., the magnetization direction of the pinned magnetic layer 3 would be changed to the same as that of the bias layer 6, or it would be difficult to uniformly arrange the magnetization direction of the pinned magnetic layer 3 in orthogonal relation to the magnetization direction of the free magnetic layer 5 with the second heat treatment.

By setting the composition ratio m to satisfy 52 atom %≦m≦56.3 atom % for each of the antiferromagnetic layer 2 and the bias layer 6, therefore, an exchange anisotropic magnetic field is generated in the antiferromagnetic layer 2 by the first heat treatment, and the exchange anisotropic magnetic field of the antiferromagnetic layer 2 is greater than the exchange anisotropic magnetic field of the bias layer 6 generated after the second heat treatment. Accordingly, such a desired result is obtained that the magnetization direction of the pinned magnetic layer 3 remains not changed and held stationary, whereas the magnetization direction of the free magnetic layer 5 is allowed to smoothly change, when a signal magnetic field is applied from the magnetic recording medium.

When the antiferromagnetic layer 2 and the bias layer 6 are each made of an alloy $Pt_mMn_{100-m-n}D_n$ (where D is at least one or more elements selected from among Pd, Ir, Rh, Ru and Os), composition ratios m, n preferably satisfy 52 atom $\% \leq m+n \leq 58$ atom % and 0.2 atom $\% \leq n \leq 40$ atom %.

If the sum of the composition ratios m+n is less than 52 atom %, such an undesired result would occur that crystal lattices of $Pt_mMn_{100-m-n}D_n$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C. If m+n is more than 58 atom %, such an undesired result would occur that crystal lattices of $Pt_mMn_{100-m-n}D_n$ making up the antiferromagnetic layer 2 become hard to regularly align into L10 type superlattices and do not exhibit antiferromagnetic characteristics, i.e., a unidirectional exchange-coupled magnetic field, even with the first heat treatment carried out at the heat treatment temperature of 245° C. In other words, when subjected to the second heat treatment at the heat treatment temperature of 270° C., the pinned magnetic layer 3 would be magnetized in the same magnetization direction as the bias layer 6, or the magnetization direction of the pinned magnetic layer 3 would not cross the magnetization direction of the bias layer 6 in orthogonal relation, whereby symmetry of a reproduced output waveform is lost.

Also, if the composition ratio n is less than 0.2 atom %, such an undesired result would occur that the effect of improving the unidirectional exchange-coupled magnetic field with addition of the element D is not sufficiently developed. If n is more than 40 atom %, such an undesired result would occur that the unidirectional exchange-coupled magnetic field is reduced.

When the antiferromagnetic layer 2 and the bias layer 6 are each made of an alloy $Pt_mMn_{100-m-n}D_n$, the composition ratios m, n more preferably satisfy 52 atom $\% \leq m+n \leq 56.3$ atom % and 0.2 atom $\% \leq n \leq 40$ atom %.

If the sum of the composition ratios m+n is less than 52 atom %, such an undesired result would occur that crystal lattices of $Pt_mMn_{100-m-n}D_n$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio m+n is more than 56.3 atom %, such an undesired result would occur that the exchange anisotropic magnetic field generated by the bias layer 6 is greater than the exchange anisotropic magnetic field generated by the antiferromagnetic layer 2, and an external magnetic field greater than the exchange anisotropic magnetic field generated by the antiferromagnetic layer 2 is applied to the bias layer 6 during the second heat treatment carried out at the heat treatment temperature of 270° C. In other words, when subjected to the second heat treatment at the heat treatment temperature of 270° C., the magnetization direction of the pinned magnetic layer 3 would be changed to the same as that of the bias layer 6, or it would be difficult to uniformly arrange the magnetization direction of the pinned magnetic layer 3 in orthogonal relation to the magnetization direction of the free magnetic layer 5 with the second heat treatment.

Also, if the composition ratio n is less than 0.2 atom %, such an undesired result would occur that the effect of improving the unidirectional exchange-coupled magnetic field with addition of the element D is not sufficiently developed. If n is more than 40 atom %, such an undesired result would occur that the unidirectional exchange-coupled magnetic field is reduced.

By setting the composition ratios n+n to satisfy 52 atom $\% \leq m+n \leq 56.3$ atom % and 0.2 atom $\% \leq n \leq 40$ atom % for each of the antiferromagnetic layer 2 and the bias layer 6, therefore, an exchange anisotropic magnetic field is generated in the antiferromagnetic layer 2 by the first heat treatment, and the exchange anisotropic magnetic field of the antiferromagnetic layer 2 is greater than the exchange anisotropic magnetic field of the bias layer 6 generated after the second heat treatment. Accordingly, such a desired result is obtained that the magnetization direction of the pinned magnetic layer 3 remains not changed and held stationary, whereas the magnetization direction of the free magnetic layer 5 is allowed to smoothly change, when a signal magnetic field is applied from the magnetic recording medium.

When the antiferromagnetic layer 2 and the bias layer 6 are each made of an alloy $Pt_qMn_{100-q-j}L_j$ (where L is at least one or more elements selected from among Au, Ag, Cr, Ni, Ne, Ar, Xe and Kr), composition ratios q, j preferably satisfy 52 atom $\% \leq q+j \leq 58$ atom % and 0.2 atom $\% \leq j \leq 10$ atom %.

If the sum of the composition ratios q+j is less than 52 atom %, such an undesired result would occur that crystal lattices of $Pt_qMn_{100-q-j}L_j$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If q+j is more than 58 atom %, such an undesired result would occur that crystal lattices of $Pt_qMn_{100-q-j}L_j$ making up the antiferromagnetic layer 2 become hard to regularly align into L10 type superlattices and do not exhibit antiferromagnetic characteristics, i.e., a unidirectional exchange-coupled magnetic field, even with the first heat treatment carried out at the heat treatment temperature of 245° C. In other words, when subjected to the second heat treatment at the heat treatment temperature of 270° C., the pinned magnetic layer 3 would be magnetized in the same magnetization direction as the bias layer 6, or the magnetization direction of the pinned magnetic layer 3 would not cross the magnetization direction of the bias layer 6 in orthogonal relation, whereby symmetry of a reproduced output waveform is lost.

Also, if the composition ratio j is less than 0.2 atom %, such an undesired result would occur that the effect of improving the unidirectional exchange-coupled magnetic field with addition of the element L is not sufficiently developed. If j is more than 10 atom %, such an undesired result would occur that the unidirectional exchange-coupled magnetic field is reduced.

When the antiferromagnetic layer 2 and the bias layer 6 are each made of an alloy $Pt_qMn_{100-q-j}L_j$, the composition ratios q, j more preferably satisfy 52 atom $\% \leq q+j \leq 56.3$ atom % and 0.2 atom $\% \leq j \leq 10$ atom %.

If the sum of the composition ratios q+j is less than 52 atom %, such an undesired result would occur that crystal lattices of $Pt_qMn_{100-q-j}L_j$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio q+j is more than 56.3 atom %, such an undesired result would occur that the exchange anisotropic magnetic field generated by the bias layer 6 is greater than the exchange anisotropic magnetic field generated by the antiferromagnetic layer 2, and an external magnetic field greater than the exchange anisotropic magnetic field generated by the antiferromagnetic layer 2 is applied to the bias layer 6 during the second heat treatment carried out at the heat treatment temperature of 270° C. In other words, when subjected to the second heat treatment at the heat treatment temperature of 270° C., the magnetization direction of the pinned magnetic layer 3 would be changed to the same as that of the free magnetic layer 5, or it would be difficult to uniformly arrange the magnetization direction of the pinned magnetic layer 3 in orthogonal relation to the magnetization direction of the free magnetic layer 5 with the second heat treatment.

Also, if the composition ratio j is less than 0.2 atom %, such an undesired result would occur that the effect of improving the unidirectional exchange-coupled magnetic field with addition of the element L is not sufficiently developed. If j is more than 10 atom %, such an undesired result would occur that the unidirectional exchange-coupled magnetic field is reduced.

By setting the composition ratios q+j to satisfy 52 atom %≦q+j≦56.3 atom % and 0.2 atom %≦j≦10 atom % for each of the antiferromagnetic layer 2 and the bias layer 6, therefore, an exchange anisotropic magnetic field is generated in the antiferromagnetic layer 2 by the first heat treatment, and the exchange anisotropic magnetic field of the antiferromagnetic layer 2 is greater than the exchange anisotropic magnetic field of the bias layer 6 generated after the second heat treatment. Accordingly, such a desired result is obtained that the magnetization direction of the pinned magnetic layer 3 remains not changed and held stationary, whereas the magnetization direction of the free magnetic layer 5 is allowed to smoothly change, when a signal magnetic field is applied from the magnetic recording medium.

As an alternative, the antiferromagnetic layer of the bottom type spin-valve magnetoresistive sensor, i.e., the antiferromagnetic layer 2 in this embodiment, may have a composition different from that of the antiferromagnetic layer of the top type spin-valve magnetoresistive sensor, i.e., the bias layer 6 in this embodiment, so that the antiferromagnetic layer 2 has a higher Mn concentration, for example, than that of the bias layer 6. This makes it possible to provide a more significant difference between the exchange anisotropic magnetic fields of the antiferromagnetic layer 2 and the bias layer 6 after the second heat treatment, and to more surely make the magnetization direction of the free magnetic layer 5 cross the magnetization direction of the pinned magnetic layer 3 in orthogonal relation after the second heat treatment.

Also, by providing a more significant difference between the exchange anisotropic magnetic fields of the antiferromagnetic layer 2 and the bias layer 6, which are made different in Mn concentration from each other, after the second heat treatment, the magnetization direction of the pinned magnetic layer 3 remains not changed and held stationary with higher certainty, whereas the magnetization direction of the free magnetic layer 5 is allowed to more smoothly change, when a signal magnetic field is applied from the magnetic recording medium.

More specifically, it is more preferable that the bias layer 62 be made of an alloy $X_mMn_{100-m}$ (where X is at least one or more elements selected from among Pt, Pd, Ir, Rh, Ru and Os and a composition ratio m satisfies 52 atom %≦m≦60 atom %) and the antiferromagnetic layer 2 be made of an alloy $X_mMn_{100-m}$ (where X is at least one or more elements selected from among Pt, Pd, Ir, Rh, Ru and Os and a composition ratio m preferably satisfies 48 atom %≦m≦58 atom %).

As shown in FIG. 22, if the composition ratio m of the bias layer 6 is less than 53 atom % or more than 60 atom %, such an undesired result would occur that crystal lattices of $X_mMn_{100-m}$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio m of the antiferromagnetic layer 2 is less than 48 atom % or more than 58 atom %, such an undesired result would occur that crystal lattices of $X_mMn_{100-m}$ making up the antiferromagnetic layer 2 become hard to regularly align into L10 type superlattices and do not exhibit antiferromagnetic characteristics, i.e., a unidirectional exchange-coupled magnetic field, even with the first heat treatment carried out at the heat treatment temperature of 245° C.

Thus, the composition ratio (48 atom %≦m≦58 atom %) of the antiferromagnetic layer 2 and the composition ratio (52 atom %≦m≦60 atom %) of the bias layer 6 are selected to have different ratios within the respective ranges so that the exchange anisotropic magnetic field of the antiferromagnetic layer 2 is generated with the first heat treatment carried out at the first heat treatment temperature of 245° C., and the exchange anisotropic magnetic field of the antiferromagnetic layer 2 is greater than the exchange anisotropic magnetic field of the bias layer 6 after carrying out the second heat treatment at the second heat treatment temperature of 270° C. while applying an external magnetic field smaller than the exchange anisotropic magnetic field of the antiferromagnetic layer 2 during the second heat treatment.

By selecting different composition ratios within the respective ranges so as to satisfy the above condition, a difference between the exchange anisotropic magnetic field of the antiferromagnetic layer 2 and the exchange anisotropic magnetic field of the bias layer 6 after the second heat treatment can be made more significant and hence the degree of freedom in design can be made greater with the selected combination of different compositions than the case of forming the antiferromagnetic layer 2 and the bias layer 6 of the same composition.

Also, by generating the exchange anisotropic magnetic field of the antiferromagnetic layer 2 with the first heat treatment and applying an external magnetic field smaller than the exchange anisotropic magnetic field of the antiferromagnetic layer 2 during the second heat treatment, the magnetization direction of the free magnetic layer 5 and the magnetization direction of the pinned magnetic layer 3 can be set in cross relation, while the magnetization direction of the pinned magnetic layer 3 is positively held stationary without deteriorating the exchange anisotropic magnetic field of the antiferromagnetic layer 2 or changing the magnetization direction thereof.

Further, since the exchange anisotropic magnetic field of the antiferromagnetic layer 2 can be made still greater than the exchange anisotropic magnetic field of the bias layer 6 after the second heat treatment, the magnetization direction of the pinned magnetic layer 3 remains not changed and held stationary with higher certainty, whereas the magnetization direction of the free magnetic layer 5 is allowed to more smoothly change, when a signal magnetic field is applied from the magnetic recording medium.

As another preferable combination of the antiferromagnetic layer 2 and the bias layer 6, the bias layer 6 is made of an alloy $Pt_mMn_{100-m-n}D_n$ (where D is at least one or more elements selected from among Pd, Ir, Rh, Ru and Os, and composition ratios m, n satisfy 52 atom $\% \leq m+n \leq 60$ atom % and 0.2 atom $\% \leq n \leq 40$ atom %), and the antiferromagnetic layer 2 is made of an alloy $Pt_mMn_{100-m-n}D_n$ (where D is at least one or more elements selected from among Pd, Ir, Rh, Ru and Os, and composition ratios m, n satisfy 48 atom $\% \leq m+n \leq 58$ atom % and 0.2 atom $\% \leq n \leq 40$ atom %).

If the sum of the composition ratios m+n of the bias layer 6 is less than 52 atom % or more than 60 atom %, such an undesired result would occur that crystal lattices of $Pt_mMn_{100-m-n}D_n$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio n of the bias layer 6 is less than 0.2 atom %, such an undesired result would occur that the effect of improving the unidirectional exchange-coupled magnetic field with addition of the element D is not sufficiently developed. If n is more than 40 atom %, such an undesired result would occur that the unidirectional exchange-coupled magnetic field is reduced.

Also, if the sum of the composition ratios m+n of the antiferromagnetic layer 2 is less than 48 atom % or more than 58 atom %, such an undesired result would occur that crystal lattices of $Pt_mMn_{100-m-n}D_n$ making up the antiferromagnetic layer 2 become hard to regularly align into L10 type superlattices and do not exhibit antiferromagnetic characteristics, i.e., a unidirectional exchange-coupled magnetic field, even with the first heat treatment carried out at the heat treatment temperature of 245° C.

If the composition ratio n of the antiferromagnetic layer 2 is less than 0.2 atom %, such an undesired result would occur that the effect of improving the unidirectional exchange-coupled magnetic field with addition of the element D is not sufficiently developed. If n is more than 40 atom %, such an undesired result would occur that the unidirectional exchange-coupled magnetic field is reduced.

Thus, the composition ratio (48 atom $\% \leq m+n \leq 58$ atom %) of the antiferromagnetic layer 2 and the composition ratio (52 atom $\% \leq m+n \leq 60$ atom %) of the bias layer 6 are selected to have different ratios within the respective ranges so that the exchange anisotropic magnetic field of the antiferromagnetic layer 2 is generated with the first heat treatment carried out at the first heat treatment temperature of 245° C., and the exchange anisotropic magnetic field of the antiferromagnetic layer 2 is greater than the exchange anisotropic magnetic field of the bias layer 6 after carrying out the second heat treatment at the second heat treatment temperature of 270° C. while applying an external magnetic field smaller than the exchange anisotropic magnetic field of the antiferromagnetic layer 2 during the second heat treatment.

By selecting different composition ratios within the respective ranges so as to satisfy the above condition, a difference between the exchange anisotropic magnetic field of the antiferromagnetic layer 2 and the exchange anisotropic magnetic field of the bias layer 6 after the second heat treatment can be made more significant and hence the degree of freedom in design can be made greater with the selected combination of different compositions than the case of forming the antiferromagnetic layer 2 and the bias layer 6 of the same composition.

Also, by generating the exchange anisotropic magnetic field of the antiferromagnetic layer 2 with the first heat treatment and applying an external magnetic field smaller than the exchange anisotropic magnetic field of the antiferromagnetic layer 2 during the second heat treatment, the magnetization directions of the free magnetic layer 5 and the pinned magnetic layer 3 can be set in cross relation to each other, while the magnetization direction of the pinned magnetic layer 3 is positively held stationary without deteriorating the exchange anisotropic magnetic field of the antiferromagnetic layer 2 or changing the magnetization direction thereof.

Further, since the exchange anisotropic magnetic field of the antiferromagnetic layer 2 can be made still greater than the exchange anisotropic magnetic field of the bias layer 6 after the second heat treatment, the magnetization direction of the pinned magnetic layer 3 remains not changed and held stationary with higher certainty, whereas the magnetization direction of the free magnetic layer 5 is allowed to more smoothly change, when a signal magnetic field is applied from the magnetic recording medium.

As still another preferable combination of the antiferromagnetic layer 2 and the bias layer 6, the bias layer 6 is made of an alloy $Pt_qMn_{100-q-j}L_j$ (where L is at least one or more elements selected from among Au, Ag, Cr, Ni, Ne, Ar, Xe and Kr, and composition ratios q, j satisfy 52 atom $\% \leq q+j \leq 60$ atom % and 0.2 atom $\% \leq j \leq 10$ atom %, and the antiferromagnetic layer 2 is made of an alloy $Pt_qMn_{100-q-j}L_j$ (where L is at least one or more elements selected from among Au, Ag, Cr, Ni, Ne, Ar, Xe and Kr, and composition ratios q, j satisfy 48 atom $\% \leq q+j \leq 58$ atom % and 0.2 atom $\% \leq j \leq 10$ atom %).

If the sum of the composition ratios q+j of the bias layer 6 is less than 52 atom % or more than 60 atom %, such an undesired result would occur that crystal lattices of $Pt_qMn_{100-q-j}L_j$ making up the bias layer 6 become hard to regularly align into L10 type superlattices and do not exhibit antiferromagnetic characteristics, i.e., a unidirectional exchange-coupled magnetic field, even with the second heat treatment carried out at the heat treatment temperature of 270° C.

If the composition ratio j of the bias layer 6 is less than 0.2 atom %, such an undesired result would occur that the effect of improving the unidirectional exchange-coupled magnetic field with addition of the element L is not sufficiently developed. If j is more than 10 atom %, such an undesired result would occur that the unidirectional exchange-coupled magnetic field is reduced.

Also, if the sum of the composition ratios q+j of the antiferromagnetic layer 2 is less than 48 atom % or more than 58 atom %, such an undesired result would occur that crystal lattices of $Pt_qMn_{100-q-j}L_j$ making up the antiferromagnetic layer 2 become hard to regularly align into L10 type superlattices and do not exhibit antiferromagnetic characteristics, i.e., a unidirectional exchange-coupled magnetic field, even with the first heat treatment carried out at the heat treatment temperature of 245° C.

If the composition ratio j of the antiferromagnetic layer 2 is less than 0.2 atom %, such an undesired result would occur that the effect of improving the unidirectional exchange-coupled magnetic field with addition of the element L is not sufficiently developed If j is more than 10 atom %, such an undesired result would occur that the unidirectional exchange-coupled magnetic field is reduced.

Thus, the composition ratio (48 atom %≦q+j≦58 atom %) of the antiferromagnetic layer 2 and the composition ratio (52 atom %≦q+j≦60 atom %) of the bias layer 6 are selected to have different ratios within the respective ranges so that the exchange anisotropic magnetic field of the antiferromagnetic layer 2 is generated with the first heat treatment carried out at the first heat treatment temperature of 245° C., and the exchange anisotropic magnetic field of the antiferromagnetic layer 2 is greater than the exchange anisotropic magnetic field of the bias layer 6 after carrying out the second heat treatment at the second heat treatment temperature of 270° C. while applying an external magnetic field smaller than the exchange anisotropic magnetic field of the antiferromagnetic layer 2 during the second heat treatment.

By selecting different composition ratios within the respective ranges so as to satisfy the above condition, a difference between the exchange anisotropic magnetic field of the antiferromagnetic layer 2 generated by the first heat treatment and the exchange anisotropic magnetic field of the bias layer 6 generated by the second heat treatment can be made more significant and hence the degree of freedom in design can be made greater with the selected combination of different compositions than the case of forming the antiferromagnetic layer 2 and the bias layer 6 of the same composition.

Also, by generating the exchange anisotropic magnetic field of the antiferromagnetic layer 2 with the first heat treatment and applying an external magnetic field smaller than the exchange anisotropic magnetic field of the antiferromagnetic layer 2 during the second heat treatment, the magnetization directions of the free magnetic layer 5 and the pinned magnetic layer 3 can be set in cross relation to each other, while the magnetization direction of the pinned magnetic layer 3 is positively held stationary without deteriorating the exchange anisotropic magnetic field of the antiferromagnetic layer 2 or changing the magnetization direction thereof.

Further, since the exchange anisotropic magnetic field of the antiferromagnetic layer 2 can be made still greater than the exchange anisotropic magnetic field of the bias layer 6 after the second heat treatment, the magnetization direction of the pinned magnetic layer 3 remains not changed and held stationary with higher certainty, whereas the magnetization direction of the free magnetic layer 5 is allowed to more smoothly change, when a signal magnetic field is applied from the magnetic recording medium.

In the spin-valve type magnetoresistive sensor 1 thus constructed, the antiferromagnetic layer 2 and the bias layer 6 are each made of an alloy containing at least one or more elements selected from among Pt, Pd, Rh, Ru, Ir, Os, Au, Ag, Cr, Ni, Ne, Ar, Xe and Kr, as well as Mn. Therefore, the exchange anisotropic magnetic field has a good temperature characteristic, and the spin-valve type magnetoresistive sensor 1 has superior heat resistance.

The blocking temperature of a PtMn alloy, for example, is about 380° C. higher than that of a FeMn alloy, i.e., 150° C., which has been used for a bias layer of a conventional spin-valve type magnetoresistive sensor.

Accordingly, the spin-valve type magnetoresistive sensor 1 has good durability even when it is provided in a device such as a magnetoresistive head where the inside temperature reaches a high level, and exhibits a less variation in the exchange anisotropic magnetic field (exchange-coupled magnetic field) with a temperature change.

Further, by forming the antiferromagnetic layer 2 of the above-mentioned material, the blocking temperature can be raised and a greater exchange anisotropic magnetic field can be generated in the antiferromagnetic layer 2. As a result, the magnetization direction of the pinned magnetic layer 3 can be firmly held stationary.

Of the various materials for the bias layer 6 and the antiferromagnetic layer 2 in the present invention, a more preferable material is a PtMn alloy that has a higher blocking temperature, i.e., 380° C., than that of a IrMn alloy, i.e., 230° C.

In the method of manufacturing the spin-valve type magnetoresistive sensor 1, an alloy containing at least one or more elements selected from among Pt, Pd, Rh, Ru, Ir, Os, Au, Ag, Cr, Ni, Ne, Ar, Xe and Kr, as well as Mn is used for the antiferromagnetic layer 2 and the bias layer 6. By utilizing properties of such an alloy, the magnetization direction of the pinned magnetic layer 3 is made stationary by the first heat treatment, and the magnetization direction of the free magnetic layer 5 is uniformly arranged in a direction crossing the magnetization direction of the pinned magnetic layer 3 by the second heat treatment. It is therefore possible to uniformly arrange the magnetization direction of the free magnetic layer 5 in a direction crossing the magnetization direction of the pinned magnetic layer 3 without adversely affecting the magnetization direction of the pinned magnetic layer 3, and to provide the spin-valve type magnetoresistive sensor 1 having superior heat resistance.

Also, in the method of manufacturing the spin-valve type magnetoresistive sensor 1, the soft magnetic layers 7, 7 are formed on the first laminate 1a, and the bias layers 6, 6 are formed respectively on the soft magnetic layers 7, 7. After forming the soft magnetic layers 7, 7, therefore, the bias layers 6, 6 can be formed without breaking a vacuum. This means no necessity of cleaning a surface, on which the bias layers 6, 6 are to be formed, by ion milling or reverse sputtering. As a result, the manufacturing method is superior in being free from a drawback attributable to the cleaning, such as an adverse effect upon generation of the exchange anisotropic magnetic field caused by contamination with foreign matters deposited again on the surface or disorder of the crystal state at the surface.

Moreover, the manufacturing process is facilitated because of no necessity of cleaning the surface, on which the bias layers 6, 6 are to be formed, before forming the bias layers 6, 6.

On the other hand, the ferromagnetic coupling at the interface between the free magnetic layer 5 and the soft magnetic layer 7 is not so sensitive to contamination etc. as the exchange coupling at the interface between the free magnetic layer 5 and an antiferromagnetic layer. Therefore, a longitudinal magnetic field imparted to the free magnetic layer 5 can be surely generated at a sufficient level even if the soft magnetic layer 7 is formed after breaking a vacuum and exposing the laminate 1a to the atmosphere. Alternatively, prior to forming the soft magnetic layer 7, the surface of the laminate 1a may be cleaned by ion milling or reverse sputtering, for example, without breaking a vacuum.

By providing the above-described spin-valve type magnetoresistive sensor 1 on the slider 151, a highly reliable magnetoresistive head can be obtained which is superior in durability and heat resistance, and which can generate an exchange anisotropic magnetic field at a sufficient level.

In the spin-valve type magnetoresistive sensor 1 according to the first embodiment of the present invention, as described above, the pinned magnetic layer 3 and the free magnetic layer 5 are each formed in a single-layer structure respectively under and on the non-magnetic electrically conductive layer 4 in the direction of thickness thereof. However, the pinned magnetic layer 3 and the free magnetic layer 5 may be each formed in a multilayer structure.

The mechanism developing a giant magnetoresistive change is attributable to spin-dependent scattering of conduction electrons caused at the interface between the non-magnetic electrically conductive layer 4 and the pinned magnetic layer 3 and at the interface between the non-magnetic electrically conductive layer 4 and the free magnetic layer 5. A preferable combination with the non-magnetic electrically conductive layer 4 made of Cu, for example, for causing spin-dependent scattering more remarkably is given by a Co layer. For this reason, when the pinned magnetic layer 3 is made of a material other than Co, a portion of the pinned magnetic layer 3 in contact with the non-magnetic electrically conductive layer 4 is preferably formed of a thin Co layer 3a as indicated by a two-dot-chain line in FIG. 1. Also, when the free magnetic layer 5 is made of a material other than Co, a portion of the free magnetic layer 5 in contact with the non-magnetic electrically conductive layer 4 is preferably formed, as with the pinned magnetic layer 3, of a thin Co layer 5a as indicated by a two-dot-chain line in FIG. 1.

Second Embodiment

Figure 7:
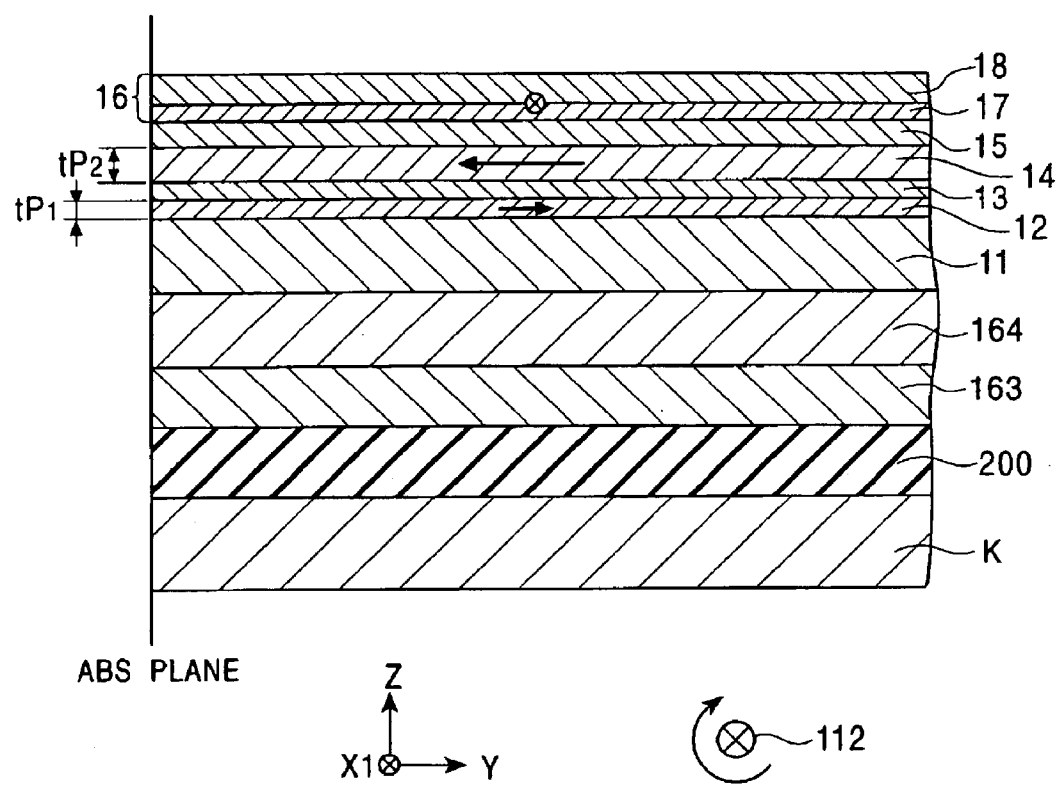
FIG. 7 is a sectional view showing a spin-valve type magnetoresistive sensor according to a second embodiment of the present invention.
Figure 8:
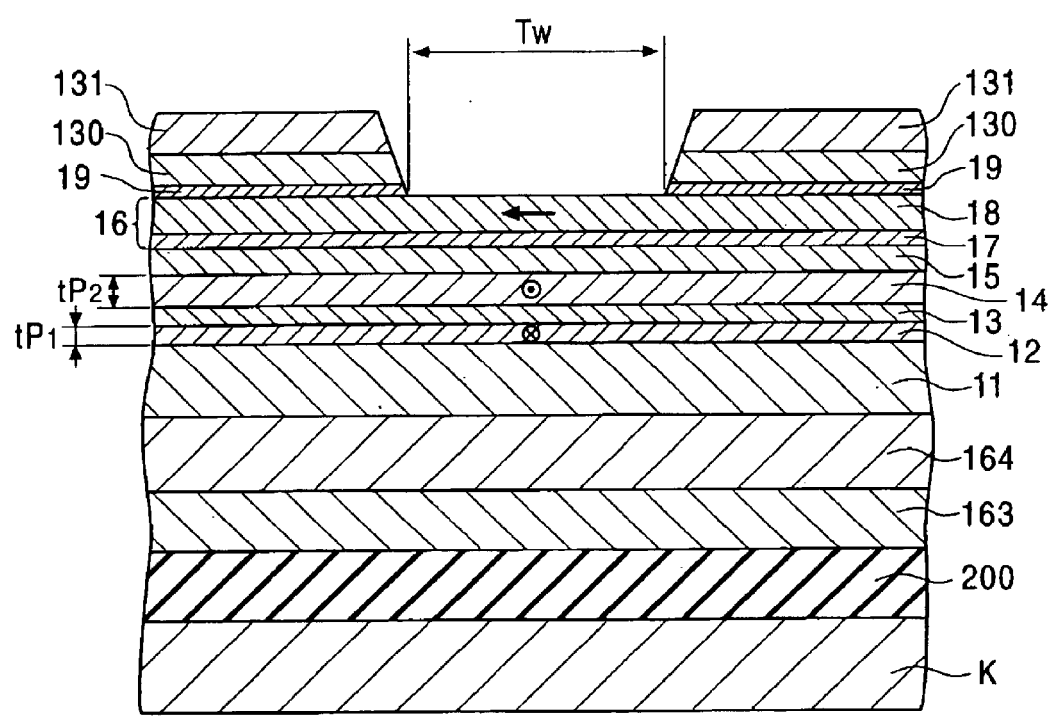
FIG. 8 is a sectional view showing the structure of the spin-valve type magnetoresistive sensor shown in FIG. 7, as viewed from the side facing a recording medium.

FIG. 7 is a cross-sectional view schematically showing a spin-valve type magnetoresistive sensor according to a second embodiment of the present invention, and FIG. 8 is a sectional view showing the structure of the spin-valve type magnetoresistive sensor shown in FIG. 7, as viewed from the side facing a recording medium.

Similarly to the spin-valve type magnetoresistive sensor shown in FIG. 1, the spin-valve type magnetoresistive sensor of this embodiment is also provided, for example, on a trailing end face of a floating slider mounted in a hard disk device, and is used to detect a magnetic field recorded on a hard disk or the like.

In FIGS. 7 and 8, a Z-direction represents the moving direction of a magnetic recording medium such as a hard disk, and a Y-direction represents the direction of a leakage magnetic field from the magnetic recording medium.

The spin-valve type magnetoresistive sensor shown in FIGS. 7 and 8 is one of the so-called bottom type single-spin-valve magnetoresistive sensors wherein an antiferromagnetic layer, a pinned magnetic layer, a non-magnetic electrically conductive layer, and a free magnetic layer are formed on a substrate one by one in this order.

In the spin-valve type magnetoresistive sensor of this embodiment, as with the spin-valve type magnetoresistive sensor shown in FIG. 1, a magnetization direction of the free magnetic layer is uniformly arranged so as to cross a magnetization direction of the pinned magnetic layer based on exchange biasing by using a bias layer made of an antiferromagnetic material.

In FIGS. 7 and 8, character K denotes a substrate. On the substrate K, an insulating underlying layer 200 made of $Al_2O_3$, for example, a lower shielding layer 163, a lower gap layer 164, and an antiferromagnetic layer 11 are formed in succession. Further, a first pinned magnetic layer 12 is formed on the antiferromagnetic layer 11. Then, a non-magnetic intermediate layer 13 is formed on the first pinned magnetic layer 12, and a second pinned magnetic layer 14 is formed on the non-magnetic intermediate layer 13.

Moreover, a non-magnetic electrically conductive layer 15 is formed on the second pinned magnetic layer 14, and a free magnetic layer 16 is formed on the non-magnetic electrically conductive layer 15.

On the free magnetic layer 16, a pair of soft magnetic layers 19, 19 are formed while a spacing corresponding to a track width Tw is left between the soft magnetic layers 19, 19. A pair of bias layers 130, 130 are formed respectively on the soft magnetic layers 19, 19, and a pair of electrically conductive layers 131, 131 are formed respectively on the bias layers 130, 130.

In the spin-valve type magnetoresistive sensor of this second embodiment, as with the above spin-valve type magnetoresistive sensor of the first embodiment, the antiferromagnetic layer 11 is made of an alloy containing at least one or more elements selected from among Pt, Pd, Ir, Rh, Ru, Os, Au, Ag, Cr, Ni, Ne, Ar, Xe and Kr, as well as Mn. The antiferromagnetic layer 11 acts to magnetize the first pinned magnetic layer 12 and the second pinned magnetic layer 14 in respective certain directions when subjected to heat treatment under a magnetic field.

The first pinned magnetic layer 12 and the second pinned magnetic layer 14 are each formed of, for example, a Co film, a NiFe alloy, a CoNiFe alloy, a CoNi alloy or a CoFe alloy.

The non-magnetic intermediate layer 13 interposed between the first pinned magnetic layer 12 and the second pinned magnetic layer 14 is preferably made of one selected from among Ru, Rh, Ir, Cr, Re and Cu, or an alloy of two or more selected from among them.

Additionally, arrows depicted in the first pinned magnetic layer 12 and the second pinned magnetic layer 14, shown in FIG. 7, indicate the magnitudes and directions of respective magnetic moments. The magnitude of each magnetic moment is defined as a value resulted from multiplying a saturation magnetization (Ms) and a film thickness (t).

The first pinned magnetic layer 12 and the second pinned magnetic layer 14 shown in FIGS. 7 and 8 are formed of the same material such that a film thickness $tP_2$ of the second pinned magnetic layer 14 is greater than a film thickness $tP_1$ of the first pinned magnetic layer 12. Therefore, the second pinned magnetic layer 14 has a greater magnetic moment than the first pinned magnetic layer 12.

Thus, it is desired that the first pinned magnetic layer 12 and the second pinned magnetic layer 14 have different magnetic moments from each other. To this end, the film thickness $tP_1$ of the first pinned magnetic layer 12 may be selected to be greater than the film thickness $tP_1$ of the second pinned magnetic layer 14.

As shown in FIGS. 7 and 8, the first pinned magnetic layer 12 is magnetized in the Y-direction, i.e., the direction away from the magnetic recording medium (direction of height). The second pinned magnetic layer 14 opposing to the first pinned magnetic layer 12 with the non-magnetic intermediate layer 13 interposed therebetween is magnetized in the antiparallel state (ferrimagnetic state) relative to the magnetization direction of the first pinned magnetic layer 12.

The first pinned magnetic layer 12 is formed in contact with the antiferromagnetic layer 11. When subjected to annealing (heat treatment) under a magnetic field, an exchange-coupled magnetic field (exchange anisotropic magnetic field) is generated at the interface between the first pinned magnetic layer 12 and the antiferromagnetic layer 11 to make the magnetization of the first pinned magnetic layer 12 stationary in the Y-direction, for example, as shown in FIGS. 7 and 8. Upon the magnetization of the first pinned magnetic layer 12 being made stationary in the Y-direction, the magnetization of the second pinned magnetic layer 14 opposing to the first pinned magnetic layer 12 with the non-magnetic intermediate layer 13 interposed therebetween is made stationary in the antiparallel state (ferrimagnetic state) relative to the magnetization of the first pinned magnetic layer 12.

In the spin-valve type magnetoresistive sensor having the above-described structure, the magnetization of the first pinned magnetic layer 12 and the magnetization of the second pinned magnetic layer 14 can be held in the antiparallel state with higher stability under a greater exchange-coupled magnetic field. By employing, as the antiferromagnetic layer 11 of the spin-valve type magnetoresistive sensor of this embodiment, the above-described alloy which has a higher blocking temperature and generates a greater exchange-coupled magnetic field (exchange anisotropic magnetic field) at the interface between the first pinned magnetic layer 12 and the antiferromagnetic layer 11, the magnetized states of the first pinned magnetic layer 12 and the second pinned magnetic layer 14 can be held stable from the thermal point of view as well.

In the spin-valve type magnetoresistive sensor of this embodiment, as described above, by selecting a film thickness ratio of the first pinned magnetic layer 12 to the second pinned magnetic layer 14 so as to fall in a proper range, the exchange-coupled magnetic field (Hex) can be increased, and the magnetization of the first pinned magnetic layer 12 and the magnetization of the second pinned magnetic layer 14 can be held in the antiparallel state (ferrimagnetic state) that is stable from the thermal point of view as well. Further, a good value of ΔMR (resistance change rate) can be obtained.

As shown in FIGS. 7 and 8, the non-magnetic electrically conductive layer 15 made of Cu, for example, is formed on the second pinned magnetic layer 14, and the free magnetic layer 16 is formed on the non-magnetic electrically conductive layer 15.

The free magnetic layer 16 is formed of two layers as shown in FIGS. 7 and 8. One layer denoted by 17 and formed on the side in contact with the non-magnetic electrically conductive layer 15 is formed of a Co film. The other layer 18 is formed of, for example, a NiFe alloy, a CoFe alloy or a CoNiFe alloy.

The reason of forming the layer 17 of a Co film on the side in contact with the non-magnetic electrically conductive layer 15 is that the presence of such a film serves to prevent metal elements, etc. from diffusing at the interface between the free magnetic layer 16 and the non-magnetic electrically conductive layer 15 made of Cu, and to increase the value of ΔMR (resistance change rate).

The soft magnetic layers 19, 19 are preferably formed of a NiFe alloy or the like.

The bias layers 130, 130 are made of, similarly to the antiferromagnetic layer 11, an alloy containing at least one or more elements selected from among Pt, Pd, Ir, Rh, Ru, Os, Au, Ag, Cr, Ni, Ne, Ar, Xe and Kr, as well as Mn.

The free magnetic layer 16 is magnetized in the X1-direction shown in FIGS. 7 and 8 under the effect of a bias magnetic field produced by the bias layer 130.

Further, the electrically conductive layers 131, 131 are preferably made of, for example, Au, W, Cr or Ta.

In the spin-valve type magnetoresistive sensor shown in FIGS. 7 and 8, a sensing electric current is applied from the electrically conductive layers 131, 131 to the free magnetic layer 16, the non-magnetic electrically conductive layer 15 and the second pinned magnetic layer 14. When a leakage magnetic field is applied from the magnetic recording medium in the Y-direction shown in FIGS. 7 and 8, the magnetization direction of the free magnetic layer 16 is varied from the X1-direction toward the Y-direction, whereupon spin-dependent scattering of conduction electrons are caused at the interface between the non-magnetic electrically conductive layer 15 and the free magnetic layer 16 and the interface between the non-magnetic electrically conductive layer 15 and the second pinned magnetic layer 14. As a result, electrical resistance is changed and the leakage magnetic field from the magnetic recording medium can be detected as a change in electrical resistance.

In fact, the sensing electric current also flows to the interface between the first pinned magnetic layer 12 and the non-magnetic intermediate layer 13, etc. The first pinned magnetic layer 12 does not directly contribute to the value of ΔMR, and serves as kind of an auxiliary layer for making the magnetization of the second pinned magnetic layer 14, which contributes to the value of ΔMR, stationary in a proper direction.

Accordingly, the sensing electric current flowing to the first pinned magnetic layer 12 and the non-magnetic intermediate layer 13 produces a shunt loss (electric current loss). However, an amount of the shunt loss is so very small that the second embodiment can provide ΔMR substantially at the same level as conventional.

The spin-valve type magnetoresistive sensor of this second embodiment can be manufactured basically in the same manner as the spin-valve type magnetoresistive sensor shown in FIG. 1.

More specifically, according to the method of manufacturing the spin-valve type magnetoresistive sensor of this second embodiment, the antiferromagnetic layer 11, the first pinned magnetic layer 12, the non-magnetic intermediate layer 13, the second pinned magnetic layer 14, the non-magnetic electrically conductive layer 15 and the free magnetic layer 16 are successively formed on the substrate K one above another, thereby forming a first laminate. Then, the first laminate is subjected to heat treatment at a first heat treatment temperature while applying a first magnetic field in a direction perpendicular to the direction of the track width Tw. An exchange anisotropic magnetic field is thereby generated in the antiferromagnetic layer 11 to make the magnetization direction of the first pinned magnetic layer 12 stationary.

Next, with a method of using a lift-off resist, the soft magnetic layers 19, 19 are formed on the first laminate while a spacing corresponding to the track width Tw is left between the soft magnetic layers 19, 19. Subsequently, the bias layers 130, 130 are formed respectively on the soft magnetic layers 19, 19, and the electrically conductive layers 131, 131 are formed respectively on the bias layers 130, 130. A second laminate having the same configuration as the spin-valve type magnetoresistive sensor shown in FIGS. 7 and 8 is thereby obtained.

The second laminate thus obtained is subjected to heat treatment at a second heat treatment temperature in the direction of the track width Tw while applying a second magnetic field smaller than the exchange anisotropic magnetic field of the antiferromagnetic layer 11, whereby a bias magnetic field is applied to the free magnetic layer 16 in a direction crossing the magnetization directions of the first pinned magnetic layer 12 and the second pinned magnetic layer 14. As a result, the spin-valve type magnetoresistive sensor shown in FIGS. 7 and 8 is obtained.

In the spin-valve type magnetoresistive sensor thus constructed, the antiferromagnetic layer 11 and the bias layer 130 are each likewise made of an alloy containing at least one or more elements selected from among Pt, Pd, Rh, Ru, Ir, Os, Au, Ag, Cr, Ni, Ne, Ar, Xe and Kr, as well as Mn. Therefore, the exchange anisotropic magnetic field has a good temperature characteristic, and the spin-valve type magnetoresistive sensor has superior heat resistance.

Also, the spin-valve type magnetoresistive sensor has good durability even when it is provided in a device such as a magnetoresistive head where the inside temperature reaches a high level, and exhibits a less variation in the exchange anisotropic magnetic field (exchange-coupled magnetic field) with a temperature change.

Further, by forming the antiferromagnetic layer 11 of the above-mentioned alloy, the blocking temperature can be raised and a greater exchange anisotropic magnetic field can be generated in the antiferromagnetic layer 11. As a result, the magnetization directions of the first pinned magnetic layer 12 and the second pinned magnetic layer 14 can be firmly held stationary.

With the method of manufacturing the spin-valve type magnetoresistive sensor of this embodiment, an alloy containing at least one or more elements selected from among Pt, Pd, Rh, Ru, Ir, Os, Au, Ag, Cr, Ni, Ne, Ar, Xe and Kr, as well as Mn is used for the antiferromagnetic layer 11 and the bias layer 130. By utilizing properties of such an alloy, the magnetization direction of the first pinned magnetic layer 12 is made stationary by the first heat treatment, and the magnetization direction of the free magnetic layer 16 is uniformly arranged in a direction crossing the magnetization directions of the first pinned magnetic layer 12 and the second pinned magnetic layer 14 by the second heat treatment. It is therefore possible to uniformly arrange the magnetization direction of the free magnetic layer 16 in a direction crossing the magnetization directions of the first pinned magnetic layer 12 and the second pinned magnetic layer 14 without adversely affecting the magnetization direction of the first pinned magnetic layer 12, and to provide a spin-valve type magnetoresistive sensor having superior heat resistance.

Also, with the method of manufacturing the spin-valve type magnetoresistive sensor, the soft magnetic layers 19, 19 are formed on the first laminate, and the bias layers 130, 130 are formed respectively on the soft magnetic layers 19, 19. After forming the soft magnetic layers 19, 19, therefore, the bias layers 130, 130 can be formed without breaking a vacuum. This means no necessity of cleaning a surface, on which the bias layers 130, 130 are to be formed, by ion milling or reverse sputtering. As a result, the manufacturing method is superior in being free from a drawback attributable to the cleaning, such as an adverse effect upon generation of the exchange anisotropic magnetic field caused by contamination with foreign matters deposited again on the surface or disorder of the crystal state at the surface.

Moreover, the manufacturing process is facilitated because of no necessity of cleaning the surface, on which the bias layers 130, 130 are to be formed, before forming the bias layers 130, 130.

Third Embodiment

Figure 9:
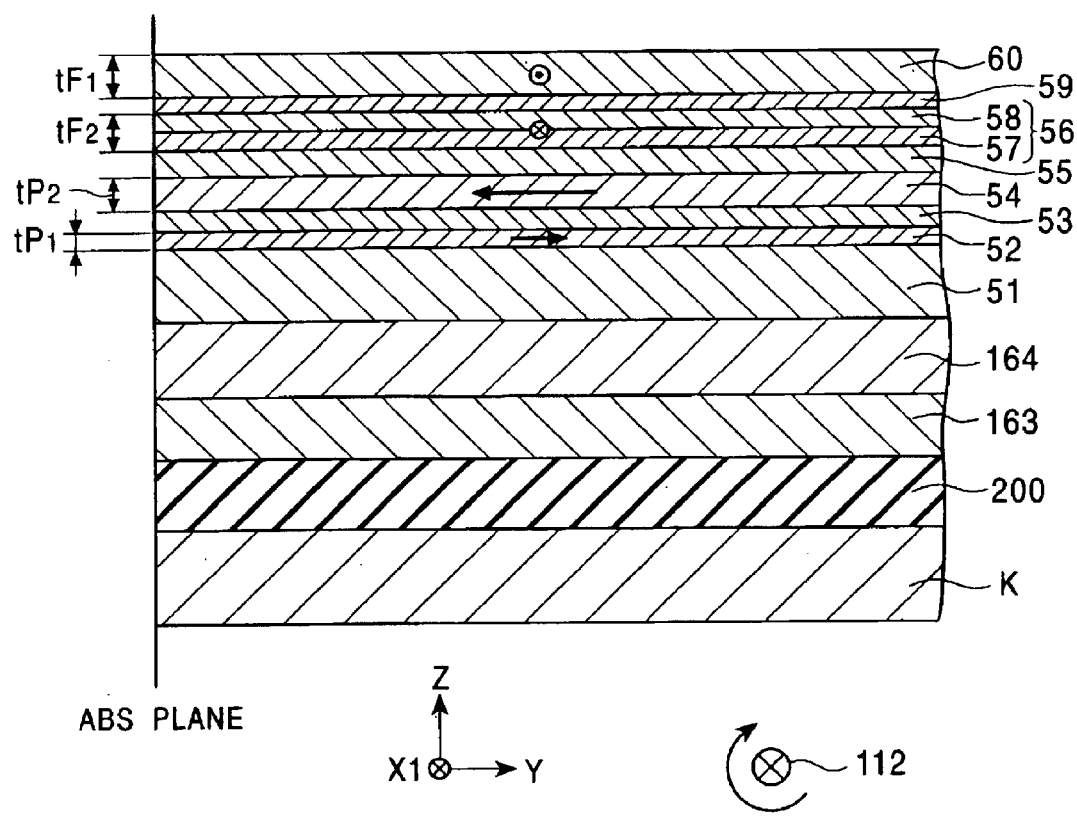
FIG. 9 is a sectional view showing a spin-valve type magnetoresistive sensor according to a third embodiment of the present invention.
Figure 10:
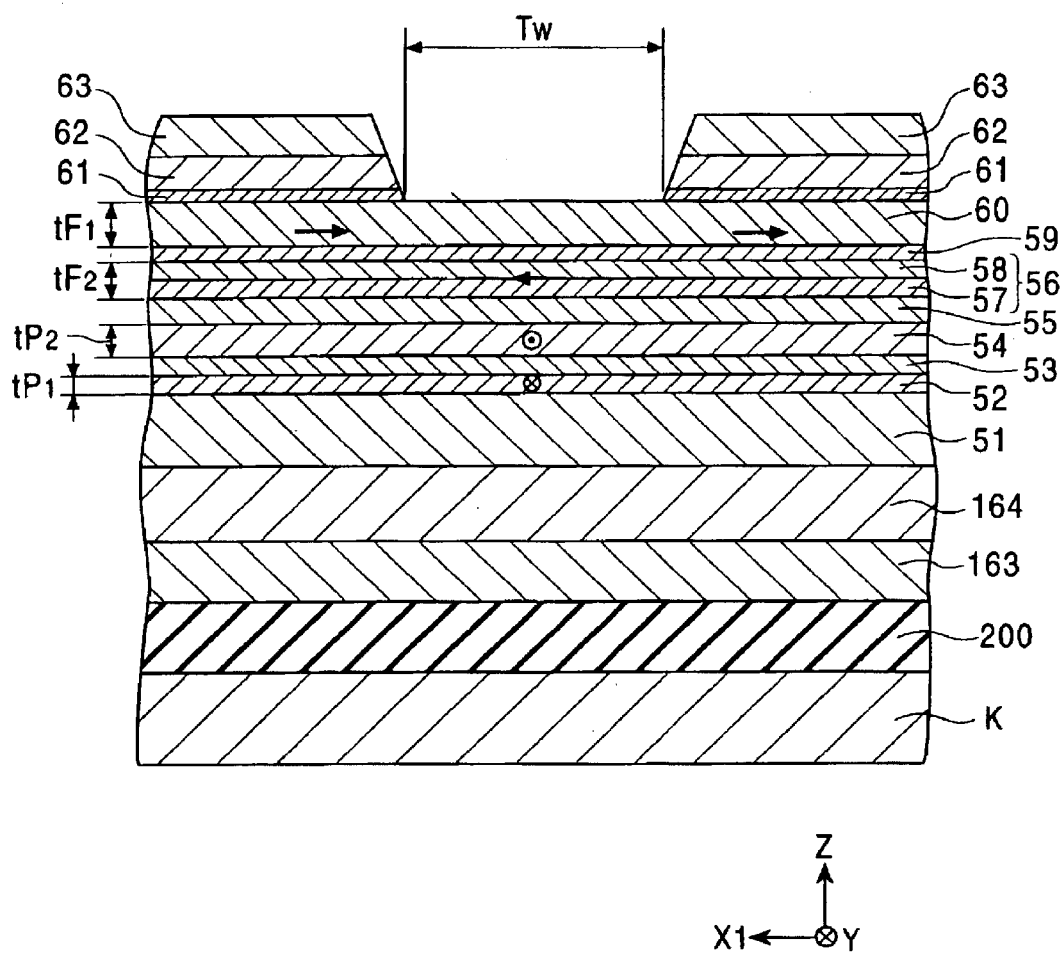
FIG. 10 is a sectional view showing the structure of the spin-valve type magnetoresistive sensor shown in FIG. 9, as viewed from the side facing a recording medium.

FIG. 9 is a cross-sectional view schematically showing a spin-valve type magnetoresistive sensor according to a third embodiment of the present invention, and FIG. 10 is a sectional view showing the structure of the spin-valve type magnetoresistive sensor shown in FIG. 9, as viewed from the side facing a recording medium.

Similarly to the spin-valve type magnetoresistive sensors described above, the spin-valve type magnetoresistive sensor of this embodiment is also provided, for example, on a trailing end face of a floating slider mounted in a hard disk device, and is used to detect a magnetic field recorded on a hard disk or the like.

In FIGS. 9 and 10, a Z-direction represents the moving direction of a magnetic recording medium such as a hard disk, and a Y-direction represents the direction of a leakage magnetic field from the magnetic recording medium.

Also in the spin-valve type magnetoresistive sensor of this embodiment, a magnetization direction of a free magnetic layer is uniformly arranged so as to cross a magnetization direction of a pinned magnetic layer based on exchange biasing by using a bias layer made of an antiferromagnetic material.

The spin-valve type magnetoresistive sensor of this embodiment is featured in that, in addition to the pinned magnetic layer, the free magnetic layer is also divided into two layers, i.e., a first free magnetic layer and a second free magnetic layer, with a non-magnetic intermediate layer interposed between the two layers.

In FIGS. 9 and 10, character K denotes a substrate. On the substrate K, an insulating underlying layer 200 made of $Al_2O_3$, for example, a lower shielding layer 163, a lower gap layer 164, and an antiferromagnetic layer 51 are formed in succession. Further, on the antiferromagnetic layer 51, a first pinned magnetic layer 52, a non-magnetic intermediate layer 53, a second pinned magnetic layer 54, a non-magnetic electrically conductive layer 55, a second free magnetic layer 56, a non-magnetic intermediate layer 59 and a first free magnetic layer 60 are successively formed in this order one above another.

On the first free magnetic layer 60, as shown in FIG. 10, a pair of soft magnetic layers 61, 61 are formed while a spacing corresponding to a track width Tw is left between the soft magnetic layers 61, 61. A pair of bias layers 62, 62 are formed respectively on the soft magnetic layers 61, 61, and a pair of electrically conductive layers 63, 63 are formed respectively on the bias layers 62, 62.

In the spin-valve type magnetoresistive sensor according to the third embodiment of the present invention, as with the spin-valve type magnetoresistive sensors described above, the antiferromagnetic layer 51 is made of an alloy containing at least one or more elements selected from among Pt, Pd, Rh, Ru, Ir, Os, Au, Ag, Cr, Ni, Ne, Ar, Xe and Kr, as well as Mn. The antiferromagnetic layer 51 acts to magnetize the first pinned magnetic layer 52 and the second pinned magnetic layer 54 in respective certain directions when subjected to heat treatment under a magnetic field.

The first pinned magnetic layer 52 and the second pinned magnetic layer 54 are each formed of, for example, a Co film, a NiFe alloy, a CoFe alloy, a CoNiFe alloy, or a CoNi alloy.

The non-magnetic intermediate layer 53 is preferably made of one selected from among Ru, Rh, Ir, Cr, Re and Cu, or an alloy of two or more selected from among them.

The first pinned magnetic layer 52 is formed in contact with the antiferromagnetic layer 51. When subjected to annealing (heat treatment) under a magnetic field, an exchange-coupled magnetic field (exchange anisotropic magnetic field) is generated at the interface between the first pinned magnetic layer 52 and the antiferromagnetic layer 51 to make the magnetization of the first pinned magnetic layer 52 stationary in the Y-direction, for example, as shown in FIGS. 9 and 10. Upon the magnetization of the first pinned magnetic layer 52 being made stationary in the Y-direction, the magnetization of the second pinned magnetic layer 54 opposing to the first pinned magnetic layer 52 with the non-magnetic intermediate layer 53 interposed therebetween is made stationary in the antiparallel state (ferrimagnetic state) relative to the magnetization of the first pinned magnetic layer 52.

To hold stability of the ferrimagnetic state, a greater exchange anisotropic magnetic field is required. In the spin-valve type magnetoresistive sensor of this embodiment, by employing, as the antiferromagnetic layer 51, the above-described alloy which has a higher blocking temperature and generates a greater exchange-coupled magnetic field (exchange anisotropic magnetic field) at the interface between the first pinned magnetic layer 52 and the antiferromagnetic layer 51, the magnetized states of the first pinned magnetic layer 52 and the second pinned magnetic layer 54 can be held stable from the thermal point of view as well.

The non-magnetic electrically conductive layer 55 is preferably made of Cu, for example.

The second free magnetic layer 56 is formed of two layers as shown in FIGS. 9 and 10. A Co film 57 is formed on the side in contact with the non-magnetic electrically conductive layer 55. The reason of forming the Co film 57 on the side in contact with the non-magnetic electrically conductive layer 55 is that the presence of the Co film serves first to increase the value of AMR and secondly to prevent metal elements, etc. from diffusing at the interface between the second free magnetic layer 56 and the non-magnetic electrically conductive layer 55.

A NiFe alloy film 58 is formed on the Co film 57, and a non-magnetic intermediate layer 59 is formed on the NiFe alloy film 58. Then, the first free magnetic layer 60 is formed on the non-magnetic intermediate layer 59.

The first free magnetic layer 60 is formed of, for example, a Co film, a NiFe alloy, a CoFe alloy, a CoNiFe alloy, or a CoNi alloy.

The non-magnetic intermediate layer 59 interposed between the second free magnetic layer 56 and the first free magnetic layer 60 is preferably made of one selected from among Ru, Rh, Ir, Cr, Re and Cu, or an alloy of two or more selected from among them.

The magnetization of the second free magnetic layer 56 and the magnetization of the first free magnetic layer 60 are produced in the antiparallel state (ferrimagnetic state) to each other, as shown in FIGS. 9 and 10, due to an exchange-coupled magnetic field (RKKY interaction) generated between the second free magnetic layer 56 and the first free magnetic layer 60.

In the spin-valve type magnetoresistive sensor shown in FIGS. 9 and 10, the first free magnetic layer 56 and the second free magnetic layer 60 are formed, by way of example, such that a film thickness $tF_2$ of the second free magnetic layer 56 is greater than a film thickness $tF_1$ of the first free magnetic layer 60.

Then, $Ms \cdot tF_2$ of the second free magnetic layer 56 is set to be smaller than $Ms \cdot tF_1$ of the first free magnetic layer 60. When a bias magnetic field is applied from the bias layer 62 in a direction opposing to the X1-direction shown in FIGS. 9 and 10, the magnetization of the first free magnetic layer 60 having a greater value of $Ms \cdot tF_1$ is uniformly arranged in the direction opposing to the X1-direction under the effect of the bias magnetic field. Also, the magnetization of the second free magnetic layer 56 having a smaller value of $Ms \cdot tF_2$ is uniformly arranged in the X1-direction due to the exchange-coupled magnetic field (RKKY interaction) generated between the second free magnetic layer 56 and the first free magnetic layer 60.

Upon an external magnetic field being applied in the Y-direction shown in FIGS. 9 and 10, the magnetization of the second free magnetic layer 56 and the magnetization of the first free magnetic layer 60 are rotated under the effect of the external magnetic field while the ferrimagnetic state is kept. Then, electrical resistance is changed depending on the relationship between the varying magnetization of the second free magnetic layer 56 which contributes to the value of ΔMR and the stationary magnetization of the second pinned magnetic layer 54 (magnetized, for example, in a direction opposing to the Y-direction), and the external magnetic field can be detected as a change in electrical resistance.

The soft magnetic layers 61, 61 are preferably formed of, for example, a NiFe alloy.

The bias layers 62, 62 are made of, similarly to the antiferromagnetic layer 51, an alloy containing at least one or more elements selected from among Pt, Pd, Rh, Ru, Ir, Os, Au, Ag, Cr, Ni, Ne, Ar, Xe and Kr, as well as Mn.

Further, the electrically conductive layers 63, 63 are preferably made of, for example, Au, W, Cr or Ta.

The spin-valve type magnetoresistive sensor of this third embodiment can also be manufactured basically in the same manner as the spin-valve type magnetoresistive sensor shown in FIG. 1.

More specifically, according to the method of manufacturing the spin-valve type magnetoresistive sensor of this third embodiment, the antiferromagnetic layer 51, the first pinned magnetic layer 52, the non-magnetic intermediate layer 53, the second pinned magnetic layer 54, the non-magnetic electrically conductive layer 55, the second free magnetic layer 56, the non-magnetic intermediate layer 59 and the first free magnetic layer 60 are successively formed on the substrate K one above another, thereby forming a first laminate. Then, the first laminate is subjected to heat treatment at a first heat treatment temperature while applying a first magnetic field in a direction perpendicular to the direction of the track width Tw. An exchange anisotropic magnetic field is thereby generated in the antiferromagnetic layer 51 to make the magnetization direction of the first pinned magnetic layer 52 stationary.

Next, with a method of using a lift-off resist, the soft magnetic layers 61, 61 are formed on the first laminate while a spacing corresponding to the track width Tw is left between the soft magnetic layers 61, 61. Subsequently, the bias layers 62, 62 are formed respectively on the soft magnetic layers 61, 61, and the electrically conductive layers 63, 63 are formed respectively on the bias layers 62, 62. A second laminate having the same configuration as the spin-valve type magnetoresistive sensor shown in FIGS. 9 and 10 is thereby obtained.

The second laminate thus obtained is subjected to heat treatment at a second heat treatment temperature while applying a second magnetic field in the direction of the track width Tw smaller than the exchange anisotropic magnetic field of the antiferromagnetic layer 51, whereby a bias magnetic field is applied to the first free magnetic layer 60 in a direction crossing the magnetization directions of the first pinned magnetic layer 52 and the second pinned magnetic layer 54. As a result, the spin-valve type magnetoresistive sensor shown in FIGS. 9 and 10 is obtained.

In the spin-valve type magnetoresistive sensor thus constructed, the antiferromagnetic layer 51 and the bias layer 62 are each likewise made of an alloy containing at least one or more elements selected from among Pt, Pd, Rh, Ru, Ir, Os, Au, Ag, Cr, Ni, Ne, Ar, Xe and Kr, as well as Mn. Therefore, the exchange anisotropic magnetic field has a good temperature characteristic, and the spin-valve type magnetoresistive sensor has superior heat resistance.

Also, the spin-valve type magnetoresistive sensor has good durability even when it is provided in a device such as a magnetoresistive head where the sensor temperature reaches a high level due to an increased environment temperature in the hard disk device and Joule heat produced by a sensing electric current flowing in the sensor, and exhibits a less variation in the exchange anisotropic magnetic field (exchange-coupled magnetic field) with a temperature change.

Further, by forming the antiferromagnetic layer 51 of the above-mentioned alloy, the blocking temperature can be raised and a greater exchange anisotropic magnetic field can be generated in the antiferromagnetic layer 51. As a result, the magnetization directions of the first pinned magnetic layer 52 and the second pinned magnetic layer 54 can be firmly held stationary.

With the method of manufacturing the spin-valve type magnetoresistive sensor of this embodiment, an alloy containing at least one or more elements selected from among Pt, Pd, Rh, Ru, Ir, Os, Au, Ag, Cr, Ni, Ne, Ar, Xe and Kr, as well as Mn is used for the antiferromagnetic layer 51 and the bias layer 62. By utilizing properties of such an alloy, the magnetization direction of the first pinned magnetic layer 52 is made stationary by the first heat treatment, and the magnetization direction of the first free magnetic layer 60 is uniformly arranged in a direction crossing the magnetization directions of the first pinned magnetic layer 52 and the second pinned magnetic layer 54 by the second heat treatment. It is therefore possible to uniformly arrange the magnetization directions of the second free magnetic layer 56 and the first free magnetic layer 60 in directions crossing the magnetization directions of the first pinned magnetic layer 52 and the second pinned magnetic layer 54 without adversely affecting the magnetization direction of the first pinned magnetic layer 52, and to provide a spin-valve type magnetoresistive sensor having superior heat resistance.

Also, with the method of manufacturing the spin-valve type magnetoresistive sensor, the soft magnetic layers 61, 61 are formed on the first laminate, and the bias layers 62, 62 are formed respectively on the soft magnetic layers 61, 61. After forming the soft magnetic layers 61, 61, therefore, the bias layers 62, 62 can be formed without breaking a vacuum. This means no necessity of cleaning a surface, on which the bias layers 62, 62 are to be formed, by ion milling or reverse sputtering. As a result, the manufacturing method is superior in being free from a drawback attributable to the cleaning, such as an adverse effect upon generation of the exchange anisotropic magnetic field caused by contamination with foreign matters deposited again on the surface or disorder of the crystal state at the surface.

Moreover, the manufacturing process is facilitated because of no necessity of cleaning the surface, on which the bias layers 62, 62 are to be formed, before forming the bias layers 62, 62.

[Action of Sensing-Current Magnetic Field]

A description is now made of the action of a sensing-current magnetic field in the structures of the second and third embodiments shown in FIGS. 7 to 10.

In the spin-valve type magnetoresistive sensor shown in FIGS. 7 and 8, the second pinned magnetic layer 14 is formed under the non-magnetic electrically conductive layer 15. In this structure, a direction of the sensing-current magnetic field is set in coincidence with the magnetization direction of one of the first pinned magnetic layer 12 and the second pinned magnetic layer 14 which has a greater magnetic moment.

As shown in FIG. 7, the magnetic moment of the second pinned magnetic layer 14 is greater than the magnetic moment of the first pinned magnetic layer 12, and is oriented in a direction opposing to the Y-direction (to the left) in FIG. 7. Therefore, a resultant magnetic moment resulting from adding the magnetic moment of the first pinned magnetic layer 12 and the magnetic moment of the second pinned magnetic layer 14 is oriented in the direction opposing to the Y-direction (to the left) in FIG. 7.

As described above, the non-magnetic electrically conductive layer 15 is formed on the upper side of the second pinned magnetic layer 14 and the second pinned magnetic layer 12. Accordingly, it is just required to control a flowing direction of a sensing electric current 112 such that the sensing-current magnetic field formed by the sensing electric current 112 flowing mainly in the non-magnetic electrically conductive layer 15 is oriented to the left in FIG. 7 on the lower side of the non-magnetic electrically conductive layer 15. By so making control, the direction of the sensing-current magnetic field is coincident with the direction of the resultant magnetic moment of the first pinned magnetic layer 12 and the second pinned magnetic layer 14.

As shown in FIG. 7, the sensing electric current 112 is applied to flow in the X1-direction. Based on the right-handed screw rule, the sensing-current magnetic field developed with flowing of the sensing electric current 112 is formed in the right-handed (clockwise) direction relative to the drawing sheet of FIG. 7. Accordingly, the sensing-current magnetic field is applied to the layer under the non-magnetic electrically conductive layer 15 in a direction indicated by arrow (i.e., direction opposing to the Y-direction) shown in FIG. 7. With application of the sensing electric current, therefore, the sensing-current magnetic field acts in a direction to enhance the resultant magnetic moment and to amplify the exchange-coupled magnetic field (RKKY interaction) acting between the first pinned magnetic layer 12 and the second pinned magnetic layer 14. The magnetization of the first pinned magnetic layer 12 and the magnetization of the second pinned magnetic layer 14 can be thereby held in the antiparallel state with higher stability from the thermal point of view.

In particular, it is known that, when a sensing electric current of 1 mA is applied, a sensing-current magnetic field of approximately 30 (Oe) is generated and the sensor temperature is raised about 10° C. Further, the rotational speed of a recording medium is increased to a level of about 10000 rpm and, with such an increase in rotational speed, the temperature in a device is raised up to about 100° C. at maximum. Accordingly, when a sensing electric current of 1 mA, for example, is applied, the temperature of the spin-valve type magnetoresistive sensor is raised up to about 200° C. and the sensing-current magnetic field is increased up to 300 (Oe).

In such a case where the sensor is operated at a very high environment temperature and a large sensing electric current flows in the sensor, the antiparallel state of the magnetization of the first pinned magnetic layer 12 and the magnetization of the second pinned magnetic layer 14 is apt to easily break if the sensing-current magnetic field is generated in a direction opposing to the direction of the resultant magnetic moment resulting from adding the magnetic moment of the first pinned magnetic layer 12 and the magnetic moment of the second pinned magnetic layer 14.

Further, to make the sensor endurable even at a very high environment temperature, it is also required to use, as the antiferromagnetic layer 11, an antiferromagnetic material having a higher blocking temperature, in addition to proper setting of the direction of the sensing-current magnetic field. For this reason, the above-mentioned alloy having a higher blocking temperature is used in the present invention.

Alternatively, where the resultant magnetic moment formed by the magnetic moment of the first pinned magnetic layer 12 and the magnetic moment of the second pinned magnetic layer 14 shown in FIG. 7 is oriented to the right (in the Y-direction), the sensing electric current is applied to flow in a direction opposing to the X1-direction so that the sensing-current magnetic field is formed in the left-handed (counterclockwise) direction relative to the drawing sheet of FIG. 7.

FIGS. 9 and 10 show an embodiment of the spin-valve type magnetoresistive sensor in which the free magnetic layer is divided into two layers, i.e., the first free magnetic layer and the second free magnetic layer, with the non-magnetic intermediate layer interposed between the two layers. In the case where the first pinned magnetic layer 52 and the second pinned magnetic layer 54 are formed on the lower side of the non-magnetic electrically conductive layer 55 like the spin-valve type magnetoresistive sensor shown in FIG. 9, it is also just required to control the direction of the sensing electric current as with the spin-valve type magnetoresistive sensor shown in FIG. 7.

In each of the second and third embodiments, as described above, by setting the direction of the sensing-current magnetic field, which is developed with flowing of the sensing electric current, to be coincident with the direction of the resultant magnetic moment resulting from adding the magnetic moment of the first pinned magnetic layer and the magnetic moment of the second pinned magnetic layer, the exchange-coupled magnetic field (RKKY interaction) acting between the first pinned magnetic layer and the second pinned magnetic layer is amplified so that the magnetization of the first pinned magnetic layer and the magnetization of the second pinned magnetic layer can be held in the antiparallel state (ferrimagnetic state) with higher stability from the thermal point of view.

Particularly, in the second and third embodiments, an antiferromagnetic material having a higher blocking temperature is used for the antiferromagnetic layer 2 to improve thermal stability. Even with the environment temperature raised to a level much higher than in a conventional sensor, therefore, it is possible to hold the magnetization of the first pinned magnetic layer 12 and the magnetization of the second pinned magnetic layer 14 in the antiparallel state (ferrimagnetic state) with higher certainty.

Also, if an amount of the sensing electric current is increased to increase a reproduced output to be adapted for a higher recording density, the sensing-current magnetic field is increased correspondingly. In the second and third embodiments of the present invention, however, since the sensing-current magnetic field acts to amplify the exchange-coupled magnetic field developed between the first pinned magnetic layer and the second pinned magnetic layer, the magnetized states of the first pinned magnetic layer and the second pinned magnetic layer can be held with higher stability due to an increase in the sensing-current magnetic field.

Incidentally, the above-described control for the direction of the sensing electric current is applicable to any case regardless of which antiferromagnetic material is used for the antiferromagnetic layer. For example, it is not essential whether heat treatment is required to generate the exchange-coupled magnetic field (exchange anisotropic magnetic field) at the interface between the antiferromagnetic layer and the pinned magnetic layer (first pinned magnetic layer).

Furthermore, even in a single-spin-valve type magnetoresistive sensor wherein the pinned magnetic layer is formed as a single layer, like the first embodiment shown in FIG. 1, the magnetization of the pinned magnetic layer can be thermally stabilized by setting the direction of the sensing-current magnetic field, which is developed with flowing of the sensing electric current, to be coincident with the magnetization direction of the pinned magnetic layer.

Fourth Embodiment

Figure 11:
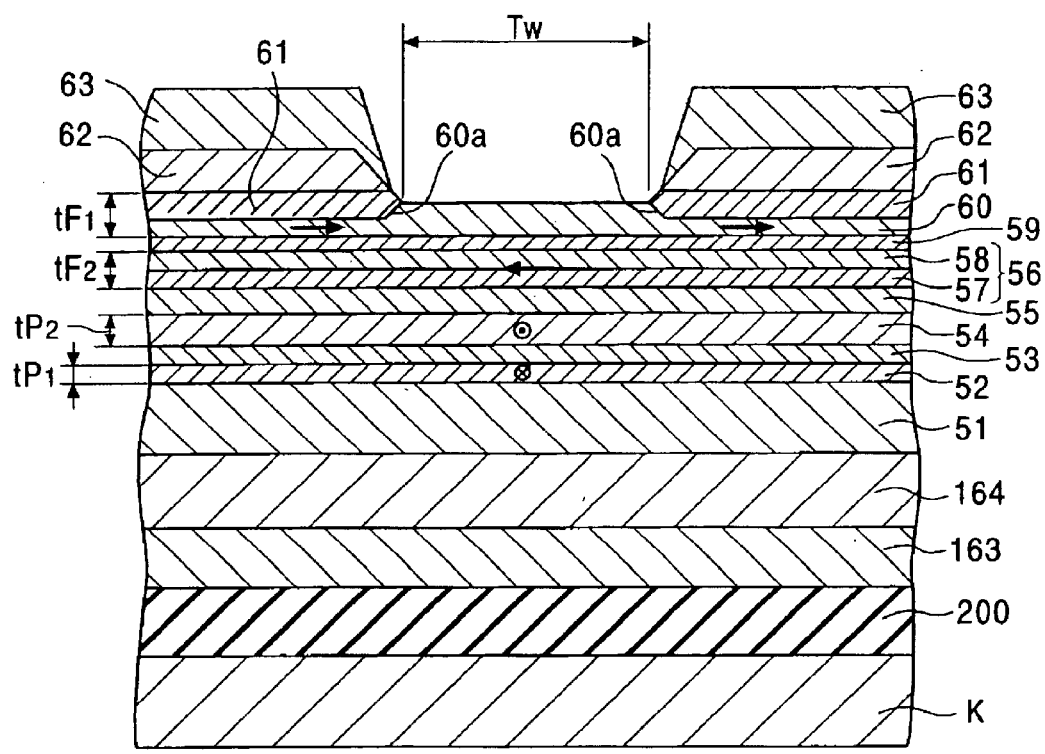
FIG. 11 is a sectional view showing the structure of a spin-valve type magnetoresistive sensor according to a fourth embodiment of the present invention, as viewed from the side facing a recording medium.

FIG. 11 is a sectional view showing the structure of a spin-valve type magnetoresistive sensor according to a fourth embodiment of the present invention, as viewed from the side facing a recording medium.

Similarly to the spin-valve type magnetoresistive sensor shown in FIG. 1, the spin-valve type magnetoresistive sensor of this embodiment is also provided, for example, on a trailing end face of a floating slider mounted in a hard disk device, and is used to detect a magnetic field recorded on a hard disk or the like.

In FIG. 11, a Z-direction represents the moving direction of a magnetic recording medium such as a hard disk, and a Y-direction represents the direction of a leakage magnetic field from the magnetic recording medium.

Also in the spin-valve type magnetoresistive sensor of this embodiment, a magnetization direction of a free magnetic layer is uniformly arranged so as to cross a magnetization direction of a pinned magnetic layer based on exchange biasing by using a bias layer made of an antiferromagnetic material.

The spin-valve type magnetoresistive sensor of this embodiment is featured in that, in addition to the pinned magnetic layer, the free magnetic layer is also divided into two layers, i.e., a first free magnetic layer and a second free magnetic layer, with a non-magnetic intermediate layer interposed between the two layers.

In FIG. 11, character K denotes a substrate. On the substrate K, as with the third embodiment shown in FIG. 10, an insulating underlying layer 200 made of $Al_2O_3$, for example, a lower shielding layer 163, a lower gap layer 164, and an antiferromagnetic layer 51 are formed in succession. Further, on the antiferromagnetic layer 51, a first pinned magnetic layer 52, a non-magnetic intermediate layer 53, a second pinned magnetic layer 54, a non-magnetic electrically conductive layer 55, a second free magnetic layer 56, a non-magnetic intermediate layer 59 and a first free magnetic layer 60 are successively formed in this order one above another.

A pair of recesses 60a, 60a are formed in the first free magnetic layer 60 on both sides of its central area corresponding to a track width Tw. A pair of soft magnetic layers 61, 61 are formed to respectively fill the recesses 60a, 60a while a spacing corresponding to the track width Tw is left between the soft magnetic layers 61, 61. A pair of bias layers 62, 62 are formed respectively on the soft magnetic layers 61, 61, and a pair of electrically conductive layers 63, 63 are formed respectively on the bias layers 62, 62.

In the spin-valve type magnetoresistive sensor according to the fourth embodiment of the present invention, as with the spin-valve type magnetoresistive sensors described above, the antiferromagnetic layer 51 is made of an alloy containing at least one or more elements selected from among Pt, Pd, Rh, Ru, Ir, Os, Au, Ag, Cr, Ni, Ne, Ar, Xe and Kr, as well as Mn. The antiferromagnetic layer 51 acts to magnetize the first pinned magnetic layer 52 and the second pinned magnetic layer 54 in respective certain directions when subjected to heat treatment under a magnetic field.

The first pinned magnetic layer 52 and the second pinned magnetic layer 54 are each formed of, for example, a Co film, a NiFe alloy, a CoFe alloy, a CoNiFe alloy, or a CoNi alloy. The non-magnetic intermediate layer 53 is preferably made of one selected from among Ru, Rh, Ir, Cr, Re and Cu, or an alloy of two or more selected from among them.

The first pinned magnetic layer 52 is formed in contact with the antiferromagnetic layer 51. When subjected to annealing (heat treatment) under a magnetic field, an exchange-coupled magnetic field (exchange anisotropic magnetic field) is generated at the interface between the first pinned magnetic layer 52 and the antiferromagnetic layer 51 to make the magnetization of the first pinned magnetic layer 52 stationary in the Y-direction, for example, as shown in FIG. 11. Upon the magnetization of the first pinned magnetic layer 52 being made stationary in the Y-direction, the magnetization of the second pinned magnetic layer 54 opposing to the first pinned magnetic layer 52 with the non-magnetic intermediate layer 53 interposed therebetween is made stationary in the antiparallel state (ferrimagnetic state) relative to the magnetization of the first pinned magnetic layer 52.

To hold stability of the ferrimagnetic state, a greater exchange anisotropic magnetic field is required. In the spin-valve type magnetoresistive sensor of this embodiment, by employing, as the antiferromagnetic layer 51, the above-described alloy which has a higher blocking temperature and generates a greater exchange-coupled magnetic field (exchange anisotropic magnetic field) at the interface between the first pinned magnetic layer 52 and the antiferromagnetic layer 51, the magnetized states of the first pinned magnetic layer 52 and the second pinned magnetic layer 54 can be held stable from the thermal point of view as well.

The non-magnetic electrically conductive layer 55 is preferably made of Cu, for example.

The second free magnetic layer 56 is formed of two layers as shown in FIG. 11. A Co film 57 is formed on the side in contact with the non-magnetic electrically conductive layer 55. The reason of forming the Co film 57 on the side in contact with the non-magnetic electrically conductive layer 55 is that the presence of the Co film serves first to increase the value of AMR and secondly to prevent metal elements, etc. from diffusing at the interface between the second free magnetic layer 56 and the non-magnetic electrically conductive layer 55.

A NiFe alloy film 58 is formed on the Co film 57, and a non-magnetic intermediate layer 59 is formed on the NiFe alloy film 58. Then, the first free magnetic layer 60 is formed on the non-magnetic intermediate layer 59.

The first free magnetic layer 60 is formed of, for example, a Co film, a NiFe alloy, a CoFe alloy, a CoNiFe alloy, or a CoNi alloy.

The non-magnetic intermediate layer 59 interposed between the second free magnetic layer 56 and the first free magnetic layer 60 is preferably made of one selected from among Ru, Rh, Ir, Cr, Re and Cu, or an alloy of two or more selected from among them.

The magnetization of the second free magnetic layer 56 and the magnetization of the first free magnetic layer 60 are produced in the antiparallel state (ferrimagnetic state) to each other, as shown in FIG. 11, due to an exchange-coupled magnetic field (RKKY interaction) generated between the second free magnetic layer 56 and the first free magnetic layer 60.

In the spin-valve type magnetoresistive sensor shown in FIG. 11, the first free magnetic layer 56 and the second free magnetic layer 60 are formed, by way of example, such that a film thickness $tF_2$ of the second free magnetic layer 56 is greater than a film thickness $tF_1$ of the first free magnetic layer 60.

Then, $Ms \cdot tF_2$ of the second free magnetic layer 56 is set to be smaller than $Ms \cdot tF_1$ of the first free magnetic layer 60. When a bias magnetic field is applied from the bias layer 62 in a direction opposing to the X1-direction shown in FIG. 11, the magnetization of the first free magnetic layer 60 having a greater value of $Ms \cdot tF_1$ is uniformly arranged in the direction opposing to the X1-direction under the effect of the bias magnetic field. Also, the magnetization of the second free magnetic layer 56 having a smaller value of $Ms \cdot tF_2$ is uniformly arranged in the X1-direction due to the exchange-coupled magnetic field (RKKY interaction) generated between the second free magnetic layer 56 and the first free magnetic layer 60.

Upon an external magnetic field being applied in the Y-direction shown in FIG. 11, the magnetization of the second free magnetic layer 56 and the magnetization of the first free magnetic layer 60 are rotated under the effect of the external magnetic field while the ferrimagnetic state is kept. Then, electrical resistance is changed depending on the relationship between the varying magnetization of the second free magnetic layer 56 which contributes to the value of AMR and the stationary magnetization of the second pinned magnetic layer 54 (magnetized, for example, in a direction opposing to the Y-direction), and the external magnetic field can be detected as a change in electrical resistance.

The soft magnetic layers 61, 61 are preferably formed of, for example, a NiFe alloy.

The bias layers 62, 62 are made of, similarly to the antiferromagnetic layer 51, an alloy containing at least one or more elements selected from among Pt, Pd, Rh, Ru, Ir, Os, Au, Ag, Cr, Ni, Ne, Ar, Xe and Kr, as well as Mn.

Further, the electrically conductive layers 63, 63 are preferably made of, for example, Au, W, Cr or Ta.

The spin-valve type magnetoresistive sensor of this fourth embodiment can also be manufactured basically in the same manner as the spin-valve type magnetoresistive sensor shown in FIG. 10.

More specifically, according to the method of manufacturing the spin-valve type magnetoresistive sensor of this fourth embodiment, the antiferromagnetic layer 51, the first pinned magnetic layer 52, the non-magnetic intermediate layer 53, the second pinned magnetic layer 54, the non-magnetic electrically conductive layer 55, the second free magnetic layer 56, the non-magnetic intermediate layer 59 and the first free magnetic layer 60 are successively formed on the substrate K one above another, thereby forming a first laminate. Then, the first laminate is subjected to heat treatment at a first heat treatment temperature while applying a first magnetic field in a direction perpendicular to the direction of the track width Tw. An exchange anisotropic magnetic field is thereby generated in the antiferromagnetic layer 51 to make the magnetization direction of the first pinned magnetic layer 52 stationary.

Figure 12:
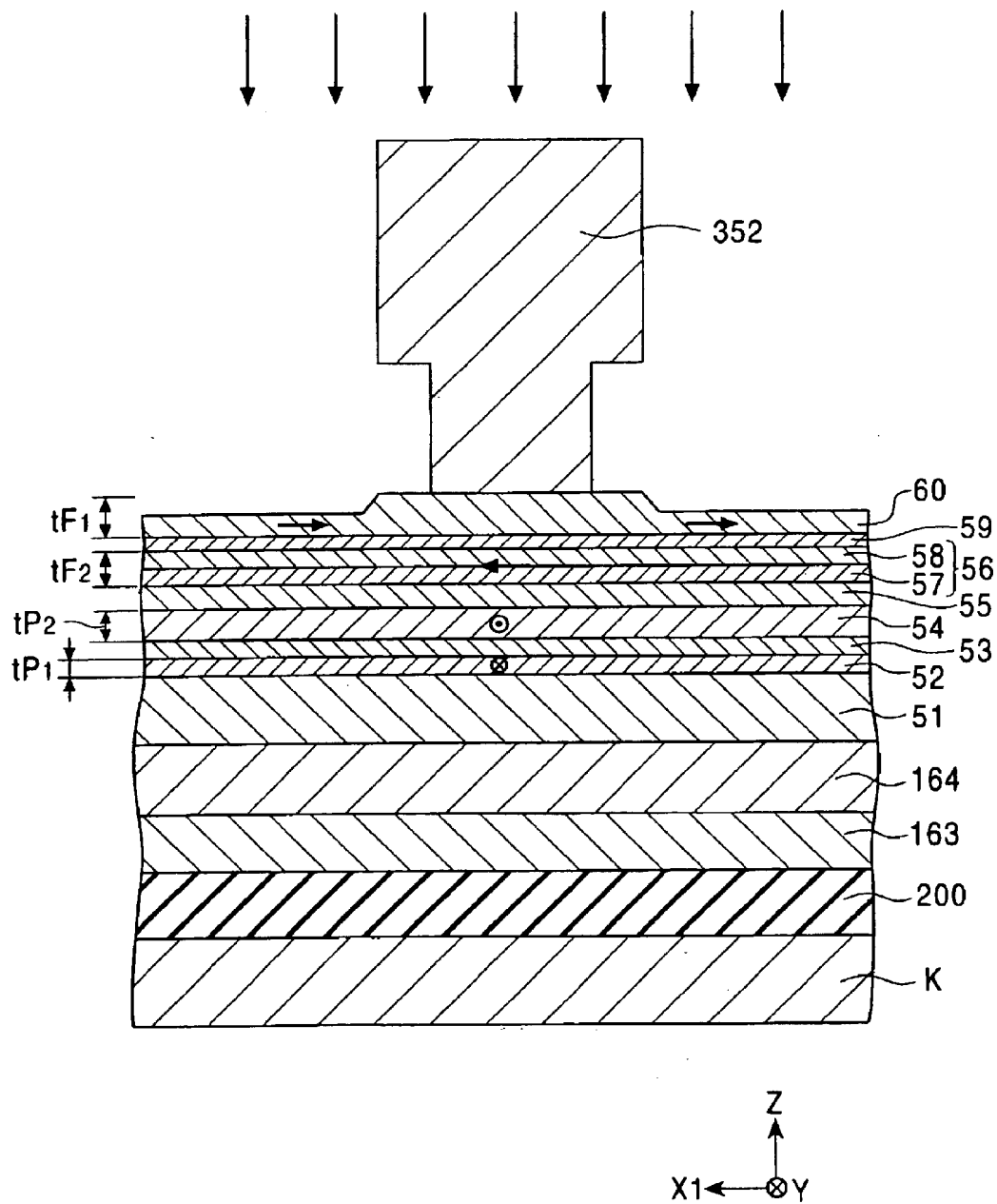
FIG. 12 is a sectional view showing a state where a lift-off resist is formed on a first free magnetic layer in a process for manufacturing the structure shown in FIG. 1.
Figure 13:
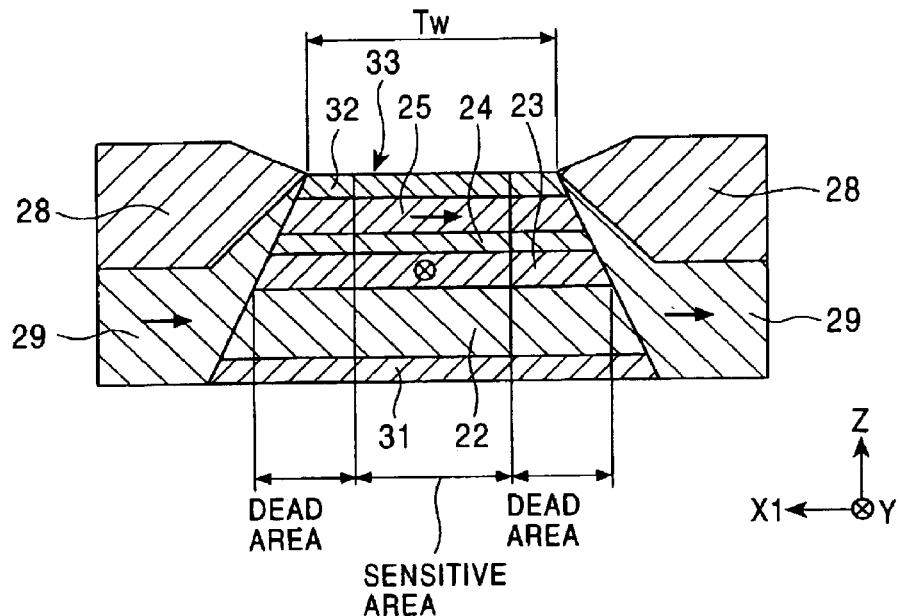
FIG. 13 is a sectional view showing the structure of one example of conventional spin-valve type magnetoresistive sensors, as viewed from the side facing recording medium.
Figure 14:
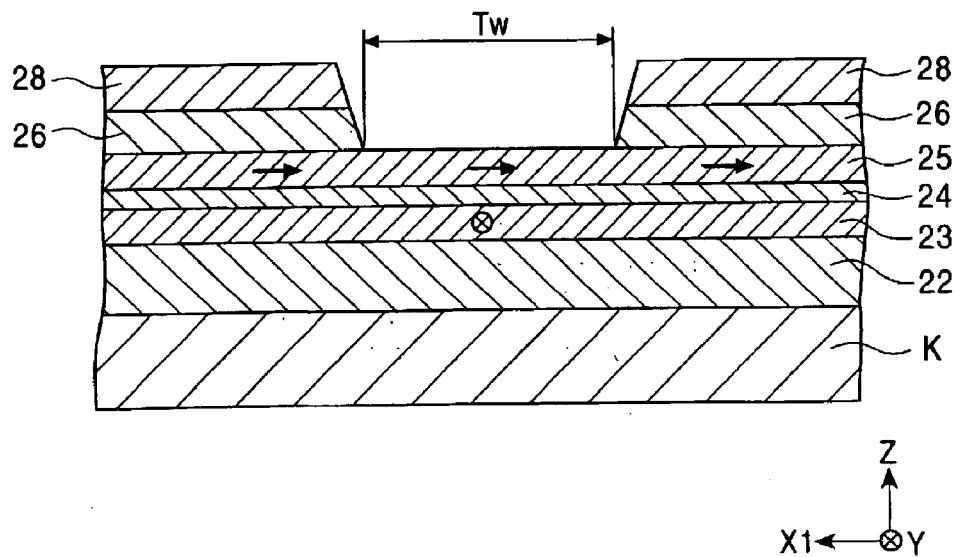
FIG. 14 is a sectional view showing the structure of another example of conventional spin-valve type magnetoresistive sensors, as viewed from the side facing a recording medium.
Figure 15:
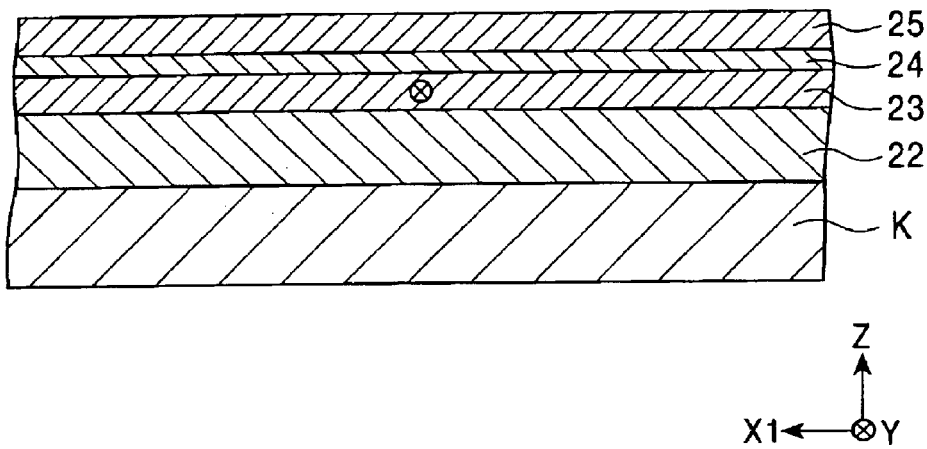
FIG. 15 is a sectional view for explaining a method of manufacturing the conventional spin-valve type magnetoresistive sensor shown in FIG. 14, showing a state where a first laminate is formed on a substrate.
Figure 16:
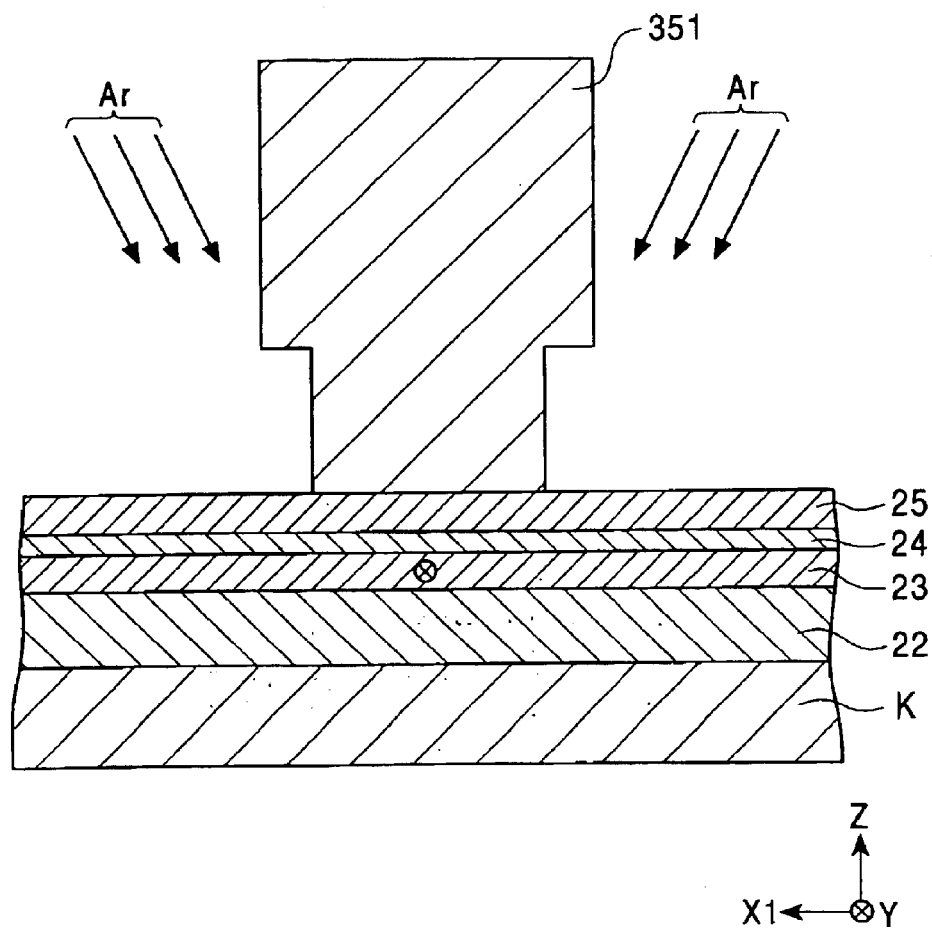
FIG. 16 is a sectional view for explaining the method of manufacturing the conventional spin-valve type magnetoresistive sensor shown in FIG. 14, showing a state where a lift-off resist is formed of the first laminate.
Figure 17:
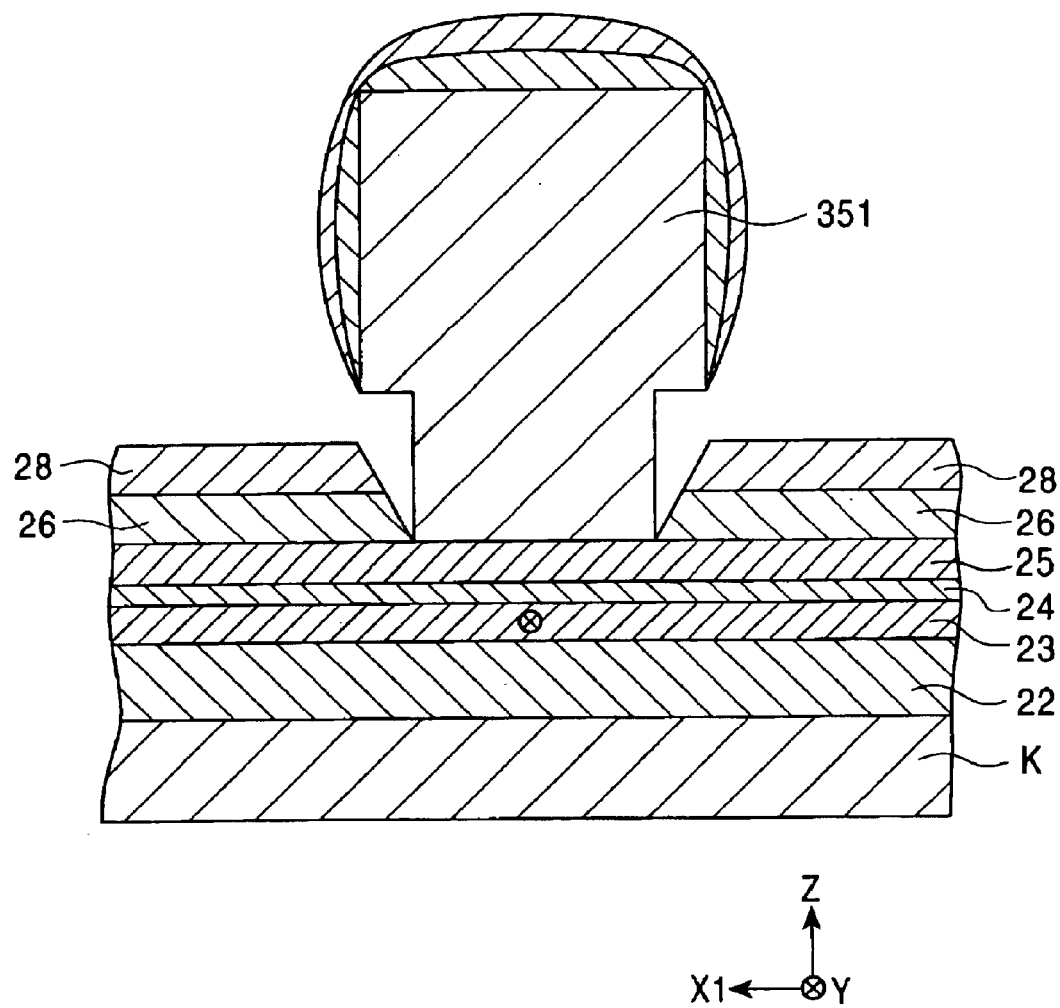
FIG. 17 is a sectional view for explaining the method of manufacturing the conventional spin-valve type magnetoresistive sensor shown in FIG. 14, showing a state where a bias layer and an electrically conductive layer are formed.
Figure 18:
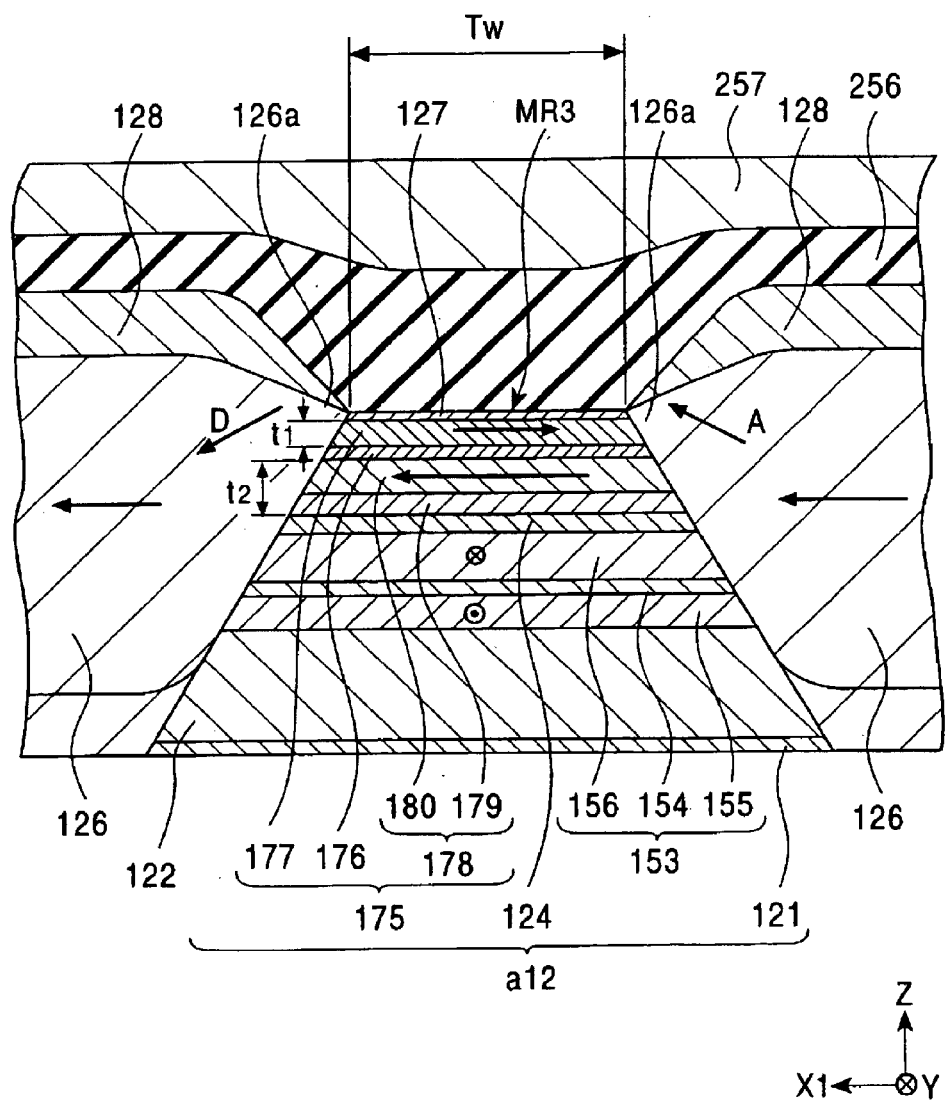
FIG. 18 is a sectional view showing the structure of still another example of conventional spin-valve type magnetoresistive sensors.
Figure 19:
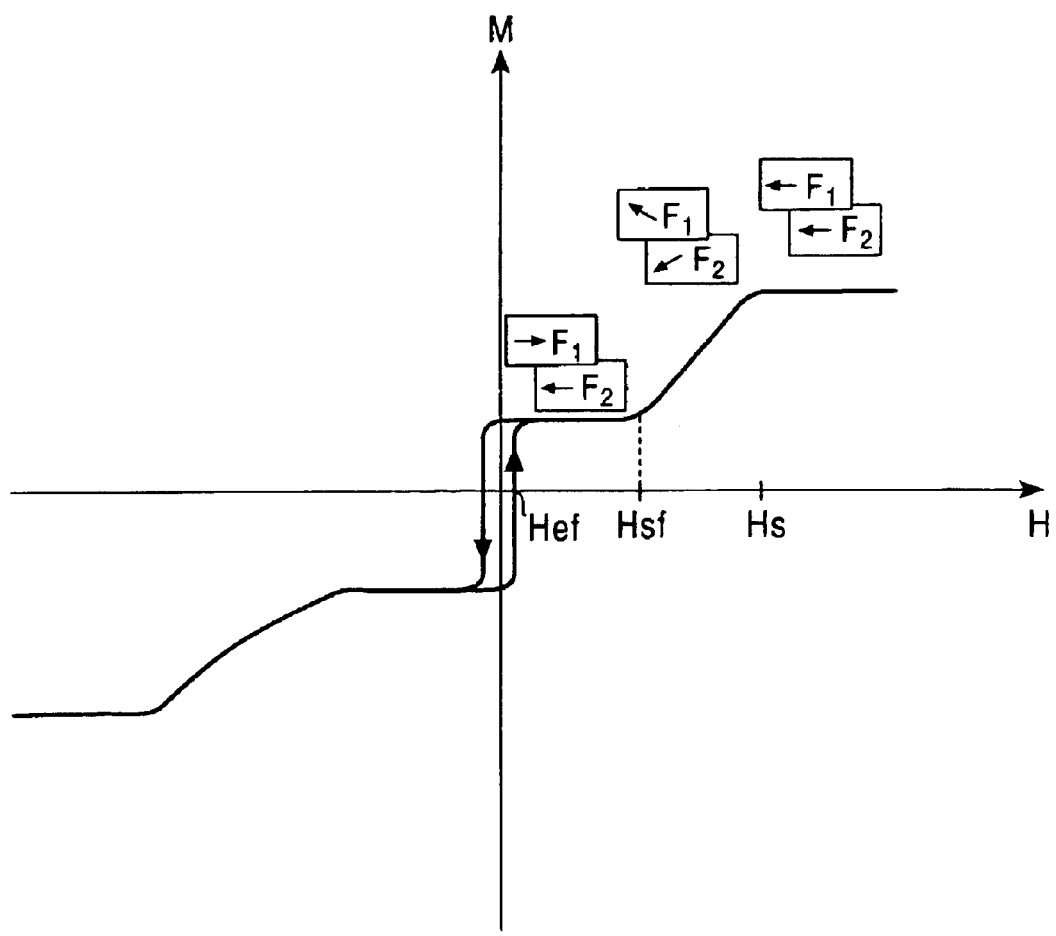
FIG. 19 is a graph showing magnetization directions of respective layers of a two-layered free magnetic layer depending on the intensity of an external magnetic field in the case where a free magnetic layer in the spin-valve type magnetoresistive sensor having the structure shown in FIG. 18 is separated into two layers.

Next, as shown in FIG. 12, the recesses 60a, 60a are formed in the uppermost layer of the first laminate by steps of forming a lift-off resist 352 which has a width corresponding to the track width, on the first laminate, and removing a part, e.g., a few tenths, of the first free magnetic layer 60 by ion milling, etc. Then, the soft magnetic layers 61, 61 are formed to respectively fill the recesses 60a, 60a while a spacing corresponding to the track width Tw is left between the soft magnetic layers 61, 61. Subsequently, the bias layers 62, 62 are formed respectively on the soft magnetic layers 61, 61, and the electrically conductive layers 63, 63 are formed respectively on the bias layers 62, 62. A second laminate having the same configuration as the spin-valve type magnetoresistive sensors of the foregoing embodiment is thereby obtained.

The second laminate thus obtained is subjected to heat treatment at a second heat treatment temperature while applying a second magnetic field in the direction of the track width Tw smaller than the exchange anisotropic magnetic field of the antiferromagnetic layer 51, whereby a bias magnetic field is applied to the first free magnetic layer 60 in a direction crossing the magnetization directions of the first pinned magnetic layer 52 and the second pinned magnetic layer 54. As a result, the spin-valve type magnetoresistive sensor shown in FIG. 11 is obtained.

In the spin-valve type magnetoresistive sensor thus constructed, the antiferromagnetic layer 51 and the bias layer 62 are each likewise made of an alloy containing at least one or more elements selected from among Pt, Pd, Rh, Ru, Ir, Os, Au, Ag, Cr, Ni, Ne, Ar, Xe and Kr, as well as Mn. Therefore, the the exchange anisotropic magnetic field has a good temperature characteristic, and the spin-valve type magnetoresistive sensor has superior heat resistance.

Also, the spin-valve type magnetoresistive sensor has good durability even when it is provided in a device such as a magnetoresistive head where the sensor temperature reaches a high level due to an increased environment temperature in the hard disk device and Joule heat produced by a sensing electric current flowing in the sensor, and exhibits a less variation in the exchange anisotropic magnetic field (exchange-coupled magnetic field) with a temperature change.

Further, by forming the antiferromagnetic layer 51 of the above-mentioned alloy, the blocking temperature can be raised and a greater exchange anisotropic magnetic field can be generated in the antiferromagnetic layer 51. As a result, the magnetization directions of the first pinned magnetic layer 52 and the second pinned magnetic layer 54 can be firmly held stationary.

With the method of manufacturing the spin-valve type magnetoresistive sensor of this embodiment, an alloy containing at least one or more elements selected from among Pt, Pd, Rh, Ru, Ir, Os, Au, Ag, Cr, Ni, Ne, Ar, Xe and Kr, as well as Mn is used for the antiferromagnetic layer 51 and the bias layer 62. By utilizing properties of such an alloy, the magnetization direction of the first pinned magnetic layer 52 is made stationary by the first heat treatment, and the magnetization direction of the first free magnetic layer 60 is uniformly arranged in a direction crossing the magnetization directions of the first pinned magnetic layer 52 and the second pinned magnetic layer 54 by the second heat treatment. It is therefore possible to uniformly arrange the magnetization directions of the second free magnetic layer 56 and the first free magnetic layer 60 in directions crossing the magnetization directions of the first pinned magnetic layer 52 and the second pinned magnetic layer 54 without adversely affecting the magnetization direction of the first pinned magnetic layer 52, and to provide a spin-valve type magnetoresistive sensor having superior heat resistance.

EXAMPLE

The spin-valve type magnetoresistive sensor having the structure shown in FIGS. 1 and 2 was formed on an AlTiC ($Al_2O_3$—TiC) substrate on which a lower shielding layer (Co—Nb—Zr based amorphous alloy) and a lower gap layer ($Al_2O_3$) were successively formed. On the substrate, an antiferromagnetic layer made of a $Pt_{50}Mn_{50}$ alloy and having a thickness of 150 Å, a first pinned magnetic layer made of Co and having a thickness of 15 Å, a non-magnetic intermediate layer made of Ru and having a thickness of 8 Å, a second pinned magnetic layer made of Co and having a thickness of 25 Å, and a non-magnetic electrically conductive layer made of Cu and having a thickness of 25 Å were formed in this order one above another. Further, a second free magnetic layer (saturation magnetization Ms×film thickness $t=7.16\times10^{-4}$ T·nm) made of a $Ni_{80}Fe_{20}$ alloy and having a thickness of 40 Å, a non-magnetic intermediate layer made of Ru and having a thickness of 8 Å, a first free magnetic layer (saturation magnetization Ms×film thickness $t=4.52\times10^{-4}$ T·nm) made of a $Ni_{80}Fe_{20}$ alloy and having a thickness of 25 Å were formed in this order one above another, thereby forming a laminate. The first and second free magnetic layers each had a width of 0.6 μm in the direction of the track width, and a size of 0.4 μm in the direction of height of the sensor perpendicular to the direction of the track width. On each of surface areas of the laminate at both sides of a central vacant space corresponding to the track width, a soft magnetic layer made of a $Ni_{80}Fe_{20}$ alloy and having a thickness of 20 Å were formed in contact with the first free magnetic layer, followed by forming an antiferromagnetic layer made of a $Pt_{54}Mn_{46}$ alloy and having a thickness of 300 Å and an electrically conductive layer made of Cr and having a thickness of 1000 Å thereon in this order.

An antiparallel-coupled magnetic field generated between the first free magnetic layer and the second free magnetic layer in the multilayer structure described above was 58.4 kA/m.

Next, as Comparative Example, a laminate made up of an antiferromagnetic layer, a first pinned magnetic layer, a non-magnetic intermediate layer, a second pinned magnetic layer, a non-magnetic electrically conductive layer, a second free magnetic layer, a non-magnetic intermediate layer and a first free magnetic layer was formed in the same structure as the laminate in the above Example. On each of both right and left sides of the laminate, a hard bias layer (saturation magnetization Ms×film thickness $t=1.88\times10^{-3}$ T·nm) made of a $Co_{85}Pt_{15}$ alloy was formed with a non-magnetic layer, made of Cr and having a thickness of 20 Å, interposed therebetween.

Figure 20:
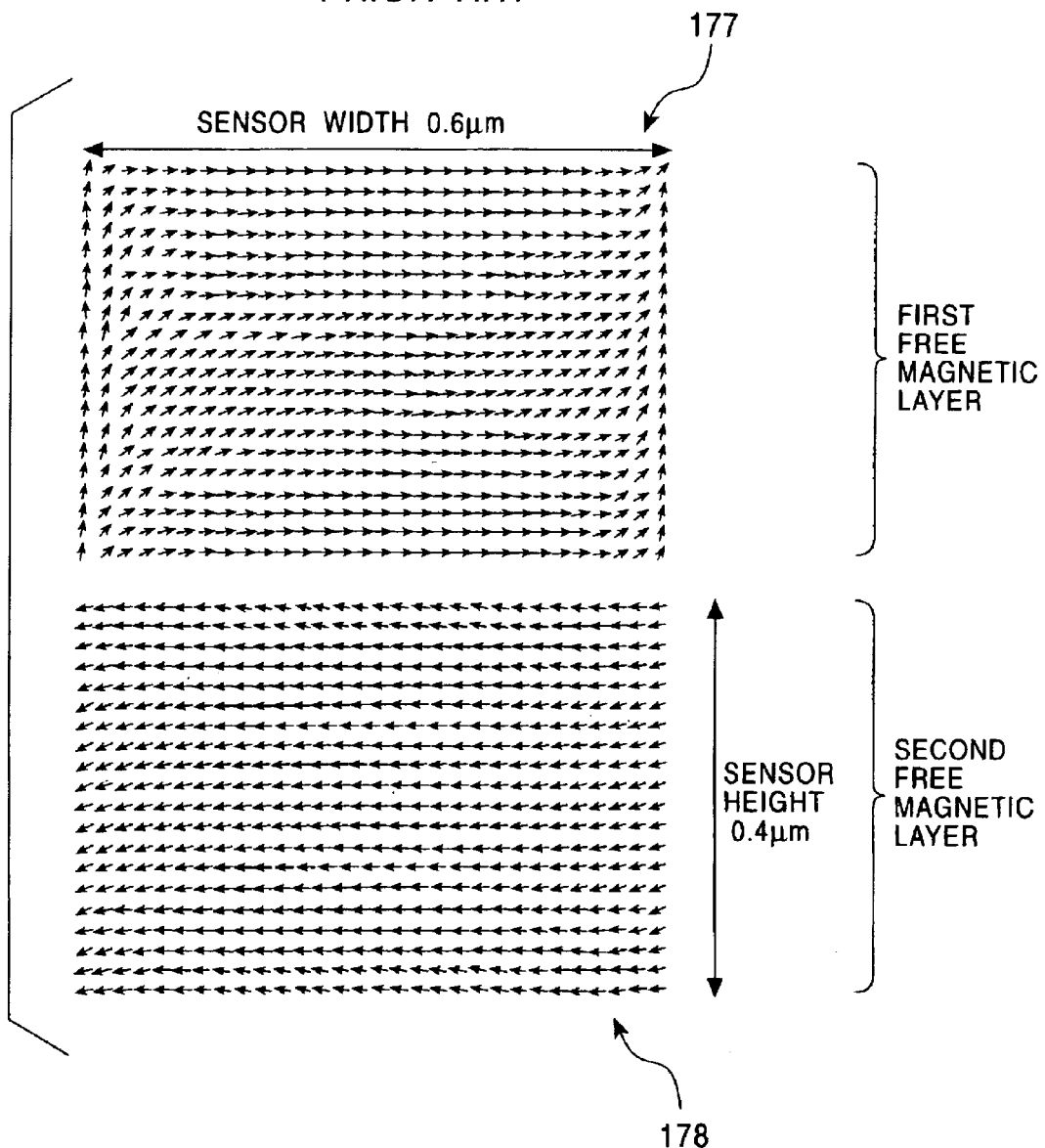
FIG. 20 is an illustration showing magnetization directions of first and second free magnetic layers in the spin-valve type magnetoresistive sensor having the structure shown in FIG. 18.
Figure 25:
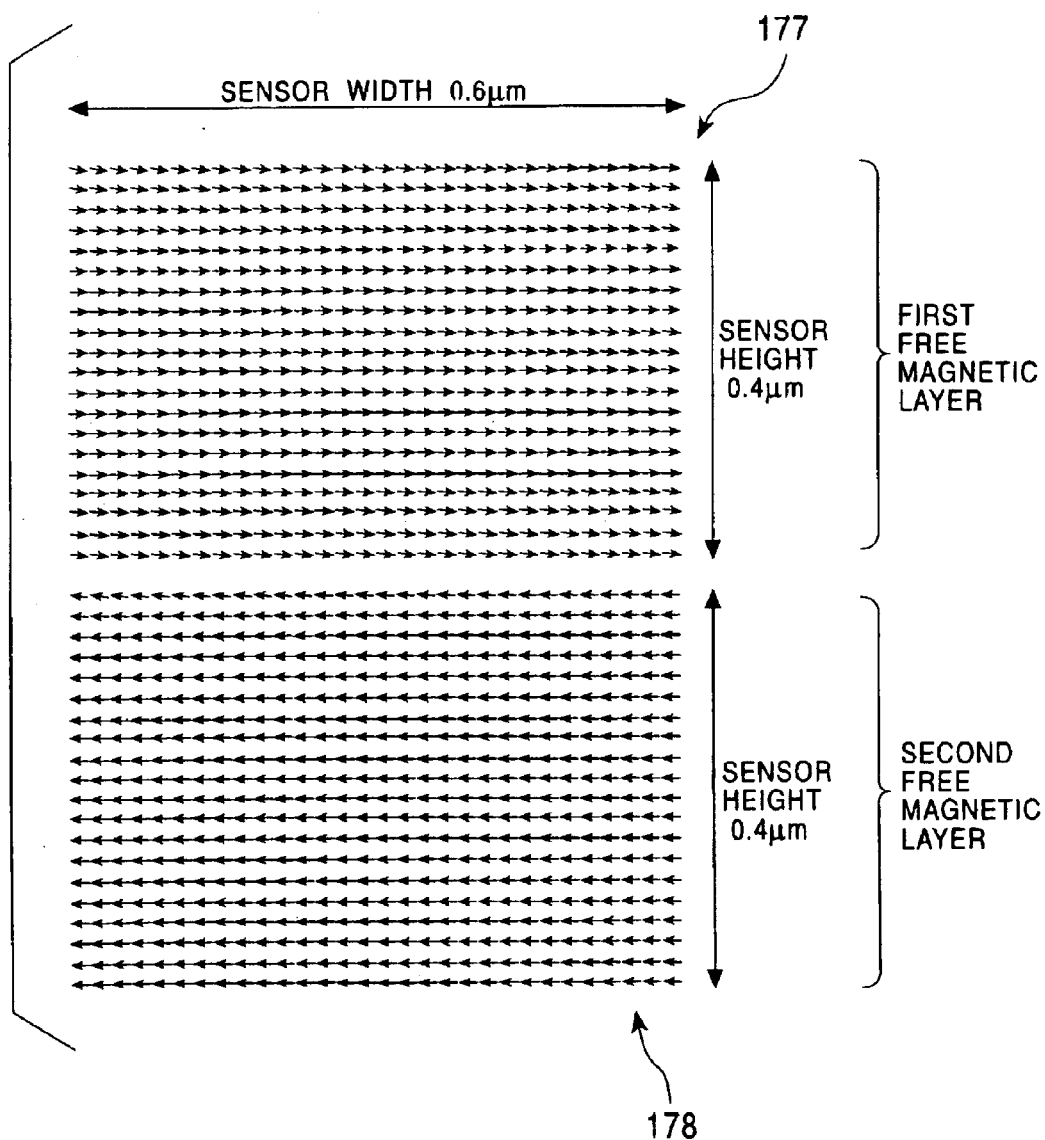
FIG. 25 is an illustration showing magnetization directions of first and second free magnetic layers in the spin-valve type magnetoresistive sensor employing the structure according to the present invention.

As a result of magnetic simulation made on both the sensors having the above-mentioned structures, FIG. 25 illustrates magnetization direction of the first free magnetic layer and magnetization direction of the second free magnetic layer, which should be oriented in a direction along the film surface, in the structure of Example, whereas FIG. 20 illustrates magnetization direction of the first free magnetic layer and magnetization direction of the second free magnetic layer, which should be oriented in a direction along the film surface, in the structure of Comparative Example.

In the multilayer structure of Example according to the present invention, as indicated by arrows in FIG. 25, a longitudinal magnetic field can be just imparted to the first free magnetic layer and there occurs no disorder of the magnetization direction in both peripheral areas of the first free magnetic layer and the second free magnetic layer. It is thus apparent that, by employing the structure of the present invention, a magnetic conflict (frustration) is eliminated unlike the conventional structure of Comparative Example (FIG. 20), and the first free magnetic layer and the second free magnetic layer are both magnetized in even distribution.

On the other hand, in the conventional structure of Comparative Example wherein the magnetization direction is indicated by arrows in FIG. 20, it is apparent that the magnetization direction is disordered at both ends of the first and second free magnetic layers because a strong reversed magnetic field is applied from the hard bias films at right and left ends of the first free magnetic layer and conflicts with the exchange anisotropic magnetic field to be developed by the second free magnetic layer. This disorders the magnetization direction of the second free magnetic layer as well and causes such a problem as Barkhausen noise, thus resulting in a risk that magnetic stability may become poor.

A profile of asymmetry (of a reproduced waveform) of a magnetic head, incorporating each of the sensors of Example and Comparative Example, in the direction of the track width was measured by scanning the magnetic head over a microtrack pattern recorded on a recording medium and having a width of $0.1 \times 10^{-6}$ m ($\mu$m). Measured results are shown in FIG. 26 (asymmetry of the magnetic head incorporating the sensor of Comparative Example) and FIG. 27 (asymmetry of the magnetic head incorporating the sensor of Example).

Figure 26:
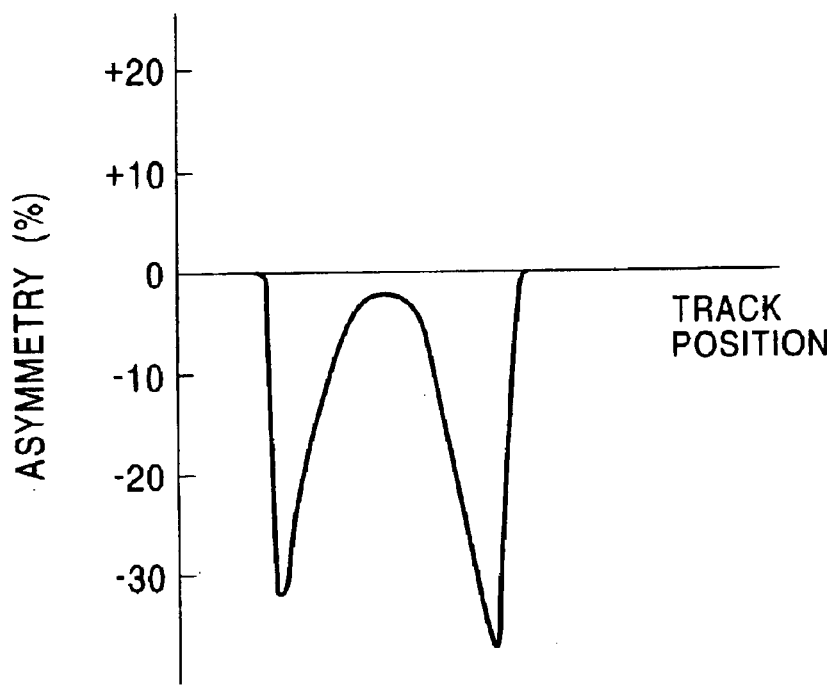
FIG. 26 is a graph showing asymmetry in a magnetoresistive head employing the conventional structure.
Figure 27:
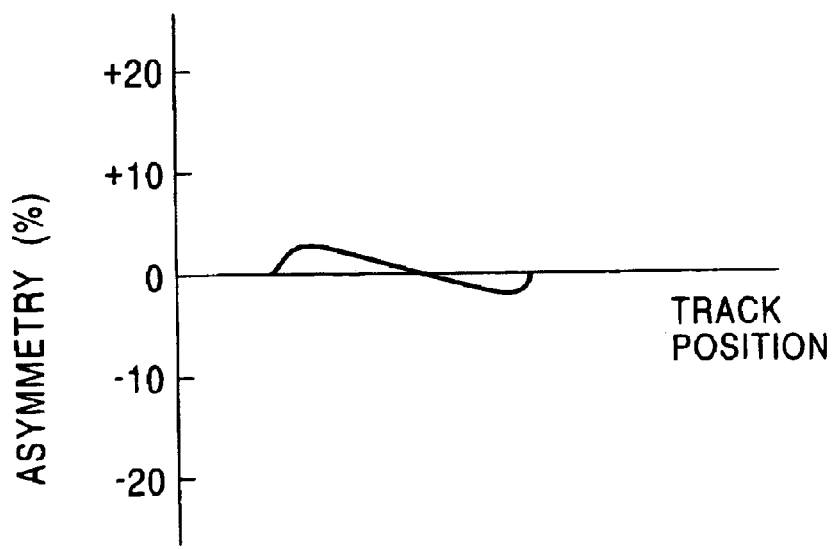
FIG. 27 is a graph showing asymmetry in the magnetoresistive head employing the structure according to the present invention.

In FIG. 26 representing the measured results of Comparative Example, abnormally large asymmetry appears in the vicinity of both track ends. This is related to the fact that the magnetization of the second free magnetic layer is disordered in the vicinity of both track ends as shown in FIG. 20, and is greatly deviated from nearly orthogonal relation to the magnetization of the second pinned magnetic layer. By contrast, in FIG. 27 representing the measured results of Example of the present invention, it is apparent that asymmetry shows no such large changes as in FIG. 20 at both the track ends, and a stable waveform is obtained.

According to the spin-valve type magnetoresistive sensor of the present invention, as fully described above, the antiferromagnetic layer and the bias layer are each made of an alloy containing at least one or more elements selected from among Pt, Pd, Rh, Ru, Ir, Os, Au, Ag, Cr, Ni, Ne, Ar, Xe and Kr, as well as Mn. Therefore, the exchange anisotropic magnetic field has a good temperature characteristic, and the spin-valve type magnetoresistive sensor has superior heat resistance.

Also, the spin-valve type magnetoresistive sensor has good durability even when it is provided in a device such as a magnetoresistive head in which the temperature reaches a high level, and exhibits a less variation in the exchange anisotropic magnetic field (exchange-coupled magnetic field) with a temperature change.

Further, by forming the antiferromagnetic layer of the above-mentioned alloy, the blocking temperature can be raised and a greater exchange anisotropic magnetic field can be generated in the antiferromagnetic layer. As a result, the magnetization direction of the pinned magnetic layer can be firmly held stationary.

In the spin-valve type magnetoresistive sensor of the present invention, at lease one of the pinned magnetic layer and the free magnetic layer may be divided into two layers with a non-magnetic intermediate layer interposed between the two layers. The divided two layers are held in the ferrimagnetic state where these layers are magnetized in directions 180° different from each other.

In the spin-valve type magnetoresistive sensor wherein at least the pinned magnetic layer is divided into two layers with a non-magnetic intermediate layer interposed between the two layers, one of the divided two pinned magnetic layers serves to make the magnetization of the other layer stationary in a proper direction, and therefore the magnetized state of the pinned magnetic layer can be held in a very stable condition.

On the other hand, in the spin-valve type magnetoresistive sensor wherein at least the free magnetic layer is divided into two layers with a non-magnetic intermediate layer interposed between the two layers, an exchange-coupled magnetic field is generated between the divided two free magnetic layers so that these layers are brought into the ferrimagnetic state and magnetization of each layer can rotate with good sensitivity in response to an external magnetic field.

Moreover, with the method of manufacturing the spin-valve type magnetoresistive sensor according to the present invention, an alloy containing at least one or more elements selected from among Pt, Pd, Rh, Ru, Ir, Os, Au, Ag, Cr, Ni, Ne, Ar, Xe and Kr, as well as Mn is used for the antiferromagnetic layer and the bias layer. By utilizing properties of such an alloy, the magnetization direction of the pinned magnetic layer is made stationary by the first heat treatment, and the magnetization direction of the free magnetic layer is uniformly arranged in a direction crossing the magnetization direction of the pinned magnetic layer by the second heat treatment. It is therefore possible to uniformly arrange the magnetization direction of the free magnetic layer in a direction crossing the magnetization direction of the pinned magnetic layer without adversely affecting the magnetization direction of the pinned magnetic layer, and to provide a spin-valve type magnetoresistive sensor having superior heat resistance.

Also, with the method of manufacturing the spin-valve type magnetoresistive sensor, the soft magnetic layers are formed on the first laminate, and the bias layers are formed on the soft magnetic layers. After forming the soft magnetic layers, therefore, the bias layers can be formed without breaking a vacuum. This means no necessity of cleaning a surface, on which the bias layers are to be formed, by ion milling or reverse sputtering. As a result, the manufacturing method is superior in being free from a drawback attributable to the cleaning, such as an adverse effect upon generation of the exchange anisotropic magnetic field caused by contamination with foreign matters deposited again on the surface or disorder of the crystal state at the surface.

Further, the manufacturing process is facilitated because of no necessity of cleaning the surface, on which the bias layers are to be formed, before forming the bias layers. Alternatively, a more stable longitudinal bias and a higher output can be obtained by cutting the surface of the free magnetic layer by ion milling, etc. to such a depth that the above-mentioned adverse effect is completely eliminated, and then forming the soft magnetic layers and the bias layers successively.

In addition, according to the magnetoresistive head of the present invention, since the spin-valve type magnetoresistive sensor described above is provided on a slider, a highly reliable magnetoresistive head can be obtained which is superior in durability and heat resistance, and which can generate an exchange aniosotropic magnetic field at a sufficient level.

What is claimed is:

1. A spin-valve magnetoresistive sensor comprising, on a substrate, an antiferromagnetic layer; a pinned magnetic layer formed in contact with said antiferromagnetic layer and having a magnetization direction made stationary under an exchange anisotropic magnetic field generated by interaction with said antiferromagnetic layer; a free magnetic layer divided into a first free magnetic layer disposed farther away from the pinned magnetic layer and a second free magnetic layer disposed closer to the pinned magnetic layer; a non-magnetic intermediate layer interposed between the first free magnetic layer and the second free magnetic layer, and the first magnetic layer having recesses formed therein, the recesses formed only in the first free magnetic layer; a non-magnetic electrically conductive layer formed between said free magnetic layer and said pinned magnetic layer; soft magnetic layers that are arranged on said first free magnetic layer having a spacing between said soft magnetic layers corresponding to a track width defined at a level at which said soft magnetic layers fill the recesses in the first free magnetic layer; bias layers formed on said soft magnetic layers to uniformly arrange a magnetization direction of said free magnetic layer in a direction crossing the magnetization direction of said pinned magnetic layer; and electrically conductive layers formed on the bias layers to apply a detection electric current to said free magnetic layer, wherein a thickness of said soft magnetic layers exceeds a depth of the recesses, and said antiferromagnetic layer and said bias layer each comprising an alloy containing Mn and at least one element selected from a group consisting of Pt, Pd, Rh, Ru, Ir, Os, Au, Ag, Cr, Ni, Ne, Ar, Xe, and Kr, and wherein said first and second free magnetic layers are held a ferrimagnetic state in which the first and second layers are magnetized in directions 180° different from each other.

2. A spin-valve magnetoresistive sensor according to claim 1, wherein said pinned magnetic layer is divided into two layers with a non-magnetic intermediate layer interposed between the two layers, and the divided two layers are held in a ferrimagnetic state in which the divided two layers are magnetized in directions 180° different from each other.

3. A spin-valve magnetoresistive sensor according to claim 1, wherein said antiferromagnetic layer comprises an alloy having the following composition formula: $X_m Mn_{100-m}$ where X is at least one element selected from a group consisting of Pt, Pd, Rh, Ru, Ir and Os, and a composition ratio m satisfies 48 atom $\% \leq m \leq 60$ atom %.

4. A spin-valve magnetoresistive sensor according to claim 1, wherein said bias layer comprises an alloy having the following composition formula: $X_m Mn_{100-m}$ where X is at least one element selected from a group consisting of Pt, Pd, Rh, Ru, Ir and Os, and a composition ratio m satisfies 48 atom $\% \leq m \leq 60$ atom %.

5. A spin-valve magnetoresistive sensor according to claim 1, wherein said antiferromagnetic layer comprises an alloy having the following composition formula: $Pt_m M_{100-m-n} D_n$ where D is at least one element selected from a group consisting of Pd, Rh, Ru, Ir and Os, and composition ratios m, n satisfy 48 atom $\% \leq m+n \leq 60$ atom % and 0.2 atom $\% \leq n \leq 40$ atom %.

6. A spin-valve magnetoresistive sensor according to claim 1, wherein said bias layer comprises an alloy having the following composition formula: $Pt_m Mn_{100-m-n} D_n$ where D is at least one element selected from a group consisting of Pd, Rh, Ru, Ir and Os, and composition ratios m, n satisfy 52 atom $\% \leq m+n \leq 60$ atom % and 0.2 atom $\% \leq n \leq 40$ atom %.

7. A spin-valve magnetoresistive sensor according to claim 1, wherein said soft magnetic layer comprises a NiFe alloy.

8. A spin-valve magnetoresistive sensor according to claim 1, wherein recesses are formed in said free magnetic layer on both sides of an area corresponding to the track width, said soft magnetic layers are formed to fill said recesses and are directly joined to said free magnetic layer through bottom surfaces of said recesses, and said bias layers and said electrically conductive layers are successively formed on said soft magnetic layers.

9. A spin-valve magnetoresistive sensor according to claim 1, wherein a magnetic film thickness of said first free magnetic layer is smaller than a magnetic film thickness of said second free magnetic layer.

10. A spin-valve magnetoresistive sensor according to claim 1, wherein a surface of the first free magnetic layer in which the recesses is contained is substantially free from contaminants.

11. A spin-valve magnetoresistive sensor according to claim 1, wherein the recesses in the first free magnetic layer are formed by removing a surface of the free magnetic layer.

* * * * *